United States Patent
Hirose et al.

(10) Patent No.: US 8,664,645 B2
(45) Date of Patent: Mar. 4, 2014

(54) ORGANIC ELECTROLUMINESCENCE ELEMENT AND DISPLAY MEDIUM

(75) Inventors: Hidekazu Hirose, Kanagawa (JP); Takeshi Agata, Kanagawa (JP); Katsuhiro Sato, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 222 days.

(21) Appl. No.: 13/222,746

(22) Filed: Aug. 31, 2011

(65) Prior Publication Data
US 2012/0187384 A1 Jul. 26, 2012

(30) Foreign Application Priority Data

Jan. 21, 2011 (JP) ................................. 2011-011330
Jan. 24, 2011 (JP) ................................. 2011-012353

(51) Int. Cl.
*H01L 29/08* (2006.01)
*H01L 51/00* (2006.01)

(52) U.S. Cl.
USPC .......... 257/40; 257/59; 257/72; 257/E51.026; 257/E31.095; 257/E51.018; 313/483; 313/498; 313/505; 428/688; 428/690; 428/917

(58) Field of Classification Search
USPC .......... 257/13, 40, 59, 72, 79, 80, 82, 86, 88, 257/103, 257, 414, 431, E51.001, E51.018, 257/E51.022, E51.026, E51.057, E51.029, 257/E51.047, E51.048, E33.001, E33.055, 257/E31.095, E31.097, E31.099, E25.019; 313/483, 498, 503, 504, 506; 428/688, 428/690, 917

See application file for complete search history.

(56) References Cited

U.S. PATENT DOCUMENTS

| 5,247,190 A | 9/1993 | Friend et al. |
|---|---|---|
| 5,399,502 A | 3/1995 | Friend et al. |
| 7,749,618 B2 * | 7/2010 | Horiba et al. ................. 428/690 |
| 7,976,959 B2 * | 7/2011 | Horiba et al. ................. 428/690 |
| 2009/0231240 A1 * | 9/2009 | Hirose et al. ................... 345/76 |

FOREIGN PATENT DOCUMENTS

| JP | A-10-092576 | 4/1998 |
|---|---|---|
| JP | A-2002-043066 | 2/2002 |
| JP | A-2005-158561 | 6/2005 |
| JP | A-2007-305974 | 11/2007 |

OTHER PUBLICATIONS

Vincett et al., "Electrical Conduction and Low Voltage Blue Electroluminescent in Vacuum-Deposited Organic Films," *Thin Solid Films*, vol. 94, pp. 171-183, 1982.

(Continued)

*Primary Examiner* — Cuong Q Nguyen
*Assistant Examiner* — Galina Yushina
(74) *Attorney, Agent, or Firm* — Oliff & Berridge, PLC

(57) ABSTRACT

An organic electroluminescence element includes: a pair of electrodes composed of a positive electrode and a negative electrode, one of which is transparent or semitransparent; and one or more organic compound layers that are sandwiched between the pair of electrodes, in which at least one layer of the organic compound layers contains one or more of charge-transporting polyesters represented by formula (I).

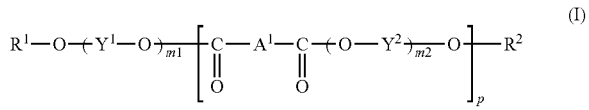

12 Claims, 2 Drawing Sheets

(56) References Cited

OTHER PUBLICATIONS

Gustafsson et al., "Flexible light-emitting diodes made from soluble conducting polymers," *Nature*, vol. 357, pp. 477-479, Jun. 11, 1992.

Sugihara et al., "Manuscript of the 42$^{nd}$ Symposium on Macromolecules 2OJ-21, Synthesis and Property of Polyphosphazene having Hole Transporting Aromatic Tertiary Amine in the side chain," *Polymer Preprints*, vol. 42, No. 7, 1993.

Mori et al., "Manuscript of the 38$^{th}$ Meeting 31p-G-12, Organic electroluminescent devices with a mixed-layer structure" *The Japan Society of Applied Physics*, p. 1086, 1991.

Mori et al., "Manuscript of the 50$^{th}$ Meeting 29p-ZP-5, Preparation of organic EL device by casting method," *The Japan Society of Applied Physics*, p. 1006, 1989.

Fujii at al., "Manuscript of the 51$^{st}$ Meeting, Organic EL Device using Cast Polymer Film as Hole Transport Layer," *The Japan Society of Applied Physics*, pp. 1041, 1990.

\* cited by examiner

ORGANIC ELECTROLUMINESCENCE ELEMENT AND DISPLAY MEDIUM

CROSS-REFERENCE TO RELATED APPLICATIONS

This application is based on and claims priority under 35 USC 119 from Japanese Patent Applications No. 2011-011330 filed Jan. 21, 2011 and No. 2011-012353 filed Jan. 24, 2011.

BACKGROUND

1. Technical Field

The present invention relates to an organic electroluminescence element and a display medium.

2. Related Art

SUMMARY

According to an aspect of the invention, there is provided an organic electroluminescence element including a pair of electrodes composed of a positive electrode and a negative electrode, one of which is transparent or semitransparent, and one or more organic compound layers that are sandwiched between the pair of electrodes, in which at least one layer of the organic compound layers contains one or more of charge-transporting polyesters represented by the following formula (I):

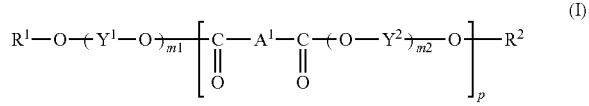

in formula (I), $A^1$ represents a group selected from a structure shown by the following formula (II), $Y^1$ and $Y^2$ each independently represents a substituted or unsubstituted divalent hydrocarbon group, m1 and m2 each independently represents an integer of 1 to 5, and p represents an integer of 5 to 5000. $R^1$ and $R^2$ each independently represents a hydrogen atom, an alkyl group, a substituted or unsubstituted aryl group, or a substituted or unsubstituted aralkyl group,

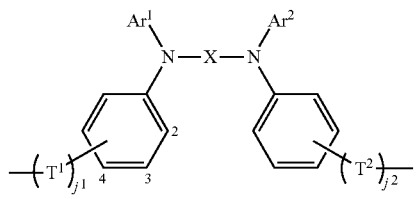

in formula (II), $Ar^1$ and $Ar^2$ each independently represents a substituted or unsubstituted phenyl group, a substituted or unsubstituted monovalent polynuclear aromatic hydrocarbon group having an aromatic ring number of 2, a substituted or unsubstituted monovalent condensed aromatic hydrocarbon group having an aromatic ring number of 2 or 3, or a substituted or unsubstituted monovalent aromatic heterocycle group, j1 and j2 each independently represents 0 or 1, $T^1$ and $T^2$ each independently represents a divalent straight-chain hydrocarbon group having a carbon number of 1 to 6 or a divalent branched-chain hydrocarbon group having a carbon number of 2 to 10, and X represents a group selected from the following formula (III-1) and the following formula (III-2),

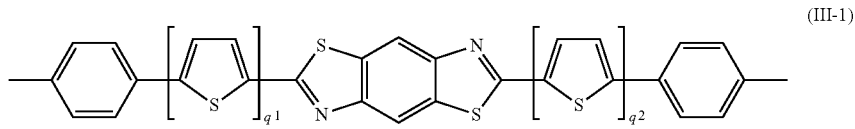

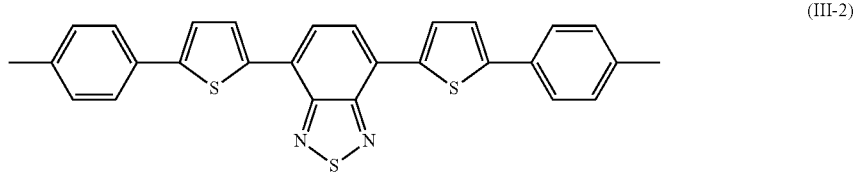

in formula (III-1), q1 and q2 each independently represents 0 or 1.

BRIEF DESCRIPTION OF THE DRAWINGS

Exemplary embodiments of the present invention will be described in detail based on the following figures, wherein.

DETAILED DESCRIPTION

Figure 1:
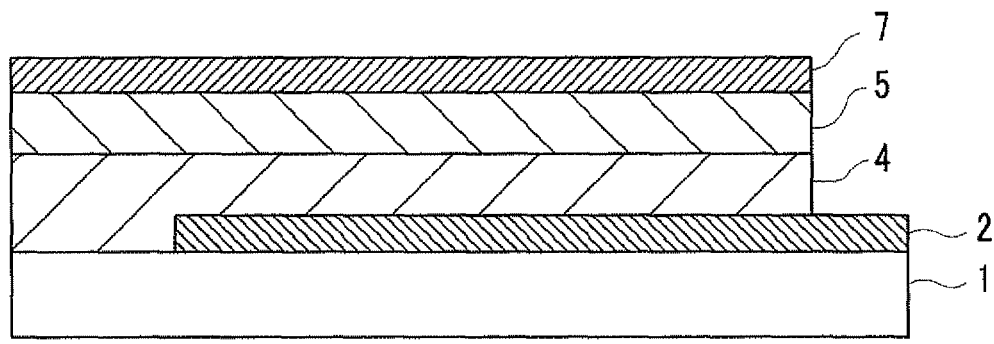
FIG. 1 is a schematic configuration diagram showing an example of the layer configuration of the organic electroluminescence element according to the exemplary embodiment.

Hereinafter, the invention will be described in more detail with reference to exemplary embodiments.

<Organic Electroluminescence Element>

The organic electroluminescence element of the present exemplary embodiment (hereinafter sometimes referred to as the "organic EL element") has a pair of electrodes composed of a positive electrode and a negative electrode, one of which is transparent or semitransparent, and one or more organic compound layers that are sandwiched between the pair of electrodes and contain one or more of charge-transporting polyesters represented by the following formula (I) in at least one layer of the organic compound layers.

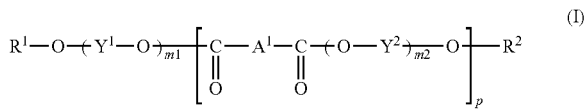
(I)

In formula (I), $A^1$ represents a group selected from a structure shown by the following formula (II), $Y^1$ and $Y^2$ each independently represents a substituted or unsubstituted divalent hydrocarbon group, m1 and m2 each independently represents an integer of 1 to 5, and p represents an integer of 5 to 5000. $R^1$ and $R^2$ each independently represents a hydrogen atom, an alkyl group, a substituted or unsubstituted aryl group, or a substituted or unsubstituted aralkyl group,

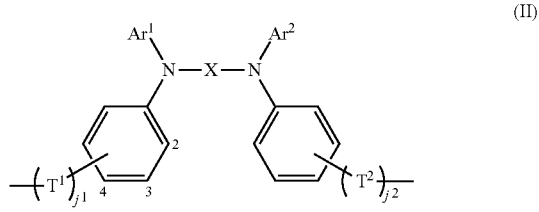
(II)

In formula (II), $Ar^1$ and $Ar^2$ each independently represents a substituted or unsubstituted phenyl group, a substituted or unsubstituted monovalent polynuclear aromatic hydrocarbon group having an aromatic ring number of 2, a substituted or unsubstituted monovalent condensed aromatic hydrocarbon group having an aromatic ring number of 2 or 3, or a substituted or unsubstituted monovalent aromatic heterocycle group, j1 and j2 each independently represents 0 or 1, $T^1$ and $T^2$ each independently represents a divalent straight-chain hydrocarbon group having a carbon number of 1 to 6 or a divalent branched-chain hydrocarbon group having a carbon number of 2 to 10, and X represents a group selected from the following formula (III-1) and the following formula (III-2).

The followings are examples of the functional group when the functional group III-2 is used.

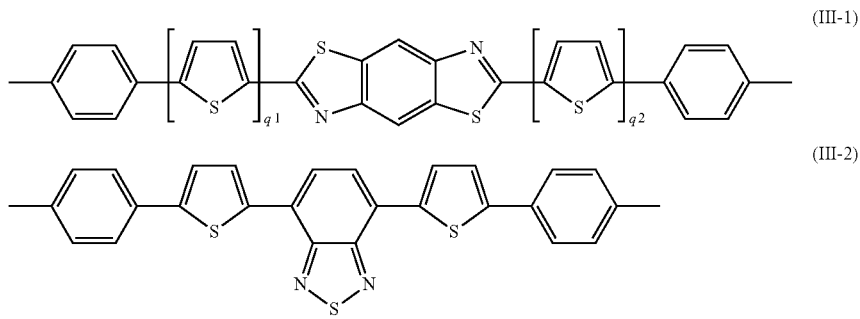

In formula (III-1), q1 and q2 each independently represents 0 or 1.

In the charge-transporting polyester in the exemplary embodiment, it is presumed that the property of injecting charges from the electrode is improved since the ionization potential is controlled to be low by inserting benzobisthiazole rings that are connected to at least one of phenylene groups and thiophen rings in the molecular structure. Furthermore, structures to which the benzobisthiazole rings are inserted are excellent in terms of solubility and compatibility with respect to a solvent or a resin. Therefore, it is presumed that use of the charge-transporting polyester increases the area, and allows the organic electroluminescence element to be manufactured easily.

In addition, since the charge-transporting polyester may impart both of a hole-transporting function and an electron-transporting function by selecting the structure as described below, the charge-transporting polyester may be used for any of the hole-transporting layer, the light-emitting layer, the electron-transporting layer, and the like according to the purpose. Furthermore, it is presumed that, since the charge-transporting polyester in the exemplary embodiment has a relatively high glass transition temperature and large charge mobility, electric currents may flow easily, and an increase in voltage is suppressed so that heat is not easily generated during light emission, whereby the stability is excellent, and the service life of the element is extended.

Meanwhile, the "charge-transporting polyester" in the exemplary embodiment refers to polyesters, which are semiconductors that transport holes or electrons as charges.

(Charge-Transporting Polyester)

Hereinafter, the charge-transporting polyester in the exemplary embodiment will be described. Firstly, the structure of $A^1$ in formula (I), which is a feature of the charge-transporting polyester, will be described.

In formula (II), $Ar^1$ and $Ar^2$ each independently represents a substituted or unsubstituted phenyl group, a substituted or unsubstituted monovalent polynuclear aromatic hydrocarbon group having an aromatic ring number of 2, a substituted or unsubstituted condensed aromatic hydrocarbon group having an aromatic ring number of 2 or 3, or a substituted or unsubstituted monovalent aromatic heterocycle group. Further, $Ar^1$ and $Ar^2$ that are present in formula (II) may be the same or different, but the same $Ar^1$ and $Ar^2$ may be manufactured easily.

Here, the polynuclear aromatic hydrocarbon group and the condensed aromatic hydrocarbon group refer specifically to groups having polycyclic aromatic rings as defined below (that is, polynuclear aromatic hydrocarbon or condensed aromatic hydrocarbon) in the exemplary embodiment.

That is, the "polynuclear aromatic hydrocarbon" represents hydrocarbon, in which 2 or more aromatic rings composed of carbon and hydrogen are present and the rings are bonded by carbon-carbon bonding. Specific examples include biphenyl and the like. In addition, the "condensed aromatic hydrocarbon" represents hydrocarbon compounds that include 2 or more aromatic rings composed of carbon and hydrogen and share a pair of carbon atoms, in which the aromatic rings are adjoined and bonded. Specific examples include naphthalene, anthracene, phenanthrene, fluorine, and the like.

Furthermore, the aromatic heterocycle group selected as the structure representing the "$Ar^1$ and $Ar^2$" in formula (II) refers to a group having an aromatic heterocycle as described below in the exemplary embodiment.

That is, the "aromatic heterocycle" represents aromatic rings that include elements other than carbon and hydrogen as well, and examples thereof include rings for which the number of atoms configuring the cyclic skeleton (Nr) is at least 5 or 6. In addition, the kind and number of the atoms other than carbon atoms that configure the cyclic skeleton (heterogeneous atoms) are not particularly limited; however, for example, sulfur atoms, nitrogen atoms, oxygen atoms, and the like may be used, and at least two or more kinds of heterogeneous atoms or two or more heterogeneous atoms may be included in the cyclic skeleton. Particularly, examples of heterocycles having a 5-membered ring structure that may be used include thiophene, pyrrol, furan, and heterocycles in which carbon having a coordination number of 3 or 4 in the compound are substituted with nitrogen, and examples of heterocycles having a 6-membered ring structure that may be used include pyridine.

Furthermore, the aromatic heterocycle group may be any aromatic heterocycle group as long as the group has the aromatic heterocycle, and also includes any of groups in which aromatic rings are substituted with the aromatic heterocycles and groups in which the aromatic heterocycles are substituted with aromatic rings in addition to the groups composed of the aromatic heterocycle. Specific examples of the aromatic rings include the aromatic rings as described above.

That is, examples of the aromatic heterocycle group may be groups having the above polycyclic aromatic rings (that is, monovalent polynuclear aromatic hydrocarbon having an aromatic ring number of 2 or monovalent condensed aromatic hydrocarbon having an aromatic ring number of 2 or 3), in which one or more of aromatic rings are substituted with aromatic heterocycles, and specific examples thereof include thiophenylphenyl groups, phenylpyridine groups, phenylpyrrol groups, and the like.

Examples of substituent groups that substitute a phenyl group, a polycyclic aromatic hydrocarbon group, a condensed polycyclic aromatic hydrocarbon group, or an aromatic heterocycle group, which are represented by $Ar^1$ and $Ar^2$ in formula (II), include a hydrogen atom, an alkyl group, an alkoxy group, an aryl group, an aralkyl group, a substituted amino group, a halogen atom, and the like.

Examples of the alkyl group include alkyl groups having a carbon number of 1 to 10, for example, a methyl group, an ethyl group, a propyl group, an isopropyl group, and the like.

Examples of the alkoxy group include alkoxy groups having a carbon number of 1 to 10, for example, a methoxy group, an ethoxy group, a propoxy group, an isopropoxy group, and the like.

Examples of the aryl group include aryl groups having a carbon number of 6 to 20, for example, a phenyl group, a toluoyl group, and the like.

Examples of the aralkyl group include aralkyl groups having a carbon number of 7 to 20, for example, a benzyl group, a phenylethyl group, and the like.

Examples of substituent groups of the substituted amino group include an alkyl group, an aryl group, an aralkyl group, and the like, and specific examples are as described above.

In formula (II), $T^1$ and $T^2$ each independently represents a divalent straight-chain hydrocarbon group having a carbon number of 1 to 6 or a divalent branched-chain hydrocarbon group having a carbon number of 2 to 10, and, among them, refers to, for example, a divalent straight-chain hydrocarbon group having a carbon number of 2 to 6 or a divalent branched-chain hydrocarbon group having a carbon number of 3 to 7. A more specific example among them is particularly a divalent hydrocarbon group as shown below.

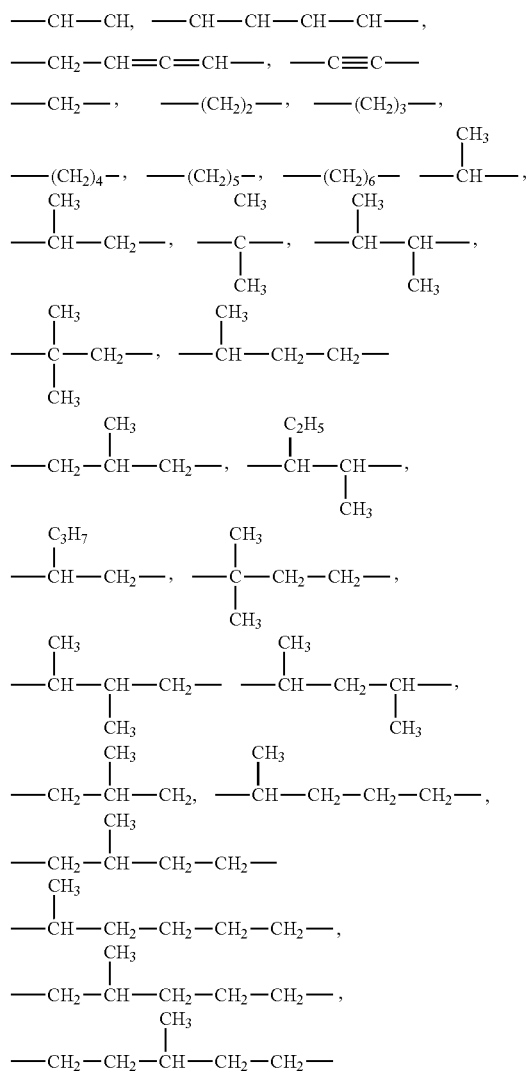

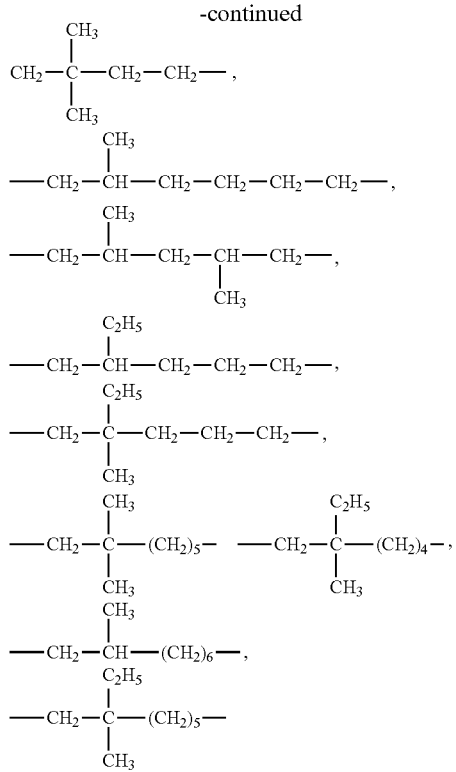

In formula (II), j1 and j2 each independently represents 0 or 1.

Meanwhile, $T^1$ and $T^2$, and j1 and j2, present in formula (II) may be the same or different respectively, but the same $T^1$ and $T^2$ and the same j1 and j2 may be manufactured easily.

In addition, in formula (III-1), q1 and q2 each independently represents 0 or 1, and q1 and q2 present in formula (III-1) may be the same or different respectively, but the same q1 and q2 may be manufactured easily.

At least one selected from the structure represented by formula (II) as described above is $A^1$ in the charge-transporting polyester represented by formula (I).

Meanwhile, the plural $A^1$'s present in the charge-transporting polyester represented by formula (I) may have the same structure or different structures.

In formula (I), $Y^1$ and $Y^2$ each independently represents a substituted or unsubstituted divalent hydrocarbon group. The divalent hydrocarbon group represented by $Y^1$ and $Y^2$ is a divalent alcohol residue, and examples thereof include an alkylene group, a (poly)ethyleneoxy group, a (poly)propyleneoxy group, an arylene group, a divalent heterocycle group, and combinations thereof. The carbon number of the divalent hydrocarbon group represented by $Y^1$ and $Y^2$ is, for example, in a range of 1 to 18, and may be in a range of 1 to 6.

That is, specific examples of the divalent hydrocarbon group represented by $Y^1$ and $Y^2$ include an alkylene group having a carbon number of 1 to 10, and an arylene group having a carbon number of 6 to 18, and may be an alkylene group having a carbon number of 1 to 5.

Specific examples of $Y^1$ and $Y^2$ include groups selected from the following formulas (IV-1) to (IV-7).

Meanwhile, $Y^1$ and $Y^2$ present in the charge-transporting polyester represented by formula (I) may be the same or different.

$$—(CH_2)_a— \quad (IV\text{-}1)$$

$$—(CH_2CH_2O)_b—(CH_2CH_2)_c— \quad (IV\text{-}2)$$

(IV-3)

(IV-4)

(IV-5)

(IV-6)

(IV-7)

In the above formulas (IV-1), (IV-2), (IV-5), and (IV-6), $R^3$ and $R^4$ each represents a hydrogen atom, a substituted or unsubstituted alky group having a carbon number of 1 to 4, a substituted or unsubstituted alkoxy group having a carbon number of 1 to 4, a substituted or unsubstituted phenyl group, a substituted or unsubstituted aralkyl group, and a halogen atom respectively, a, b, and c each independently represents an integer of 1 to 10, e represents an integer of 0 to 2, d and f each represents 0 or 1, and V represents groups represented by the following groups (V-1) to (V-12).

$$—(CH_2)_g— \quad (V\text{-}1)$$

$$—C(CH_3)_2— \quad (V\text{-}2)$$

$$—O— \quad (V\text{-}3)$$

$$—S— \quad (V\text{-}4)$$

(V-5)

(V-6)

$$—C(CF_3)_2— \quad (V\text{-}7)$$

$$—Si(CH_3)_2— \quad (V\text{-}8)$$

$$—CH{=}CH— \quad (V\text{-}9)$$

(V-10)

-continued

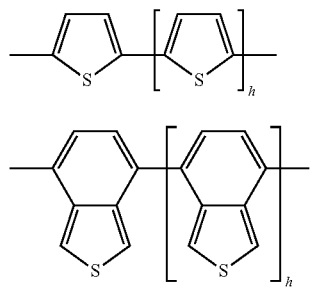

(V-11)

(V-12)

In the above formulas (V-1), (V-10), (V-11), and (V-12), g represents an integer of 1 to 20, and h represents an integer of 0 to 10.

In formula (I), m1 and m2 each independently represents an integer of 1 to 5, and m1 and m2 present in the charge-transporting polyester represented by formula (I) may be the same or different.

In formula (I), $R^1$ and $R^2$ each independently represents a hydrogen atom, an alkyl group, a substituted or unsubstituted aryl group, or a substituted or unsubstituted aralkyl group. Specific examples of the above alkyl group, aryl group, and aralkyl group, and substituent groups that substitute the above are the same as the specific examples shown as the substituent groups that substitute the above aromatic rings of Ar1.

In addition, $R^1$ and $R^2$ in formula (I) refer to a hydrogen atom and a phenyl group among the above, and refer to a hydrogen atom from the viewpoint of cost reduction and easy manufacturability. In addition, $R^1$ and $R^2$ in the formula (I) may be the same or different, but the same $R^1$ and $R^2$ may be manufactured easily.

In formula (I), p represents an integer of 5 to 5,000, and may be in a range of 10 to 1000 (or about 10 to about 1000).

More specifically, the weight-average molecular weight Mw of the charge-transporting polyester is, for example, in a range of 5,000 to 300,000, and may be in a range of 10,000 to 100,000 (or about 10,000 to about 100,000).

The weight-average molecular weight is measured by the following method. That is, a 1.0% by mass THF solution of charge-transporting polyester is prepared, a styrene polymer is used as a standard sample, and the weight-average molecular weight is measured by the gel permeation chromatography (GPC) using a differential refractive index detector (RI).

In addition, the glass transition temperature (Tg) of the charge-transporting polyester is, for example, 60° C. to 300° C. (or about 60° C. to about 300° C.), and may be 100° C. to 200° C.

Meanwhile, the glass transition temperature is measured using a differential scanning calorimeter and $\alpha$-$Al_2O_3$ as a reference by heating the sample to a state of rubber, immersing the sample in liquid nitrogen so as to cool the sample, and heating the sample again at a heating rate of 10° C./min.

The charge-transporting polyester represented by formula (I) is synthesized by polymerizing, for example, a charge-transporting monomer represented by the following structural formula (VI) by the well-known method as described in, for example, "The $4^{th}$ edition Lecture of Experimental Chemistry Vol. 28, (by The Chemical Society of Japan, published by Maruzen Publishing Co., Ltd., 1992) and the like."

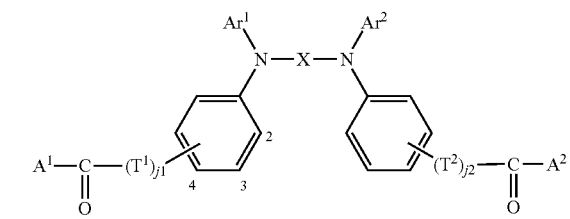

(VI)

In formula (VI), $Ar^1$, $Ar^2$, X, $T^1$, $T^2$, j1 and j2 are the same as $Ar^1$, $Ar^2$, X, $T^1$, $T^2$, j1 and j2 in formula (II), respectively. In formula (VI), $A^1$ and $A^2$ each independently represents a hydroxl group, a halogen atom, or —O—$R^5$ ($R^5$ represents a substituted or unsubstituted alkyl group, a substituted or unsubstituted aryl group, or a substituted or unsubstituted aralkyl group).

Here, specific examples of the structure represented by formula (VI) when X is the group represented by formula (III-1) will be shown in Tables 1 to 4. Hereinafter, each of the specific examples of charge-transporting monomers will be attached with a compound number (structure number) in the following table, for example, the specific example whose attached number is 'A-5' is referred to as a "monomer compound (A-5)."

Meanwhile, in each of the specific examples of the charge-transporting monomers shown in the following tables, "$Ar^1$ and $Ar^2$", "$T^1$ and $T^2$", "j1 and j2", and "$A^1$ and $A^2$" shown in formula (VI) and "q1 and q2" shown in formula (III-1) are the same, respectively.

TABLE 1

| Structure Number | $Ar^1$, $Ar^2$ | $j^1$, $j^2$ | $T^1$, $T^2$ | $q^1$, $q^2$ | $A^1$, $A^2$ |
|---|---|---|---|---|---|
| A-1 | ⏣ phenyl | 0 | $CH_2CH_2$ | 0 | $OCH_3$ |
| A-2 | 4-methylphenyl | 0 | $CH_2CH_2$ | 0 | $OCH_3$ |
| A-3 | 3-methylphenyl | 0 | $CH_2CH_2$ | 0 | $OCH_3$ |
| A-4 | phenyl | 1 | $CH_2CH_2$ | 0 | $OCH_3$ |
| A-5 | 4-methylphenyl | 1 | $CH_2CH_2$ | 0 | $OCH_3$ |
| A-6 | 3-methylphenyl | 1 | $CH_2CH_2$ | 0 | $OCH_3$ |

TABLE 1-continued

| Structure Number | Ar¹, Ar² | j¹, j² | T¹, T² | q¹, q² | A¹, A² |
|---|---|---|---|---|---|
| A-7 | 3,5-dimethylphenyl | 1 | $CH_2CH_2$ | 0 | $OCH_3$ |
| A-8 | 4-ethylphenyl | 1 | $CH_2CH_2$ | 0 | $OCH_3$ |
| A-9 | 4-propylphenyl | 1 | $CH_2CH_2$ | 0 | $OCH_3$ |
| A-10 | 4-biphenylyl | 1 | $CH_2CH_2$ | 0 | $OCH_3$ |

TABLE 2

| Structure Number | Ar¹, Ar² | j¹, j² | T¹, T² | q¹, q² | A¹, A² |
|---|---|---|---|---|---|
| A-11 | 2,2'-dimethyl-4'-methyl-biphenyl | 1 | $CH_2CH_2$ | 0 | $OCH_3$ |
| A-12 | 2'-methyl-4-methoxy-biphenyl | 1 | $CH_2CH_2$ | 0 | $OCH_3$ |
| A-13 | 4-(thiophen-2-yl)phenyl | 1 | $CH_2CH_2$ | 0 | $OCH_3$ |
| A-14 | 1-naphthyl | 1 | $CH_2CH_2$ | 0 | $OCH_3$ |
| A-15 | 9,9-dimethyl-fluoren-2-yl | 1 | $CH_2CH_2$ | 0 | $OCH_3$ |
| A-16 | 4-(3,3-diphenyl-allyl)phenyl | 1 | $CH_2CH_2$ | 0 | $OCH_3$ |
| A-17 | 3-(carbazol-9-yl)phenyl | 1 | $CH_2CH_2$ | 0 | $OCH_3$ |

TABLE 2-continued

| Structure Number | Ar¹, Ar² | j¹, j² | T¹, T² | q¹, q² | A¹, A² |
| --- | --- | --- | --- | --- | --- |
| A-18 | (4-carbazol-9-yl-phenyl) | 1 | $CH_2CH_2$ | 0 | $OCH_3$ |
| A-19 | (4'-(diphenylamino)biphenyl-4-yl) | 1 | $CH_2CH_2$ | 0 | $OCH_3$ |
| A-20 | (2-methylbenzothiophen-6-yl) | 1 | $CH_2CH_2$ | 0 | $OCH_3$ |

TABLE 3

| Structure Number | Ar¹, Ar² | j¹, j² | T¹, T² | q¹, q² | A¹, A² |
| --- | --- | --- | --- | --- | --- |
| A-21 | (dibenzothiophen-2-yl) | 1 | $CH_2CH_2$ | 0 | $OCH_3$ |
| A-22 | (4-(diphenylamino)phenyl) | 1 | $CH_2CH_2$ | 0 | $OCH_3$ |
| A-23 | (phenyl) | 1 | $CH_2CH_2$ | 1 | $OCH_3$ |
| A-24 | (4-methylphenyl) | 1 | $CH_2CH_2$ | 1 | $OCH_3$ |
| A-25 | (3-methylphenyl) | 1 | $CH_2CH_2$ | 1 | $OCH_3$ |

TABLE 3-continued

| Structure Number | Ar¹, Ar² | j¹, j² | T¹, T² | q¹, q² | A¹, A² |
| --- | --- | --- | --- | --- | --- |
| A-26 | 3,5-dimethylphenyl | 1 | CH₂CH₂ | 1 | OCH₃ |
| A-27 | 4-ethylphenyl | 1 | CH₂CH₂ | 1 | OCH₃ |
| A-28 | 4-propylphenyl | 1 | CH₂CH₂ | 1 | OCH₃ |
| A-29 | biphenyl-4-yl | 1 | CH₂CH₂ | 1 | OCH₃ |
| A-30 | 4'-methoxy-2'-methylbiphenyl-4-yl | 1 | CH₂CH₂ | 1 | OCH₃ |

TABLE 4

| Structure Number | Ar¹, Ar² | j¹, j² | T¹, T² | q¹, q² | A¹, A² |
| --- | --- | --- | --- | --- | --- |
| A-31 | 4'-methoxy-2'-methylbiphenyl-4-yl | 1 | CH₂CH₂ | 1 | OCH₃ |
| A-32 | 4-(thiophen-2-yl)phenyl | 1 | CH₂CH₂ | 1 | OCH₃ |
| A-33 | 9,9-dimethyl-9H-fluoren-2-yl | 1 | CH₂CH₂ | 1 | OCH₃ |
| A-34 | 9,9-dipropyl-9H-fluoren-2-yl | 1 | CH₂CH₂ | 1 | OCH₃ |
| A-35 | 3-(9H-carbazol-9-yl)phenyl | 1 | CH₂CH₂ | 1 | OCH₃ |

TABLE 4-continued

| Structure Number | Ar¹, Ar² | j¹, j² | T¹, T² | q¹, q² | A¹, A² |
|---|---|---|---|---|---|
| A-36 | 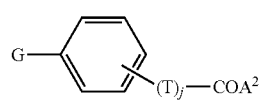 | 1 | CH₂CH₂ | 1 | OCH₃ |

Here, firstly, a method of synthesizing the charge-transporting monomer represented by formula (VI) will be described. Hereinafter, a method of synthesizing charge-transporting monomers will be exemplified, but is not limited thereto.

According to the exemplary embodiment, a triarylamine derivative represented by the following formula (XI) is obtained by, for example, carrying out a coupling reaction between a halogen compound represented by the following formula (VII) and a diarylamine compound represented by the following formula (VIII) using a copper catalyst, a coupling reaction between a diarylamine compound represented by the following formula (IX-1) and a halogen compound represented by the following formula (X-1) using a copper catalyst, or a coupling reaction between a diarylamine compound represented by the following formula (IX-2) and a halogen compound represented by the following formula (X-2) using a copper catalyst.

Next, a formylated triarylamine derivative (XII) is obtained by making triarylamine (XI) react with a formylating agent, such as N,N-dimethylformamide, N-methylformanilide, and the like, in the presence of phosphorous oxychloride. A benzobisthiazole compound (XIII) is obtained by making the formylated triarylamine derivative (XII) react with diamino benzodithiol.

 (VII)

In formula (VII), A², T, and j are the same as A², T², and j2 in formula (VI), and G represents a bromine atom or an iodine atom.

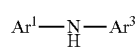 (VIII)

In formula (VIII), Ar¹ is the same as Ar¹ in the formula (II), and Ar³ represents a phenyl group or a thiophenylphenyl group.

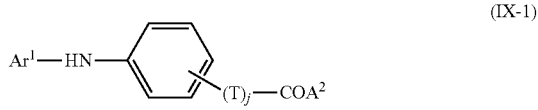 (IX-1)

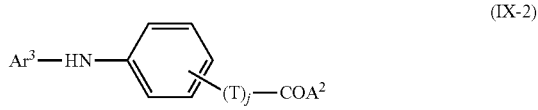 (IX-2)

In formulas (IX-1) and (IX-2), Ar¹, Ar³, T, and A² are the same as described above.

Ar³-G  (X-1)

Ar¹-G  (X-2)

In formulas (X-1) and (X-2), Ar¹, Ar³, and G are the same as described above.

 (XI)

In formula (XI), Ar¹, Ar³, T, j, and A² are the same as described above.

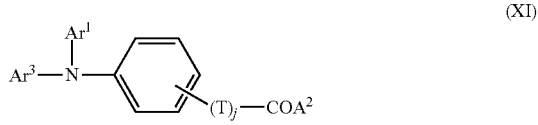 (XII)

In formula (XII), Ar¹, Ar³, T, j, and A² are the same as described above.

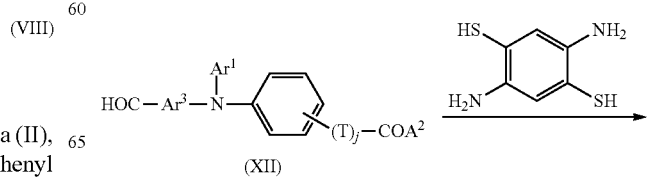

(XII)

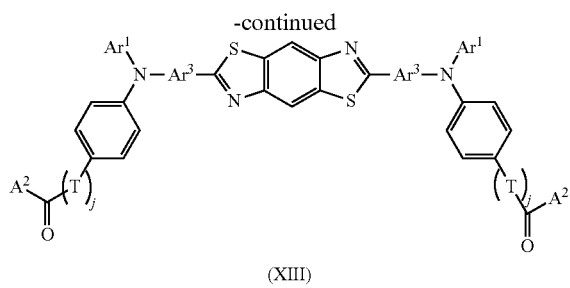

(XIII)

In formula (XIII), $Ar^1$, $Ar^3$, T, j, and $A^2$ are the same as described above.

In the coupling reaction, the halogen compound represented by formula (VII), (X-1), or (X-2) is used, for example, in a range of 0.5 equivalent amount to 1.5 equivalent amounts, and may be used in a range of 0.7 equivalent amount to 1.2 equivalent amounts with respect to one equivalent amount of the compound represented by formula (VIII), (IX-1), or (IX-2).

Examples of the copper catalyst that may be used in the coupling reaction include copper powder, copper (I) oxide, copper sulfate, and the like. The copper catalyst is used, for example, in a range of 0.001 part by mass to 3 parts by mass, and may be used in a range of 0.01 part by mass to 2 parts by mass with respect to one part by mass of the compound represented by formula (VIII), (IX-1), or (IX-2).

A base is used in the coupling reaction, and specific examples of the base that may be used include sodium hydroxide, potassium hydroxide, sodium carbonate, potassium carbonate, and the like. In addition, the base is used, for example, in a range of 0.5 equivalent amount to 3 equivalent amounts, and may be used in a range of 0.7 equivalent amount to 2 equivalent amounts with respect to one equivalent amount of the compound represented by formula (VIII), (IX-1), or (IX-2).

A solvent may be or may not be used in the reaction. When a solvent is used, examples of the solvent that may be used include water-insoluble hydrocarbon-based solvents having a high boiling point, such as n-tridecane, tetralin, p-cymene, terpinolene, and the like, halogen-based solvents having a high boiling point, such as o-dichlorobenzene, chlorobenzene, and the like, and the like. The solvent is used, for example, in a range of 0.1 part by mass to 3 parts by mass, and may be used in a range of 0.2 part by mass to 2 parts by mass with respect to one part by mass of the compound represented by formula (VIII), (IX-1), or (IX-2).

In addition, the reaction is carried out in conjunction with efficient stirring under an environment of an inert gas, such as nitrogen and argon, and, for example, in a temperature range of 100° C. to 300° C., and, furthermore, the reaction is carried out while water generated during the reaction is removed. Meanwhile, the temperature range may be 150° C. to 270° C., and 180° C. to 230° C.

After the completion of the reaction, cooling is carried out according to necessity, and then hydrolysis is carried out using a solvent, such as methanol, ethanol, n-octanol, ethylene glycol, propylene glycol, glycerin, and the like, and a base, such as sodium hydroxide, potassium hydroxide, and the like.

The amount of the solvent used in the hydrolysis is, for example, 0.5 part by mass to 10 parts by mass, and may be one part by mass to 5 parts by mass with respect to one part by mass of the compound represented by formula (VIII), (IX-1), or (IX-2). The amount of the base used in the hydrolysis is, for example, 0.2 part by mass to 5 parts by mass, and may be 0.3 part by mass to 3 parts by mass with respect to one part by mass of the compound represented by formula (VIII), (IX-1), or (IX-2).

In addition, the hydrolysis reaction is carried out in conjunction with stirring by directly adding the solvent and the base to the reaction solution under an environment of an inert gas, such as nitrogen and argon, in a temperature range of 50° C. to the boiling point of a solvent to be used after the coupling reaction is carried out.

In addition, in this case, since a carboxylate salt is generated and solidified during the coupling reaction, a solvent, for example, having a boiling point of 150° C. or higher is used to increase the reaction temperature.

After the hydrolysis reaction is finished, the triarylamine compound represented by formula (XI) is extricated by injecting the reaction product to water, and, furthermore, neutralizing the reaction product using hydrochloric acid or the like. In the post treatment of the hydrolysis reaction, for example, a water-soluble ethylene glycol, propylene glycol, glycerin, or the like is added to extricate the triarylamine compound represented by formula (XI) by injecting the reaction product to water, and, furthermore, neutralizing the reaction product using hydrochloric acid or the like.

Next, after the reaction product is washed and dissolved in the solvent according to necessity, column purification is carried out using silica gel, alumina, activated white earth, activated coal, or the like, or a treatment, in which these absorbents are added to the solution so as to absorb unnecessary portions, or the like is carried out. Furthermore, recrystallization may be carried out from the solvent, such as acetone, ethanol, ethyl acetate, or toluene, or the same recrystallization operation may be carried out after methyl ester, ethyl ester, or the like is esterified.

Next, a formylated triarylamine derivative (XII) is obtained by making the obtained triarylamine compound represented by formula (XI) react with a formylating agent, such as N,N-dimethylformamide, N-methylformanilide, and the like, in the presence of phosphorous oxychloride. In this case, the formylating agent may be excessively used so that the formylating agent also acts as a reaction solvent, but a solvent that is inert to the reaction, such as o-dichlorobenzene, benzene, methylene chloride, and the like, may be used as the solvent. Examples of the reaction temperature include a range of 0 degrees to the boiling point of a solvent to be used, and may be 27° C. to 150° C.

Next, a low-molecular compound of the benzobisthiazole represented by formula (XIII) is obtained by inducing a cyclization reaction between the formylated triarylamine derivative represented by formula (XII) and diamino benzodithiol.

In the cyclization reaction between the formylated triarylamine derivative represented by formula (XII) and diamino benzodithiol, for example, 1.5 equivalent amounts to 5 equivalent amounts of amino benzdithiol is used, and 1.7 equivalent amounts to 4 equivalent amounts of diamino benzdithiol may be used with respect to one equivalent amount of the compound represented by formula (XII).

In the cyclization reaction, the solvent is used according to necessity. Examples of the solvent include water-insoluble hydrocarbon-based solvents having a high boiling point, such as n-tridecane, tetralin, p-cymene, terpinolene, and the like, halogen-based solvents having a high boiling point, such as o-dichlorobenzene, chlorobenzene, and the like, N,N'-dimethylformamide, dimethyl sulfoxide, and the like. The solvent is used, for example, in a range of 0.1 part by mass to 3 parts by mass, and may be used in a range of 0.2 part by mass to 2 parts by mass with respect to one part by mass of the formylated triarylamine derivative represented by formula (XII).

In addition, the cyclization reaction is carried out in conjunction with efficient stirring under an environment of an inert gas, such as nitrogen and argon, and, for example, in a temperature range of 100° C. to 300° C., and, furthermore, the reaction is carried out while water generated during the reaction is removed. Meanwhile, the temperature range may be 150° C. to 270° C., and 180° C. to 250° C. After the completion of the reaction, the reaction product is dissolved in a solvent, such as toluene, isopar, n-tridecane, and the like, and unnecessary substances are removed by water washing or filtering according to necessity, furthermore, column purification is carried out using silica gel, alumina, activated white earth, activated coal, or the like, or a treatment, in which these absorbents are added to the solution so as to absorb unnecessary portions, or the like is carried out, furthermore, the reaction product is recrystallized from the solvent, such as ethanol, ethyl acetate, or toluene, and purified. However, the synthesizing method in the exemplary embodiment is not limited thereto.

Next, specific examples of the structure represented by formula (VI) when X is the group represented by formula (III-2) are shown in Tables 5 to 8. Hereinafter, each of the specific examples of charge-transporting monomers will be attached a compound number (structure number) in the following table, for example, the specific example whose attached number is 'B-5' is referred to as a "monomer compound (B-5)."

Meanwhile, in each of the specific examples of the charge-transporting monomers shown in the following tables, "$Ar^1$ and $Ar^2$", "$T^1$ and $T^2$", "j1 and j2", and "$A^1$ and $A^2$" shown in formula (VI) are the same, respectively.

TABLE 5

| Structure Number | $Ar^1, Ar^2$ | $j^1, j^2$ | $T^1, T^2$ | $A^1, A^2$ |
|---|---|---|---|---|
| B-1 | phenyl | 0 | — | $OCH_3$ |
| B-2 | 4-methylphenyl | 0 | — | $OCH_3$ |
| B-3 | 4-propylphenyl | 0 | — | $OCH_3$ |
| B-4 | 1-naphthyl | 0 | — | $OCH_3$ |
| B-5 | 9,9-dimethylfluoren-2-yl | 0 | — | $OCH_3$ |

TABLE 5-continued

| Structure Number | $Ar^1, Ar^2$ | $j^1, j^2$ | $T^1, T^2$ | $A^1, A^2$ |
|---|---|---|---|---|
| B-6 | phenyl | 1 | $CH_2$ | $OCH_3$ |
| B-7 | 3-methylphenyl | 1 | $CH_2$ | $OCH_3$ |

TABLE 6

| Structure Number | $Ar^1, Ar^2$ | $j^1, j^2$ | $T^1, T^2$ | $A^1, A^2$ |
|---|---|---|---|---|
| B-8 | 9,9-dimethylfluoren-2-yl | 1 | $CH_2$ | $OCH_3$ |
| B-9 | 4-(diphenylamino)phenyl | 1 | $CH_2$ | $OCH_3$ |
| B-10 | 2,4'-dimethylbiphenyl-4-yl | 1 | $CH_2$ | $OCH_3$ |
| B-11 | phenyl | 1 | $CH_2CH_2$ | $OCH_3$ |
| B-12 | 4-methylphenyl | 1 | $CH_2CH_2$ | $OCH_3$ |
| B-13 | 3-methylphenyl | 1 | $CH_2CH_2$ | $OCH_3$ |
| B-14 | 3,5-dimethylphenyl | 1 | $CH_2CH_2$ | $OCH_3$ |

TABLE 7

| Structure Number | Ar¹, Ar² | j¹, j² | T¹, T² | A¹, A² |
|---|---|---|---|---|
| B-15 | (4-ethylphenyl) | 1 | $CH_2CH_2$ | $OCH_3$ |
| B-16 | (4-n-propylphenyl) | 1 | $CH_2CH_2$ | $OCH_3$ |
| B-17 | (biphenyl-4-yl) | 1 | $CH_2CH_2$ | $OCH_3$ |
| B-18 | (2,4-dimethylbiphenyl-4'-yl) | 1 | $CH_2CH_2$ | $OCH_3$ |
| B-19 | (biphenyl-3-yl, methyl-substituted) | 1 | $CH_2CH_2$ | $OCH_3$ |
| B-20 | (4-(thiophen-2-yl)phenyl) | 1 | $CH_2CH_2$ | $OCH_3$ |
| B-21 | (4-methylnaphthalen-1-yl) | 1 | $CH_2CH_2$ | $OCH_3$ |

TABLE 8

| Structure Number | Ar¹, Ar² | j¹, j² | T¹, T² | A¹, A² |
|---|---|---|---|---|
| B-22 | (9,9-dimethyl-2-methylfluorenyl) | 1 | $CH_2CH_2$ | $OCH_3$ |
| B-23 | (9-(3-methylphenyl)carbazolyl) | 1 | $CH_2CH_2$ | $OCH_3$ |
| B-24 | (9-(4-methylphenyl)carbazolyl) | 1 | $CH_2CH_2$ | $OCH_3$ |
| B-25 | (4'-(diphenylamino)biphenyl-4-yl) | 1 | $CH_2CH_2$ | $OCH_3$ |
| B-26 | (2-methylbenzo[b]thiophen-6-yl) | 1 | $CH_2CH_2$ | $OCH_3$ |

TABLE 8-continued

| Structure Number | Ar¹, Ar² | j¹, j² | T¹, T² | A¹, A² |
| --- | --- | --- | --- | --- |
| B-27 | | 1 | $CH_2CH_2$ | $OCH_3$ |
| B-28 | | 1 | $CH_2CH_2$ | $OCH_3$ |
| B-29 | $H_3CH_2CH_2C$  $CH_2CH_2CH_3$ | 1 | $CH_2CH_2$ | $OCH_3$ |

Here, firstly, a method of synthesizing the charge-transporting monomer represented by formula (VI) will be described. Hereinafter, a method of synthesizing charge-transporting monomers will be exemplified, but is not limited thereto.

Examples of a method of synthesizing the charge-transporting monomer (benzothiadiazole compound) represented by formula (VI) include a method in which the cross coupling biaryl synthesis is used. Specific examples of the cross coupling biaryl synthesis include Suzuki reaction, Kharasch reaction, Negishi reaction, Stille reaction, Grignard reaction, Ullmann reaction, and the like.

Specific examples of the method of synthesizing the charge-transporting monomer represented by formula (VI) include a synthesizing method by the cross coupling reaction between the compound represented by formula (VII') and the compound represented by formula (VIII') as shown in the following formulas, but are not limited thereto.

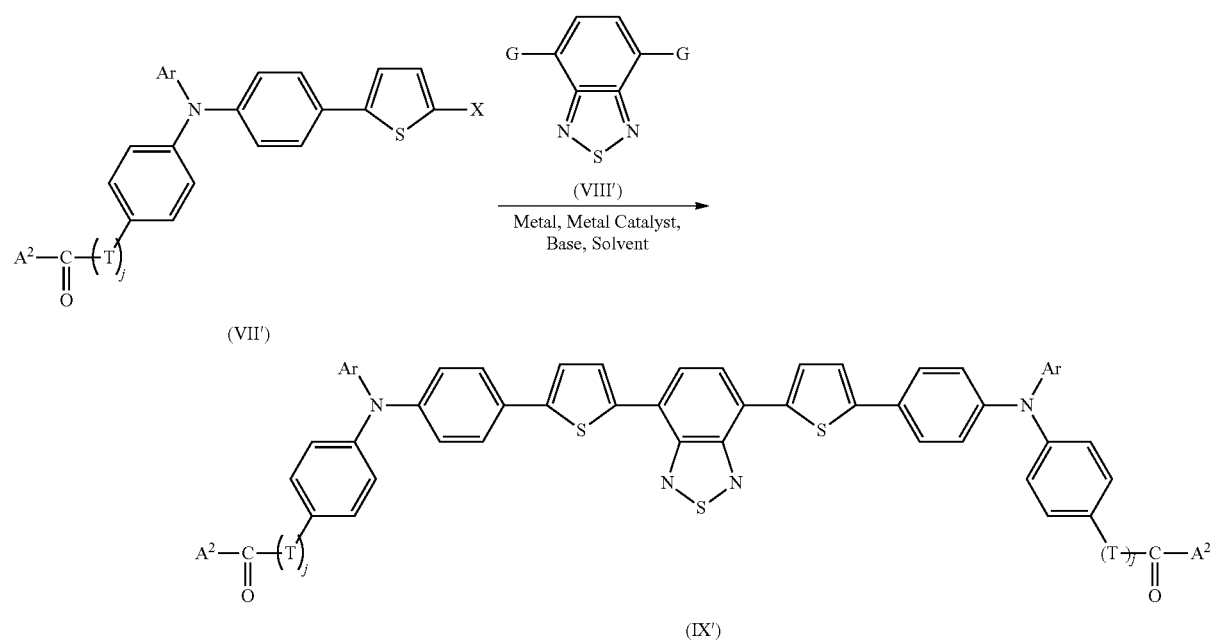

In formula (VII') and formula (VIII'), X and G represent a halogen atom, B(OH)$_2$, the substituent group represented by the following structural formula (X'), the substituent group represented by the following structural formula (XI'), or the substituent group represented by the following structural formula (XII'). In addition, A$^2$, T, j, and Ar in formula (VII') and formula (IX') are the same as A$^2$, j2, and Ar$^2$ in formula (VI), respectively.

In addition, metal, a metal complex catalyst, a base, a solvent, and the like may be used according to necessity during the reaction.

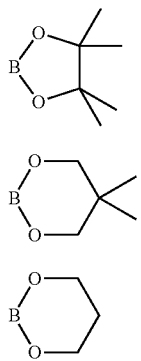

Examples of the metal include Pd, Cu, Ti, Sn, Ni, Pt, and the like.

Examples of the metal complex include tetrakis(triphenylphosphine)palladium (O), palladium (II) acetate, tris(dibenzylideneacetone)dipalladium (O), bis(triphenylphosphine)palladium (II) dichloride, 1,1'-bis(diphenylphosphine)ferrocene-palladium (II) dichloride-dichloromethane complex, Pd/C, nickel (II) acetylacetonate, and the like.

Examples of the base include inorganic bases, such as Na$_2$CO$_3$, K$_2$CO$_3$, Cs$_2$CO$_3$, and Ba(OH)$_2$, and organic bases, such as NEt$_3$, NH(i-Pr)$_2$, NHEt$_2$, NHMe$_2$, NMe$_3$, 1,8-diazabicyclo[5.4.0]-7-undecene, 4-dimethylaminopyridine, pyridine, and the like.

Any solvent may be used as long as the coupling reaction is not inhibited, and specific examples of the solvent include aromatic hydrocarbon solvents, such as benzene, toluene, xylene, and mesitylene, ether solvents, such as diethyl ether, tetrahydrofuran, and dioxane, acetonitrile, dimethylformamide, dimethyl sulfoxide, methanol, ethanol, isopropyl alcohol, water, and the like.

In addition, PPh$_3$, P(o-Tol)$_3$, P(t-Bu)$_3$, Pet$_3$, and the like may be used according to necessity during the reaction.

The reaction may be carried out, for example, at normal pressure under an environment of an inert gas, such as nitrogen and argon, but may be carried out under a pressurized condition.

Examples of the reaction temperature in the reaction include a range of 20° C. to 300° C., but may be a range of 50° C. to 180° C. The reaction time varies with the reaction conditions; however, for example, a range of 5 minutes to 20 hours may be selected.

The used amount of the metal or the metal complex catalyst is not particularly limited, but is, for example, in a range of 0.001 mole to 10 moles, and may be in a range of 0.01 mole to 5.0 moles with respect to one mole of the compound represented by formula (VII).

The used amount of the base is in a range of 0.5 mole to 4.0 moles, and may be in a range of 1.0 mole to 2.5 moles with respect to one mole of the compound represented by formula (VII').

After the reaction, for example, the reaction solution is injected in water and stirred, and a crude product is obtained through suction filtration when the reaction product is crystal. When the reaction product is an oily substance, for example, a crude product is obtained by performing extraction using a solvent, such as ethyl acetate or toluene. The crude product obtained in the above manner may be column-purified using, for example, silica gel, alumina, activated white earth, activated coal, or the like, or purified by carrying out a treatment, in which these absorbents are added to the solution so as to absorb unnecessary portions, or the like, and, furthermore, when the reaction product is crystal, the crude product may be purified by performing recrystallization from the solvent, such as hexane, methanol, acetone, ethanol, ethyl acetate, and toluene.

However, the synthesizing method in the exemplary embodiment is not limited thereto.

The charge-transporting polyester represented by formula (I) is synthesized by polymerizing the charge-transporting monomer obtained in the above manner, which is represented by formula (VI), by a well-known method.

Specific examples include a method in which a substituent group as described below is introduced to the end of the charge-transporting monomer (that is, A$^1$ and A$^2$ in formula (VI)), and the following synthesizing methods.

1) When A$^1$ and A$^2$ Each is a Hydroxyl Group

The same amounts (mass ratio) of the compound represented by formula (VI) and a divalent alcohol represented by HO—(Y$^1$—O)$_{m1}$—H are mixed, and the mixture is polymerized using an acid catalyst. Meanwhile, Y$^1$ and m1 are the same as Y$^1$ and m1 in formula (I).

A catalyst that is normally used in the esterification reaction, such as sulfuric acid, toluenesulfonic acid, and trifluoroacetic acid, is used as the acid catalyst, and is used, for example, in a range of 1/10,000 part by mass to 1/10 part by mass, and may be used in a range of 1/1,000 part by mass to 1/50 part by mass with respect to one part by mass of the monomer (that is, the compound represented by formula (VI)).

For example, an azeotropic solvent of water is used to remove water generated during the polymerization, and specific examples of the effective solvents include toluene, chlorobenzene, 1-chloronaphthalene, and the like. The solvent is used, for example, in a range of one part by mass to 100 parts by mass, and may be used in a range of 2 parts by mass to 50 parts by mass with respect to one part by mass of the monomer.

The reaction temperature is set according to the conditions, but the reaction may be induced at the boiling point of the solvent to remove water generated during the polymerization.

After the completion of the reaction, the mixture is dissolved in a dissolution solvent when the solvent is not used. When the solvent is used, the droplets of the reaction solution are dropped as it is to a poor solvent in which polymers are not easily dissolved, such as alcohols, such as methanol and ethanol, acetone, and the like, polyester is precipitated, separated, washed using water or an organic solvent, and dried.

Furthermore, a re-precipitation treatment, in which the mixture is dissolved in an appropriate organic solvent, and the droplets of the resulting solution are dropped into a poor solvent, thereby precipitating polyester, may be repeated if necessary. The re-precipitation treatment may be carried out in conjunction with efficient stirring using a mechanical stirrer or the like. The solvent in which the polyester is dissolved during the re-precipitation treatment is used, for example, in a range of one part by mass to 100 parts by mass, and may be used in a range of 2 parts by mass to 50 parts by mass with respect to one part by mass of the polyester. In addition, the poor solvent is used, for example, in a range of one part by mass to 1,000 parts by mass, and may be used in a range of 10 parts by mass to 500 parts by mass with respect to one part by mass of the polyester.

2) When $A^1$ and $A^2$ Each is a Halogen Atom

The same amounts (mass ratio) of the compound represented by formula (VI) and a divalent alcohol represented by HO—$(Y^1$—$O)_{m1}$—H are mixed, and the mixture is polymerized using an organic basic catalyst, such as pyridine and triethylamine. Meanwhile, $Y^3$ and m1 are the same as $Y^1$ and m1 in formula (I).

The organic basic solvent is used, for example, in a range of one part by mass to 10 parts by mass, and may be used in a range of 2 parts by mass to 5 parts by mass with respect to one part by mass of monomer.

Examples of the effective solvent include methylene chloride, tetrahydrofuran (THF), toluene, chlorobenzene, 1-chloronaphthalene, and the like, and is used, for example, in a range of one part by mass to 100 parts by mass, and may be used in a range of 2 parts by mass to 50 parts by mass with respect to one part by mass of the monomer (that is, the compound represented by formula (VI)).

The reaction temperature is set according to the conditions. After the polymerization, the re-precipitation treatment is carried out as described above, and the polymer is purified.

The interfacial polymerization method may be used when a divalent alcohol having a high acidity, such as bisphenol, is used. That is, after a divalent alcohol is added to water, the same amount (mass ratio) of base is added and dissolved, and the divalent alcohol and the same amount of monomer solution are added in conjunction with intensive stirring, thereby performing polymerization. At this time, water is used, for example, in a range of one part by mass to 1,000 parts by mass, and may be used in a range of 2 parts by mass to 500 parts by mass with respect to one part by mass of the divalent alcohol. Examples of the effective solvents that dissolve the monomer include methylene chloride, dichloroethane, trichloroethane, toluene, chlorobenzene, 1-chloronaphthalene, and the like.

The reaction temperature is set according to the conditions, and use of a phase-transfer catalyst, such as ammonium salts and sulfonium salts, is effective in accelerating the reaction. The phase-transfer catalyst is used, for example, in a range of 0.1 part by mass to 10 parts by mass, and may be used in a range of 0.2 part by mass to 5 parts by mass with respect to one part by mass of the monomer.

3) When $A^1$ and $A^2$ Each is —O—$R^5$

A divalent alcohol represented by HO—$(Y^1$—$O)_{m1}$—H is excessively added to the compound represented by formula (VI), the mixture is heated using an inorganic acid, such as sulfuric acid and phosphoric acid, an acetate salt, such as titanium alkoxide, calcium, and cobalt, carbonate, or an oxide of zinc or lead as a catalyst, and the charge-transporting polyester is polymerized by transesterification. Meanwhile, $Y^1$ and m1 are the same as $Y^1$ and m1 in formula (I).

The divalent alcohol is used, for example, in a range of 2 parts by mass to 100 parts by mass, and may be used in a range of 3 parts by mass to 50 parts by mass with respect to one part by mass of the monomer (the compound represented by formula (VI)).

The catalyst is used, for example, in a range of 1/10,000 part by mass to one part by mass, and may be used in a range of 1/1,000 part by mass to 1/2 part by mass with respect to one part by mass of the monomer.

The reaction is carried out at a reaction temperature of 200° C. to 300° C., and, after the transesterification from —O—$R^5$ to —O—$(Y^1$—$O)_{m1}$—H is finished, the reaction is carried out, for example, under a reduced pressure to accelerate the polymerization by the desorption of HO—$(Y^1$—$O)_{m1}$—H. In addition, the reaction may be carried out in conjunction with azeotropic removal of HO—$(Y^1$—$O)_{m1}$—H under a normal pressure using a solvent having a high boiling point, such as 1-chloronaphthalene, which is an azeotropic substance of HO—$(Y^1$—$O)_{m1}$—H.

In addition, the polyester may be synthesized in the following manner.

In each of the cases of 1) to 3), after a divalent alcohol is excessively added and reacted so as to generated the compound represented by formula (XIV), the compound is used instead of the monomer represented by formula (VI) so as to make a divalent carboxylic acid, a divalent halide carbonate and the like react, thereby obtaining polyester represented by formula (I).

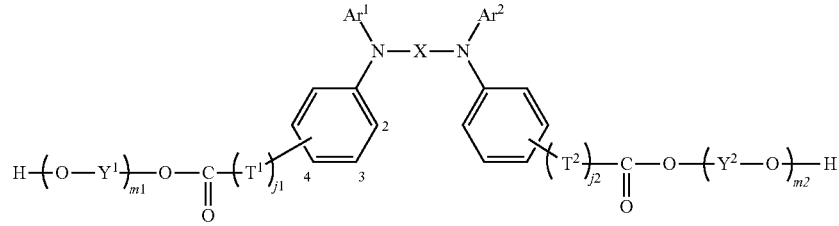

(XIV)

$Ar^1$, $Ar^2$, X, $T^1$, $T^2$, j1 and j2 in formula (XIV) are the same as $Ar^1$, $Ar^2$, X, $T^1$, $T^2$, j1 and j2 in formula (II), and $Y^1$, $Y^2$, m1 and m2 are the same as $Y^1$, $Y^2$, m1 and m2 in formula (I).

Meanwhile, among the synthesizing methods of the 1) to 3), use of the synthesizing method 1) facilitates the manufacture of the charge-transporting polyester in the exemplary embodiment.

Here, the specific examples of the charge-transporting polyester represented by formula (I) are shown in Tables 9 to 15, but the charge-transporting polyester in the exemplary embodiment is not limited to the specific examples. Further, the numeric values in the column of "$A^1$" in the examples of monomers (the column of the "structure of $A^1$ in formula (I)") correspond to the structural numbers of the specific examples of the structure represented by formula (II) (the "structural numbers" of the charge-transporting monomers in Tables 1 to 8).

Hereinafter, for each of the specific examples of the charge-transporting polyester to which the compound numbers (polymer numbers) are attached in the following tables, for example, the specific example whose attached number is 'A-15' will be referred to as the "Exemplary Compound (A-15)." In addition, "$Y^1$ and $Y^2$", "m1 and m2", and "$R^1$ and $R^2$" shown in formula (I) are the same respectively in each of the specific examples of the charge-transporting polyester shown in the following tables.

TABLE 9

| Polymer Number | Structure of '$A^1$' in the General Formula (1) | $Y^1, Y^2$ | m1, m2 | $R^1, R^2$ | p |
|---|---|---|---|---|---|
| A-1 | 1 | $-(CH_2)_2-$ | 1 | H | 65 |
| A-2 | 1 | $-(CH_2)_6-$ | 1 | H | 75 |
| A-3 | 1 | phenyl-CH$_2$-phenyl | 1 | H | 45 |
| A-4 | 1 | cyclohexyl-CH$_2$-cyclohexyl | 1 | H | 38 |
| A-5 | 1 | -CH$_2$-phenyl-CH$_2$- | 1 | H | 49 |
| A-6 | 4 | $-(CH_2)_2-$ | 1 | H | 81 |
| A-7 | 4 | cyclohexyl | 1 | H | 61 |
| A-8 | 4 | phenyl-CH$_2$-phenyl | 1 | H | 59 |
| A-9 | 4 | phenyl (meta) | 1 | H | 87 |
| A-10 | 5 | $-(CH_2)_2-$ | 1 | H | 80 |

TABLE 10

| Polymer Number | Structure of 'A¹' in the General Formula (1) | $Y^1, Y^2$ | m1, m2 | $R^1, R^2$ | p |
|---|---|---|---|---|---|
| A-11 | 6 | —(CH₂)₆— | 1 | H | 74 |
| A-12 | 8 | —(CH₂)₂— | 1 | H | 67 |
| A-13 | 9 | —⟨cyclohexylene⟩— | 1 | H | 41 |
| A-14 | 10 | —(CH₂)₂— | 1 | H | 74 |
| A-15 | 10 | —(CH₂)₆— | 1 | H | 49 |
| A-16 | 12 | —(CH₂)₂— | 1 | H | 52 |
| A-17 | 13 | —(CH₂)₂— | 1 | H | 66 |
| A-18 | 14 | —(CH₂)₂— | 1 | H | 55 |
| A-19 | 14 | —CH₂—⟨m-phenylene⟩—CH₂— | 1 | H | 62 |

TABLE 11

| Polymer Number | Structure of 'A¹' in the General Formula (1) | $Y^1, Y^2$ | m1, m2 | $R^1, R^2$ | p |
|---|---|---|---|---|---|
| A-20 | 15 | —(CH₂)₂— | 1 | H | 49 |
| A-21 | 15 | —CH₂—⟨cyclohexylene⟩—CH₂— | 1 | H | 54 |
| A-22 | 19 | —(CH₂)₆— | 1 | H | 57 |
| A-23 | 23 | —(CH₂)₂— | 1 | H | 83 |
| A-24 | 23 | —⟨cyclohexylene⟩— | 1 | H | 82 |
| A-25 | 24 | —⟨phenylene⟩—CH₂—⟨phenylene⟩— | 1 | H | 31 |
| A-26 | 25 | —(CH₂)₂— | 1 | H | 61 |
| A-27 | 26 | —(CH₂)₂— | 1 | H | 78 |
| A-28 | 30 | —(CH₂)₂— | 1 | H | 75 |

TABLE 12

| Polymer Number | Structure of 'A¹' in the General Formula (1) | $Y^1, Y^2$ | m1, m2 | $R^1, R^2$ | p |
|---|---|---|---|---|---|
| A-29 | 32 | —(CH₂)₂— | 1 | H | 64 |
| A-30 | 32 | —(CH₂)₆— | 1 | H | 57 |
| A-31 | 33 | —(CH₂)₂— | 1 | H | 62 |
| A-32 | 35 | —⟨cyclohexylene⟩— | 1 | H | 43 |
| A-33 | 37 | —(CH₂)₂— | 1 | H | 58 |
| A-34 | 38 | —(CH₂)₂— | 1 | H | 61 |

TABLE 13

| Polymer Number | Structure of 'A¹' in the General Formula (1) | Y¹, Y² | m1, m2 | R¹, R² | p |
|---|---|---|---|---|---|
| B-1 | 1 | −(CH$_2$)$_2$− | 1 | H | 38 |
| B-2 | 1 | −(CH$_2$)$_6$− | 1 | H | 36 |
| B-3 | 2 | −C$_6$H$_4$−CH$_2$−C$_6$H$_4$− | 1 | H | 48 |
| B-4 | 3 | −(CH$_2$)$_2$− | 1 | H | 56 |
| B-5 | 4 | −(CH$_2$)$_2$− | 1 | H | 47 |
| B-6 | 4 | −C$_6$H$_{10}$−CH$_2$−C$_6$H$_{10}$− | 1 | H | 37 |
| B-7 | 6 | −(CH$_2$)$_2$− | 1 | H | 48 |
| B-8 | 8 | −CH$_2$−(1,3-C$_6$H$_4$)−CH$_2$− | 1 | H | 42 |
| B-9 | 9 | −(CH$_2$)$_2$− | 1 | H | 34 |
| B-10 | 11 | −(CH$_2$)$_2$− | 1 | H | 58 |

TABLE 14

| Polymer Number | Structure of 'A¹' in the General Formula (1) | Y¹, Y² | m1, m2 | R¹, R² | p |
|---|---|---|---|---|---|
| B-11 | 11 | −C$_6$H$_{10}$− (1,4-cyclohexylene) | 1 | H | 68 |
| B-12 | 11 | −(CH$_2$)$_2$− | 1 | −OC−C$_6$H$_5$ | 58 |
| B-13 | 4 | −(1,3-C$_6$H$_4$)− | 1 | H | 71 |
| B-14 | 12 | −(CH$_2$)$_2$− | 1 | H | 72 |
| B-15 | 13 | −(CH$_2$)$_2$− | 1 | H | 46 |
| B-16 | 14 | −(CH$_2$)$_2$− | 1 | H | 62 |
| B-17 | 14 | −C$_6$H$_{10}$− (1,4-cyclohexylene) | 1 | H | 48 |

TABLE 14-continued

| Polymer Number | Structure of 'A¹' in the General Formula (1) | $Y^1, Y^2$ | m1, m2 | $R^1, R^2$ | p |
|---|---|---|---|---|---|
| B-18 | 14 | —(CH$_2$)$_6$— | 1 | H | 45 |
| B-19 | 19 | —(CH$_2$)$_2$— | 1 | H | 48 |
| B-20 | 20 | —(CH$_2$)$_2$— | 1 | H | 63 |

TABLE 15

| Polymer Number | Structure of 'A¹' in the General Formula (1) | $Y^1, Y^2$ | m1, m2 | $R^1, R^2$ | p |
|---|---|---|---|---|---|
| B-21 | 20 | —CH$_2$—(C$_6$H$_4$)—CH$_2$— | 1 | H | 53 |
| B-22 | 21 | —(CH$_2$)$_2$— | 1 | H | 63 |
| B-23 | 22 | —CH$_2$—(cyclohexyl)—CH$_2$— | 1 | H | 51 |
| B-24 | 22 | —(CH$_2$)$_6$— | 1 | H | 53 |
| B-25 | 22 | —(CH$_2$)$_2$— | 1 | H | 59 |
| B-26 | 23 | —(cyclohexyl)— | 1 | H | 78 |
| B-27 | 24 | —(C$_6$H$_4$)—CH$_2$—(C$_6$H$_4$)— | 1 | H | 62 |
| B-28 | 25 | —(CH$_2$)$_2$— | 1 | H | 42 |
| B-29 | 26 | —(CH$_2$)$_2$— | 1 | H | 48 |
| B-30 | 29 | —(CH$_2$)$_2$— | 1 | H | 65 |

Next, the configuration of the organic electroluminescence element of the exemplary embodiment will be described in detail.

The layer configuration is not particularly limited as long as the organic electroluminescence element of the exemplary embodiment is composed of a pair of electrodes, at least one of which is transparent or semitransparent, and one or plural organic compound layers that are sandwiched between the electrodes, in which at least one layer of the organic compound layers contains one of the charge-transporting polyesters as described above.

When the organic electroluminescence element of the exemplary embodiment includes a single-layer organic compound layer, the organic compound layer means a light-emitting layer having a charge-transporting function, and the light-emitting layer contains the charge-transporting polyester. On the other hand, when the organic compound layers include plural layers (that is, when the organic compound layers are function-separated layers having different functions in the respective layers), at least one layer composes a light-emitting layer, and the light-emitting layer may be a light-emitting layer having a charge-transporting function. In this case, specific examples of the layer configurations composed of the light-emitting layer or a light-emitting layer having the charge-transporting function and other layers include the following (1) to (3).

(1) A layer configuration composed of a light-emitting layer and a layer that functions at least any of a charge-transporting layer and a charge-injecting layer (2) A layer configuration composed of a light-emitting layer, a layer which is at least any of a hole-transporting layer and a hole-injecting layer, a layer which is at least any of an electron-transporting layer and an electron-injecting layer (3) A layer configuration formed of a light-emitting layer and a layer which is any of a hole-transporting layer and a hole-injecting layer Layers other than the light-emitting layer and the light-emitting layer having a charge-transporting function in the layer configuration (1) to (3) have a function of a charge-transporting layer or a charge-injecting layer.

Meanwhile, any layer in any of the layer configurations (1) to (3) may include the charge-transporting polyester.

In addition, in the organic electroluminescence element of the exemplary embodiment, the light-emitting layer, the hole-transporting layer, the hole-injecting layer, the electron-transporting layer, and the electron-injecting layer may further include charge-transporting compounds other than the charge-transporting polyester (hole-transporting materials and electron-transporting materials). The details of the charge-transporting compounds will be described below.

Hereinafter, the organic electroluminescence element of the exemplary embodiment will be described in more detail with reference to figures, but is not limited thereto.

Figure 2:
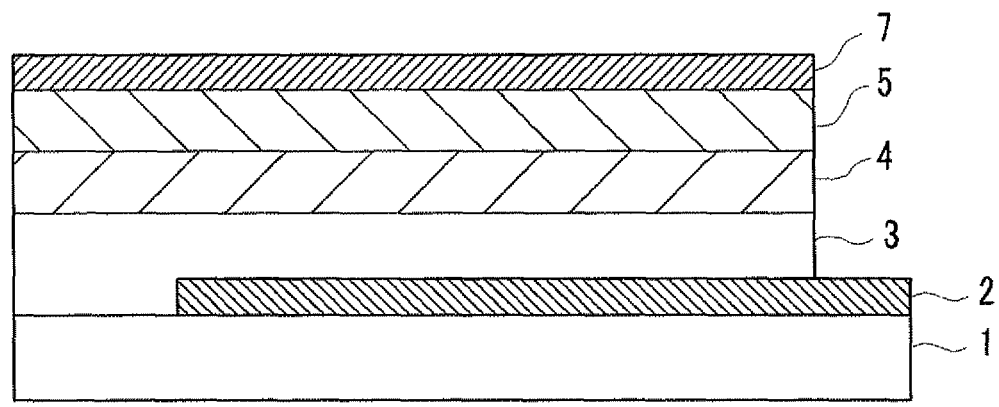
FIG. 2 is a schematic configuration diagram showing a second example of the layer configuration of the organic electroluminescence element according to the exemplary embodiment.
Figure 3:
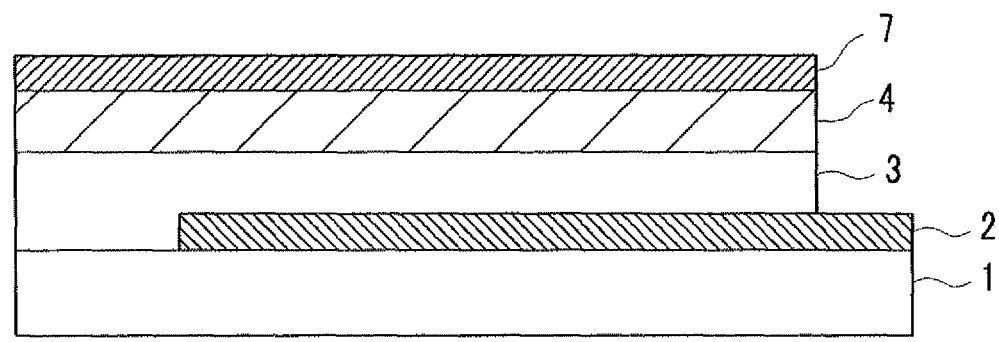
FIG. 3 is a schematic configuration diagram showing a third example of the layer configuration of the organic electroluminescence element according to the exemplary embodiment.
Figure 4:
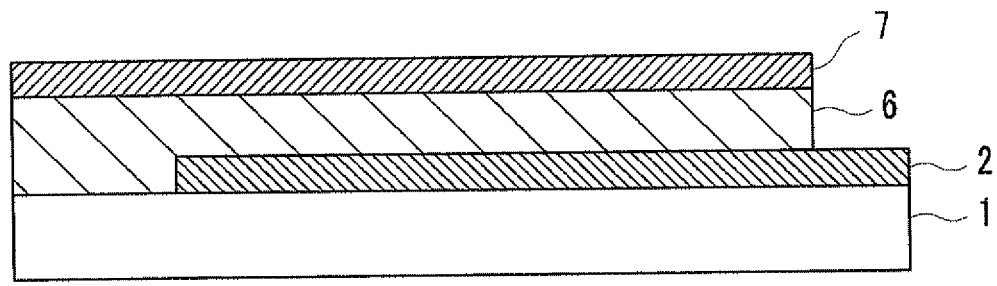
FIG. 4 is a schematic configuration diagram showing a fourth example of the layer configuration of the organic electroluminescence element according to the exemplary embodiment.

FIGS. 1 to 4 are schematic cross-sectional views for explaining the layer configuration of the electroluminescence element of the exemplary embodiment, FIGS. 1 to 3 show examples when the organic compound layers include plural layers, and FIG. 4 shows an example when the organic compound layer includes a single layer. Meanwhile, the portions having the same function are given the same reference number in FIGS. 1 to 4.

The organic electroluminescence element shown in FIG. 1 has a transparent electrode 2, a light-emitting layer 4, at least one layer 5 of an electron-transporting layer and an electron-injecting layer, and a rear surface electrode 7 sequentially laminated on a transparent insulator substrate 1, and thus corresponds to the layer structure (1). However, when the layer represented by the reference number 5 is composed of an electron-transporting layer and an electron-injecting layer, the electron-transporting layer, the electron-injecting layer, and the rear surface electrode 7 are laminated in this order on the rear surface electrode 7 side of the light-emitting layer 4.

The organic electroluminescence element shown in FIG. 2 has the transparent electrode 2, at least one layer 3 of a hole-transporting layer and a hole-injecting layer, the light-emitting layer 4, at least one layer 5 of the electron-transporting layer and the electron-injecting layer, and the rear surface electrode 7 sequentially laminated on the transparent insulator substrate 1, and thus corresponds to the layer structure (2). However, when the layer represented by the reference number 3 is composed of a hole-transporting layer and a hole-injecting layer, the hole-injecting layer, the hole-transporting layer, and the light-emitting layer 4 are laminated in this order on the rear surface electrode 7 side of the transparent electrode 2. In addition, when the layer represented by the reference number 5 is composed of an electron-transporting layer and an electron-injecting layer, the electron-transporting layer, the electron-injecting layer, and the rear surface electrode 7 are laminated in this order on the rear surface electrode 7 side of the light-emitting layer 4.

The organic electroluminescence element shown in FIG. 3 has the transparent electrode 2, at least one layer 3 of a hole-transporting layer and a hole-injecting layer, the light-emitting layer 4, and the rear surface electrode 7 sequentially laminated on the transparent insulator substrate 1, and thus corresponds to the layer structure (3). However, when the layer represented by the reference number 3 is composed of a hole-transporting layer and a hole-injecting layer, the hole-injecting layer, the hole-transporting layer, and the light-emitting layer 4 are laminated in this order on the rear surface electrode 7 side of the transparent electrode 2.

The organic electroluminescence element shown in FIG. 4 has the transparent electrode 2, a light-emitting layer 6 having a charge-transporting function, and the rear surface electrode 7 sequentially laminated on the transparent insulator substrate 1.

In addition, when the organic electroluminescence element employs a top emission structure or a permeable type in which a transparent electrode is used for both the negative electrode and the positive electrode, furthermore, a structure in which the layer structures of FIGS. 1 to 4 are stacked plural times is realized as well.

Hereinafter, each of the above will be described in detail.

The charge-transporting polyester in the exemplary embodiment is supplied with any of a hole-transporting function and a charge-transporting function according to the function of the included organic compound layer.

For example, the charge-transporting polyester may be included in the light-emitting layer 4, and any of at least one layer 5 of the electron-transporting layer and the electron-injecting layer, and act as both the light-emitting layer 4, and at least one layer 5 of the electron-transporting layer and the electron-injecting layer in the case of the layer structure of the organic electroluminescence element shown in FIG. 1. In addition, the charge-transporting polyester may be included in any of at least one layer 3 of the hole-transporting layer and the hole-injecting layer, the light-emitting layer 4, and any of at least one layer 5 of the electron-transporting layer and the electron-injecting layer, and act as any of at least one layer 3 of the hole-transporting layer and the hole-injecting layer, the light-emitting layer 4, and at least one layer 5 of the electron-transporting layer and the electron-injecting layer in the case of the layer structure of the organic electroluminescence element shown in FIG. 2. In addition, the charge-transporting polyester may be included in any of at least one layer 3 of the hole-transporting layer and the hole-injecting layer, and the light-emitting layer 4, and act as both at least one layer 3 of the hole-transporting layer and the hole-injecting layer, and the light-emitting layer 4 in the case of the layer structure of the organic electroluminescence element shown in FIG. 3. Furthermore, the charge-transporting polyester may be included in the light-emitting layer 6 having a charge-transporting function, and act as the light-emitting layer 6 having a charge-transporting function in the case of the layer structure of the organic electroluminescence element shown in FIG. 4.

In the case of the layer structures of the organic electroluminescence element shown in FIGS. 1 to 4, the material for the transparent insulator substrate 1 to allow emitted light to pass may be transparent, and includes glass, plastic films, and the like, but is not limited thereto. Meanwhile, 'transparent' means that the permeability of light in the visible light range is 10% or higher, and may be 75% or higher. Hereinafter, the same thing applies.

In addition, the transparent electrode 2 is transparent or semitransparent to allow emitted light to pass in accordance with the transparent insulator substrate, and an electrode having a large work function may be used to inject holes, and examples thereof include an electrode having a work function of 4 eV or higher. The 'semitransparent' means that the permeability of light in the visible light range is 70% or higher, and may be 80% or higher. Hereinafter, the same thing applies.

Specific examples thereof include oxidized films, such as indium tin oxide (ITO), tin oxide (NESA), indium oxide, and zinc oxide, deposited or sputtered gold, platinum, palladium, and the like, but are not limited thereto. The sheet resistance of the electrode becomes better as the resistance lowers, and may be several hundreds Ω/☐ or lower and, furthermore, 100Ω/☐ or lower. In addition, the permeability of light in the visible light range is 10% or higher, and, furthermore, may be 75% or higher in accordance with the transparent insulator substrate.

In the case of the layer structures of the organic electroluminescence element shown in FIGS. 1 to 3, the electron-transporting layer, the hole-transporting layer, or the like may be formed singularly of the charge-transporting polyester to which functions (the electron-transporting function and the hole-transporting function) are supplied according to purpose; however, for example, the electron-transporting layer, the hole-transporting layer, or the like may be formed by mixing and dispersing a hole-transporting material other than the charge-transporting polyester in a range of 0.1% by mass to 50% by mass with respect to the entire materials composing the layers in order to adjust hole mobility.

Examples of the hole-transporting material include tetraphenylene diamine derivatives, triphenylamine derivatives, carbazole derivatives, stilbene derivatives, spirofluorene derivatives, arylhydrazone deviates, porphyrin-based compounds, and, among the above, examples of the hole-transporting material having a good compatibility with the charge-transporting polyester include tetraphenylene diamine derivatives, spirofluorene derivatives, and triphenylamine derivatives.

In addition, the electron-transporting layer, the hole-transporting layer, or the like may be formed by mixing and dispersing an electron-transporting material in a range of 0.1% by mass to 50% by mass with respect to the entire materials composing the layers when hole mobility is adjusted.

Examples of the electron-transporting material include oxadiazole derivatives, nitro-substituted fluorine derivatives, diphenoquinone derivatives, thiopyran dioxide derivatives, cyrol derivatives, chelate-type organic metal complexes, polynuclear or condensed aromatic ring compounds, perylene derivatives, triazole derivatives, fluorenylidene methane derivatives, and the like.

In addition, when it is necessary to adjust both hole mobility and electron mobility, both the hole-transporting material and the electron-transporting material may be mixed together in the charge-transporting polyester.

Furthermore, appropriate resins (polymers) and additives may be added to improve film-forming properties, prevent pinholes, and the like. Specific examples of the resins that may be used include conductive resins, such as polycarbonate resins, polyester resins, methacryl resins, acryl resins, polyvinyl chloride resins, cellulose resins, urethane resins, epoxy resins, polystyrene resins, polyvinyl acetate resins, styrene butadiene copolymers, vinylidene chloride-acrylonitrile copolymers, vinyl chloride-vinyl acetate-anhydrous maleic acid copolymers, silicone resins, poly-N-vinyl carbazole resins, polysilane resins, polythiophen, and polypyrrole.

Here, the 'conductive' means that, for example, the volume resistivity is in a range of $1.0 \times 10^9$ Ω·cm or less, and the same applies hereinafter. In addition, examples of the additives that may be used include well-known oxidation inhibitors, ultraviolet absorbers, plasticizers, and the like.

In addition, there are cases in which a hole-injecting layer or an electron-injecting layer is used when charge-injecting properties are improved, and examples of the hole-injecting material that may be used include triphenylamine derivatives, phenylenediamine derivatives, phthalocyanine derivatives, indanthrene derivatives, polyalkylene dioxythiophene derivatives, and the like. In addition, Lewis acid, sulfuric acid, or the like may be mixed with the hole-injecting material. Examples of the electron-injecting materials include metals, such as Li, Ca, Ba, Sr, Ag, and Au, metal fluorides, such as LiF and MgF, metal oxides, such as MgO, $Al_2O_3$, and LiO.

In addition, when the charge-transporting polyester is used for functions other than the light-emitting function, a light-emitting compound is used as a light-emitting material. Examples of the light-emitting material that may be used include compounds showing a high luminescent quantum efficiency in a solid state. The light-emitting material may be either a low-molecular compound or a high-molecular compound, and specific examples of the light-emitting material include chelate-type organic metal complexes, polynuclear or condensed aromatic ring compounds, perylene derivatives, coumarin derivatives, styrylarylene derivatives, cyrol derivatives, oxazole derivatives, oxathiazole derivatives, oxadiazole derivatives, and the like when the light-emitting material is an organic low molecule, and include polyparaphenylene derivatives, polyparaphenylene vinylene derivatives, polythiophen derivatives, polyacetylene derivatives, and the like when the light-emitting material is a high molecule. Specific examples include compounds of the following compounds (XV-1) to (XV-17), but are not limited thereto.

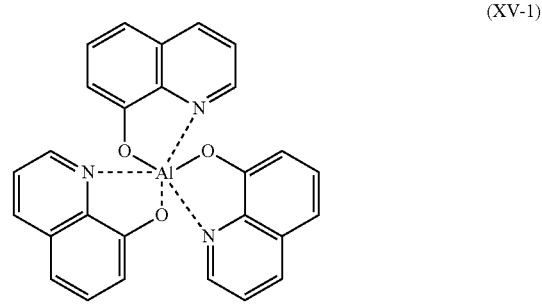

(XV-1)

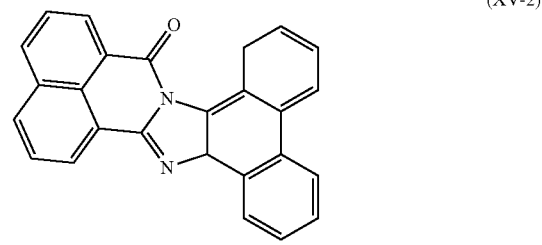

(XV-2)

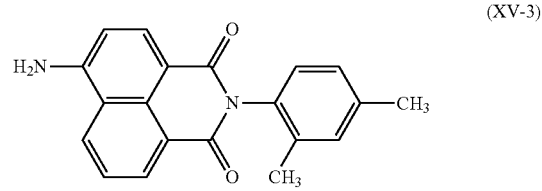

(XV-3)

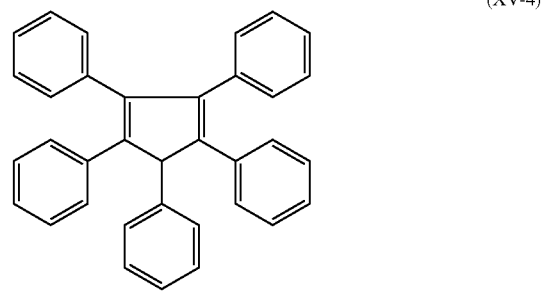

(XV-4)

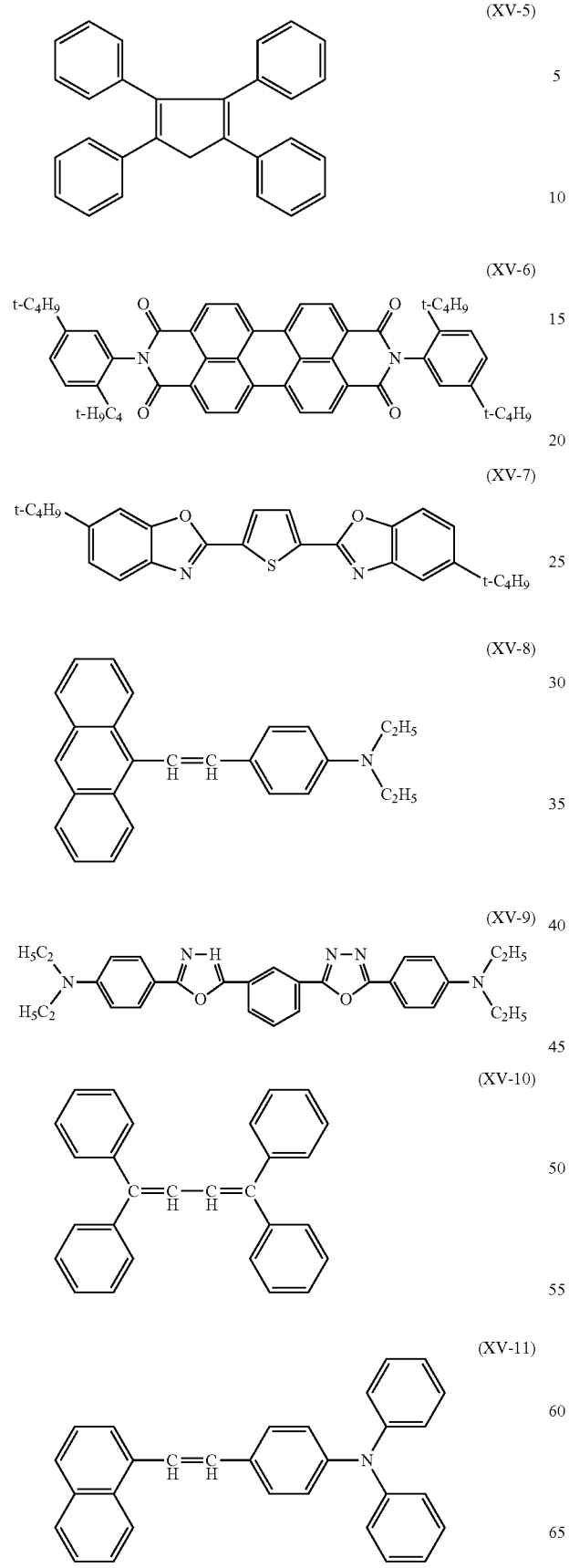
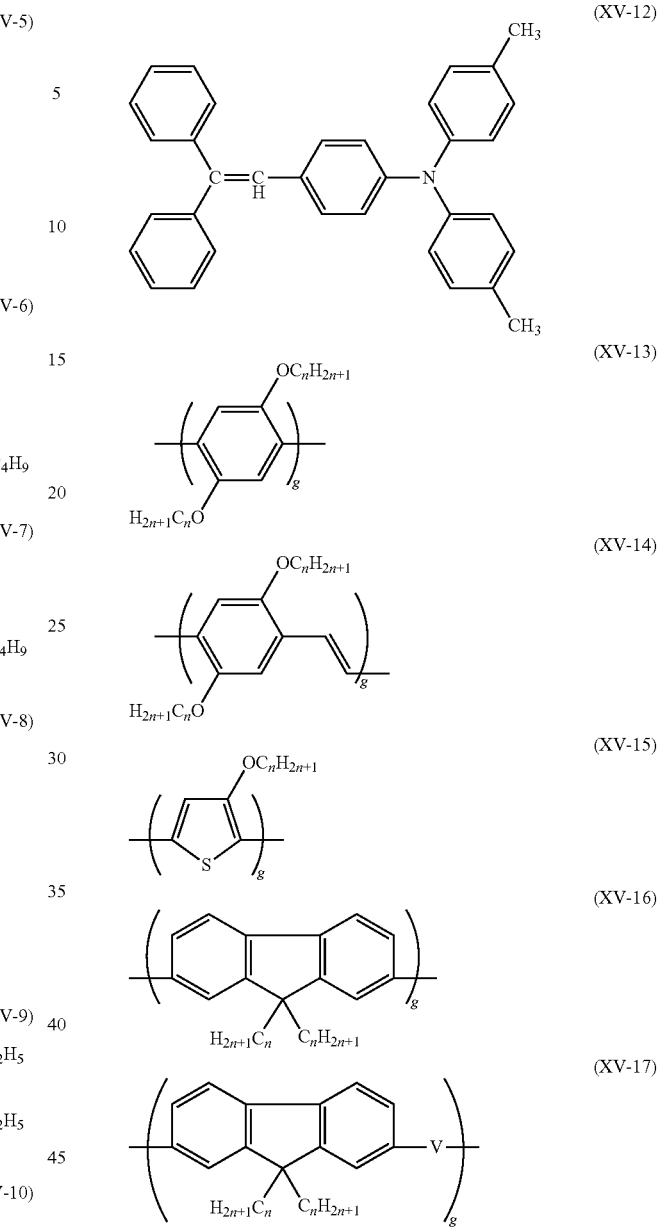

Meanwhile, V in the above structural formulas (XV-13) to (XV-17) represents the same divalent organic group as the above $Y^1$, and n and g each independently represents an integer of 1 or higher.

In addition, a pigment compound that is different from the light-emitting material may be doped in the light-emitting material or the charge-transporting polyester as a guest material for the purpose of improvement in the durability of the organic electroluminescence element or improvement in luminance efficiency. The fraction of the pigment compound to be doped is 0.001% by mass to 40% by mass of the target layer, and may be 0.01% by mass to 10% by mass. Examples of the pigment compounds that may be used for doping include organic compounds that have a favorable compatibility with the light-emitting material and do not hinder the formation of a favorable thin film of the light-emitting layer, and specific examples thereof include coumarin derivatives, DCM derivatives, quinacridone derivatives, perimidone derivatives, benzopyran derivatives, rhodamine derivatives, benzothioxanthen derivatives, rubrene derivatives, porphyrin derivatives, compounds of metal complex, such as ruthenium, rhodium, palladium, silver, rhenium, osmium, iridium, platinum, and gold.

Specific examples of the pigment compounds include compounds of the following compounds (XVI-1) to (XVI-6), but are not limited thereto.

(XVI-1)

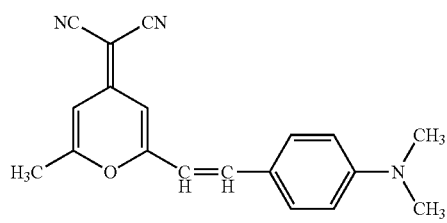

(XVI-2)

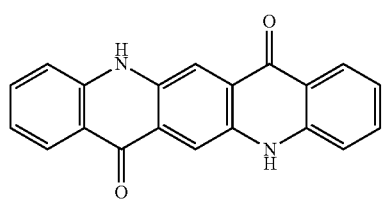

(XVI-3)

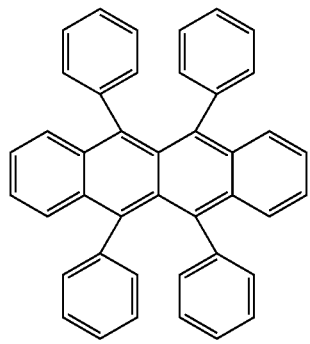

(XVI-4)

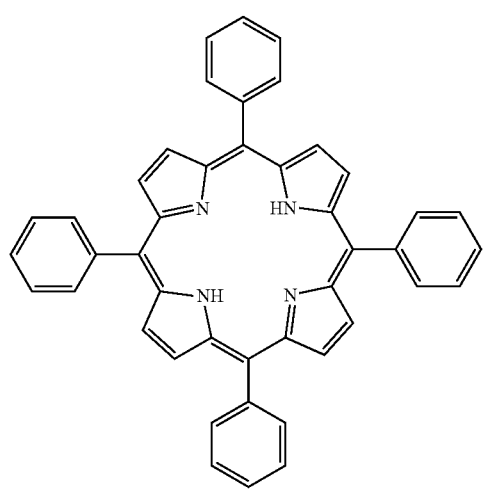

(XVI-5)

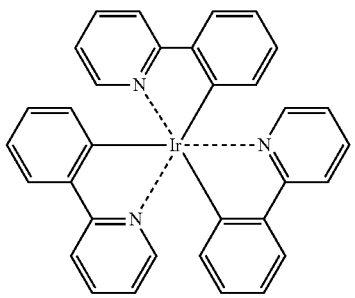

(XVI-6)

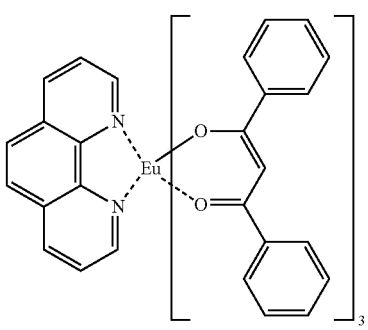

In addition, the light-emitting layer 4 may be formed singularly of the light-emitting material, but may be formed by mixing and dispersing the charge-transporting polyester in the light-emitting material in a range of 1% by mass to 50% by mass for the purpose of further improving electrical characteristics and light-emitting characteristics. Alternatively, the light-emitting layer 4 may be formed by mixing and dispersing a charge-transporting material other than the charge-transporting polyester in the light-emitting material in a range of 1% by mass to 50% by mass. In addition, when the charge-transporting polyester also has light-emitting characteristics, the polyester may be used as a light-emitting material, and, in this case, the light-emitting layer 4 may be formed by mixing and dispersing the charge-transporting material other than the charge-transporting polyester in a range of 1% by mass to 50% by mass for the purpose of further improving electrical characteristics and light-emitting characteristics.

In the case of the layer configuration of the organic electroluminescence element shown in FIG. 4, the light-emitting layer 6 having a charge-transporting function is an organic compound layer in which 50% by mass or less of a light-emitting material (specifically, for example, at least one selected from the light-emitting materials (XV-1) to (XV-17)) is dispersed in the charge-transporting polyester to which a function (a hole-transporting function or an electron-transporting function) is supplied according to purpose, but a charge-transporting material other than the charge-transporting polyester may be dispersed at 10% by mass to 50% by mass to adjust the balance between holes and electrons which are injected to the organic electroluminescence element.

Examples of electron-transporting materials as the charge-transporting materials when electron mobility is adjusted include oxadiazole derivatives, nitro-substituted fluorine derivatives, diphenoquinone derivatives, thiopyran dioxide derivatives, fluorenylidene methane derivatives, and the like.

In the case of the layer configuration of the organic electroluminescence element shown in FIGS. 1 to 4, metal, metal oxides, metal fluorides, and the like which are vacuum-deposited and have a small work function for electron injection are used for the rear surface electrode 7. Examples of the metal include magnesium, aluminum, gold, silver, indium, lithium, calcium, and alloys thereof. Examples of the metal oxides include lithium oxide, magnesium oxide, aluminum oxide, indium tin oxide, tin oxide, indium oxide, zinc oxide, indium zinc oxide, and the like. In addition, examples of the metal fluoride include lithium fluoride, magnesium fluoride, strontium fluoride, calcium fluoride, and aluminum fluoride.

In addition, a protective layer may be further provided on the rear surface electrode 7 in order to prevent the element from being degraded by moisture or oxygen. Specific examples of materials for the protective layer include metals, such as In, Sn, Pb, Au, Cu, Ag, and Al, metal oxides, such as MgO, $SiO_2$, and $TiO_2$, resins, such as polyethylene resins, polyurea resins, and polyimide resins, and the like. The vacuum deposition method, the sputtering method, the plasma polymerization method, the CVD method, and the coating method are applied to the formation of the protective layer.

The organic electroluminescence elements shown in FIGS. 1 to 4 are manufactured by, firstly, sequentially forming each of the layers on the transparent electrode 2 according to the layer configuration of each of the organic electroluminescence elements. Meanwhile, at least one layer 3 of the hole-transporting layer and the hole-injecting layer, the light-emitting layer 4, at least one layer 5 of the electron-transporting layer and the electron-injecting layer, or the light-emitting layer 6 having a charge-transporting function are formed by depositing each of the materials using the vacuum deposition method, or by dissolving or dispersing each of the materials in an appropriate organic solvent, and depositing the obtained coating solution on the transparent electrode using the spin coating method, the casting method, the dip method, the ink jet method, or the like.

The film thicknesses of at least one layer 3 of the hole-transporting layer and the hole-injecting layer, the light-emitting layer 4, at least one layer 5 of the electron-transporting layer and the electron-injecting layer, or the light-emitting layer 6 having a charge-transporting function are 10 μm or smaller, respectively, and, particularly, in a range of 0.001 μm to 5 μm. The dispersion state of each of the materials (the nonconjugated high molecules, light-emitting materials, and the like) may be any of a molecular dispersion state and a particle state, such as fine crystals. In the case of the film forming method in which a coating solution is used, it is necessary to select the dispersion solvent for forming the molecular dispersion state in consideration of the dispersibility and solubility of each of the materials. A ball mill, a sand mill, a paint shaker, an attritor, a homogenizer, the ultrasonic method, and the like are used to disperse the materials in a molecular shape.

In addition, finally, in the case of the organic electroluminescence elements shown in FIGS. 1 and 2, the organic electroluminescence element of the exemplary embodiment is obtained by forming the rear surface electrode 7 on at least one layer 5 of the electron-transporting layer and the electron-injecting layer using the vacuum deposition method, the sputtering method, or the like. In addition, the organic electroluminescence element of the exemplary embodiment is obtained by forming the rear surface electrode 7 on the light-emitting layer 4 in the case of the organic electroluminescence element shown in FIG. 3, and on the light-emitting layer 6 having a charge-transporting function in the case of the organic electroluminescence element shown in FIG. 4 using the vacuum deposition method, the sputtering method, or the like.

<Display Medium>

The display medium of the exemplary embodiment has the organic electroluminescence elements of the exemplary embodiment disposed in at least one of a matrix shape and a segment shape. When the organic electroluminescence elements are disposed in a matrix shape in the exemplary embodiment, only the electrodes may be disposed in the matrix shape, or both the electrode and the organic compound layer may be disposed in the matrix shape. In addition, when the organic electroluminescence elements is disposed in a segment shape in the exemplary embodiment, only the electrodes may be disposed in the segment shape, or both the electrode and the organic compound layer may be disposed in the segment shape.

The matrix-shaped or segment-shaped organic compound layer is easily formed using, for example, the ink jet method as described above.

The well-known apparatuses and methods are used as the driving apparatus and driving method of the display medium composed of the organic electroluminescence elements disposed in a matrix shape and the organic electroluminescence elements disposed in a segment shape.

EXAMPLES

Hereinafter, the invention will be described in more detail with reference to the examples. However, each of the examples does not limit the invention.

Synthesis of the Charge-Transporting Polyester

Synthesis Example 1-1

Synthesis of Exemplary Compound (A-6)

Acetanilide (25.0 g), 4-iodo phenyl propionic acid methyl (64.4 g), potassium carbonate (38.3 g), copper sulfate pentahydrate (2.3 g), and n-tridecane (50 ml) are put into a 500 ml three neck flask, heated and stirred under a stream of nitrogen at 230° C. for 20 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. After the reaction, the product is extracted with toluene, and an organic phase is washed with pure water. Next, after the organic phase is dried with anhydrous sodium sulfate, the solvent is distilled away under a reduced pressure, whereby 36.5 g of the following DAA-1 is obtained by recrystallization from hexane.

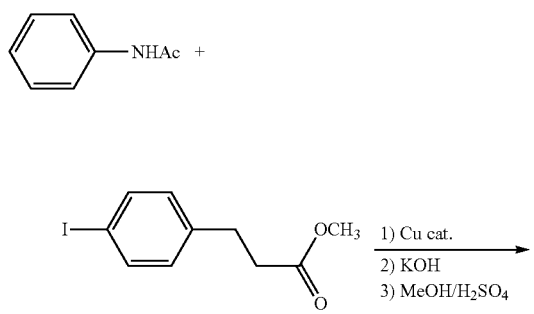

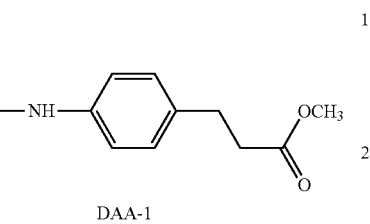

DAA-1

Next, a mixed solution of iodobenzene (4.8 g), the above DAA-1 (5.0 g), copper (II) sulfate pentahydrate (0.2 g), potassium carbonate (1.3 g) and tridecane (10 ml) is stirred at 210° C. for 7 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. The resulting substance is cooled to room temperature (25° C.), and is filtered with celite by adding toluene. The product obtained by washing with pure water, extracting the organic phase, and distilling away the organic solvent is separated by silica gel column chromate (hexane 4:toluene 1), whereby 3.9 g of the following TAA-1 is obtained.

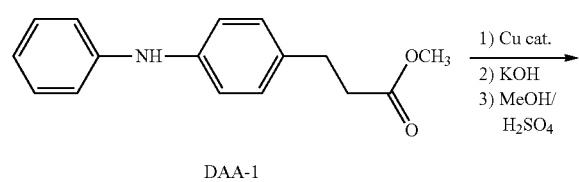

DAA-1

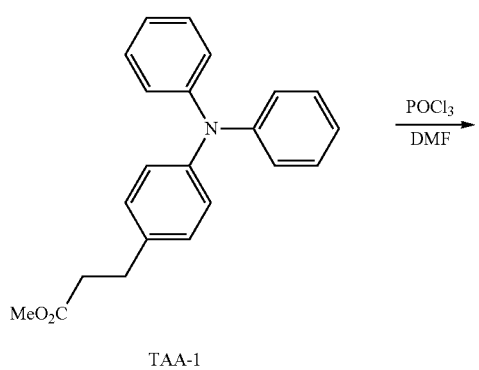

TAA-1

A mixed solution of the TAA-1 (3.0 g) and N,N-dimethylformamide (100 ml) is put into a 500 ml three neck flask, the droplets of phosphorus oxychloride (1.7 g) are dropped, and then the resulting substance is heated to 80° C. and stirred for 7 hours.

After cooling, the reaction solution is added to pure water, and the precipitated crystals are taken by suction filtration, whereby 2.4 g of formylated TAA-1 is obtained.

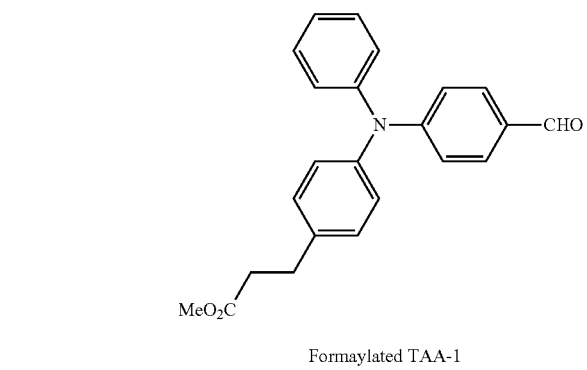

TAA-1

Formaylated TAA-1

The formylated TAA-1 (1.6 g) and 2,5-diamino-1,4-bensodithiol (0.5 g) are dissolved in m-xylene (10 ml) and refluxed for 15 hours under a nitrogen environment. After cooling, 30 ml of tetrahydrofuran (TFT) is added, and the reaction solution is filtered. The resulting substance is purified with column chromatography (toluene:ethyl acetate=5:1), whereby 0.6 g of a monomer compound (A-4) is obtained.

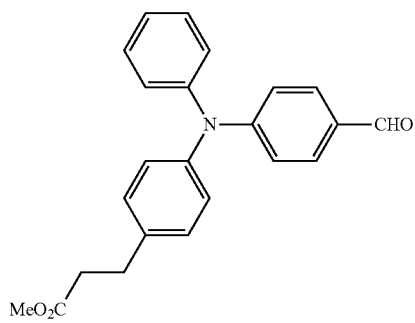
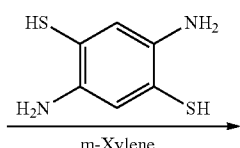

m-Xylene

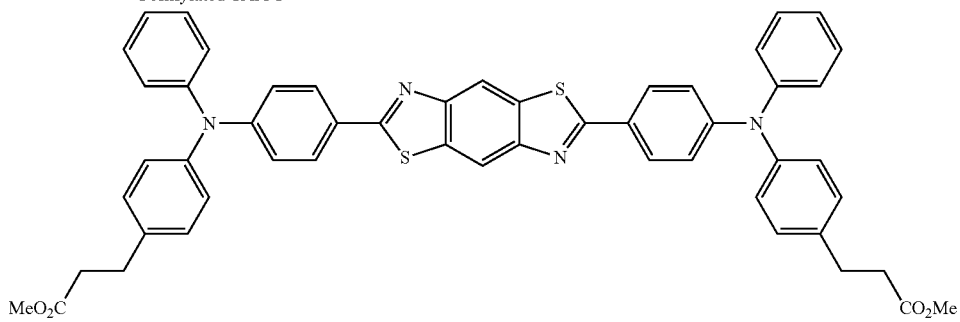

Formylated TAA-1

Monomer Compound (A-4)

0.5 g of the obtained monomer compound (A-4) is put into a 50 ml three neck recovery flask together with 10 ml of ethylene glycol and 0.01 g of titanium tetrabutoxide, heated and stirred under a nitrogen environment at 200° C. for 5 hours.

After confirming by TLC that the monomer compound (A-4), which is a raw material, reacts and disappears, the resulting substance is heated to 210° C. at a pressure reduced to 50 Pa while ethylene glycol is distilled away, and the reaction continues for 6 hours.

After that, the resulting substance is cooled to room temperature (25° C.), and dissolved in 50 ml of tetrahydrofuran. The insoluble substance is filtered with a 0.5 polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.4 g of a polymer [the Exemplary Compound (A-6)] is obtained.

As a result of measuring the molecular weight of the polymer using gel permeation chromatography (GPC) (manufactured by Tosoh Corporation, HLC-8120GPC), the weight-average molecular weight $Mw=6.9\times10^4$ (styrene conversion), Mw/Mn=1.95, and the degree of polymerization p obtained from the molecular weight of the low-molecular compound (the monomer compound), which is a raw material, is 81.

Synthesis Example 1-2

Synthesis of Exemplary Compound (A-23)

4-(2-thienyl)acetanilide (30.0 g), 4-iodo phenyl propionic acid methyl (28.5 g), potassium carbonate (13.6 g), copper sulfate pentahydrate (2.0 g), and 1,2-dichlorobenzene (50 ml) are put into a 500 ml three neck flask, heated and stirred under a stream of nitrogen at 230° C. for 20 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. After the reaction, the product is extracted with toluene, and an organic phase is washed with pure water. Next, after the organic phase is dried with anhydrous sodium sulfate, the solvent is distilled away under a reduced environment, whereby 17.9 g of the following DAA-2 is obtained by recrystallization from hexane.

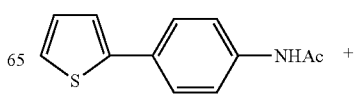

-continued

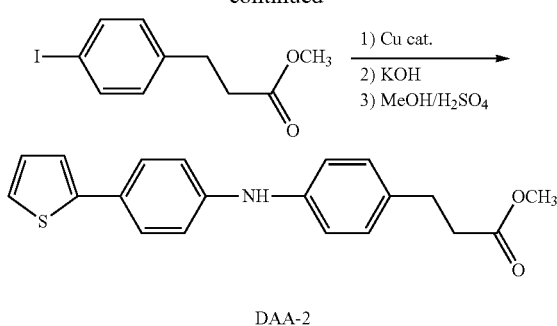

DAA-2

Next, a mixed solution of iodobenzene (3.6 g), DAA-2 (5.0 g), copper (II) sulfate pentahydrate (0.2 g), potassium carbonate (1.3 g) and tridecane (15 ml) is stirred at 210° C. for 15 hours under a nitrogen environment.

After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours.

After cooling, the resulting substance is filtered with celite by adding toluene, and the product obtained by distilling away the toluene is separated by silica gel column chromate (hexane:toluene=2:1), whereby 3.2 g of formylated TAA-2 is obtained.

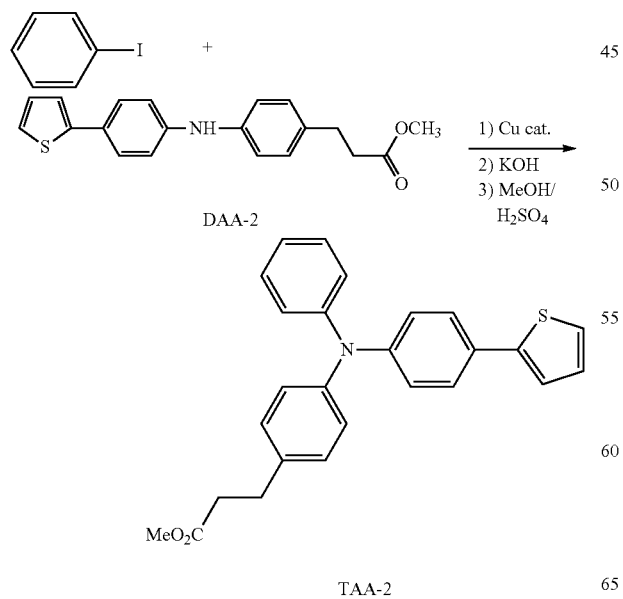

TAA-2

The TAA-2 (3.0 g) is dissolved in N,N-dimethylformamide (5 ml), and the droplets of phosphorus oxychloride are dropped. After the resulting substance is stirred at room temperature (25° C.) for 4 hours, anhydrous N,N-dimethyl formamide (3 ml) is additionally injected, and, furthermore, magnetically stirred for 13.5 hours. After the completion of the reaction, water (100 ml) and ethyl acetate (100 ml) are added and stirred, an organic phase is separated, the organic phase is washed with 50 ml of saturated saline and dried with sodium sulfate. The crude product obtained by distilling away the solvent is separated by silica gel column chromatography (ethyl acetate:hexane=1:4), whereby 2.5 g of formylated TAA-2 is obtained.

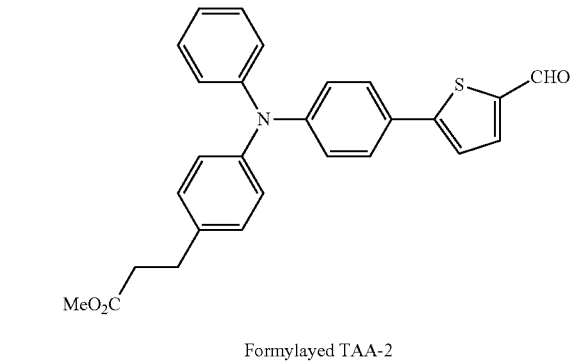

TAA-2

Formylayed TAA-2

The formylated TAA-2 (2.2 g) and 2,5-diamino-1,4-bensodithiol (0.37 g) are dissolved in N,N-dimethyl formaldehyde (15 ml) and refluxed for 24 hours. A solid obtained by distilling N,N-dimethyl formaldehyde under a reduced pressure is soxhlet-extracted (for 6 hours) with hexane so as to remove impurities. The obtained crude crystals are separated by silica gel column chromatography (toluene), and recrystallized from toluene, whereby 0.45 g of a monomer compound (A-23) is obtained.

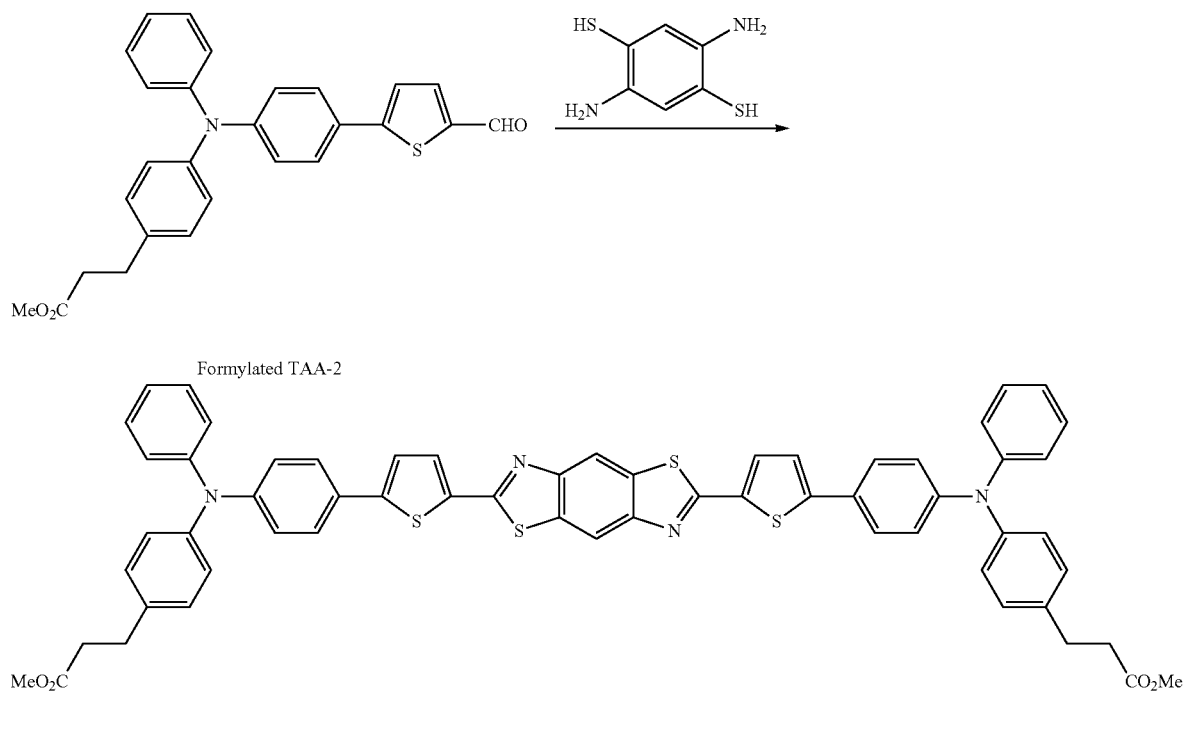

Monomer Compound (A-23)

0.5 g of the obtained monomer compound (A-23) is put into a 50 ml three neck recovery flask together with 10 ml of ethylene glycol and 0.01 g of titanium tetrabutoxide, heated and stirred under a nitrogen environment at 200° C. for 5 hours.

After confirming by TLC that the monomer compound (A-23) which is a raw material, reacts and disappears, the resulting substance is heated to 210° C. at a pressure reduced to 50 Pa while ethylene glycol is distilled away, and the reaction continues for 6 hours.

After that, the resulting substance is cooled to room temperature (25° C.), and dissolved in 50 ml of tetrahydrofuran. The insoluble substance is filtered with a 0.5 polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.3 g of a polymer [the Exemplary Compound (A-23)] is obtained.

As a result of measuring the molecular weight of the polymer using gel permeation chromatography (GPC) (manufactured by Tosoh Corporation, HLC-8120GPC), the weight-average molecular weight Mw=$8.4 \times 10^4$ (styrene conversion), Mw/Mn=1.98, and the degree of polymerization p obtained from the molecular weight of the low-molecular compound (the monomer compound), which is a raw material, is 83.

Synthesis Example 1-3

Synthesis of Exemplary Compound (A-10)

4-methylacetanilide (21.0 g), 4-iodo phenyl propionic acid methyl (64.4 g), potassium carbonate (38.3 g), copper sulfate pentahydrate (2.3 g), and n-tridecane (50 ml) are put into a 500 ml three neck flask, heated and stirred under a stream of nitrogen at 230° C. for 20 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.) The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. After the reaction, the product is extracted with toluene, and an organic phase is washed with pure water. Next, after the organic phase is dried with anhydrous sodium sulfate, the solvent is distilled away under a reduced pressure, whereby 34.1 g of the following DAA-3 is obtained by recrystallization from hexane.

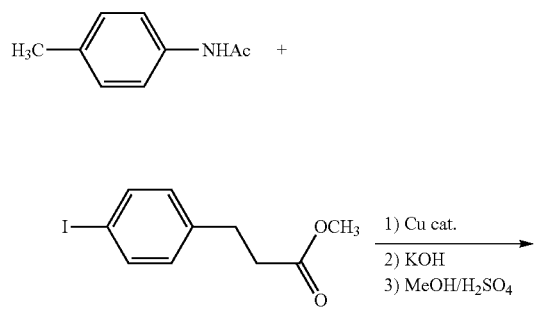

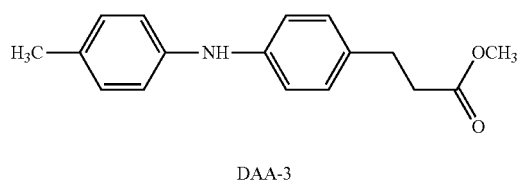

DAA-3

Next, a mixed solution of iodobenzene (4.8 g), the above DAA-3 (5.0 g), copper (II) sulfate pentahydrate (0.2 g), potassium carbonate (1.3 g) and tridecane (10 ml) is stirred at 210° C. for 7 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. The resulting substance is cooled to room temperature (25° C.), and is filtered with celite by adding toluene. An organic phase is washed with pure water and extracted, and the product obtained by distilling away the organic solvent is separated by silica gel column chromate (hexane 4:toluene 1), whereby 3.1 g of the following TAA-3 is obtained.

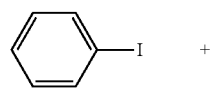

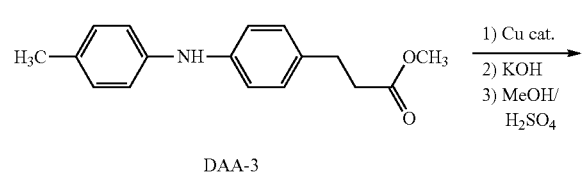

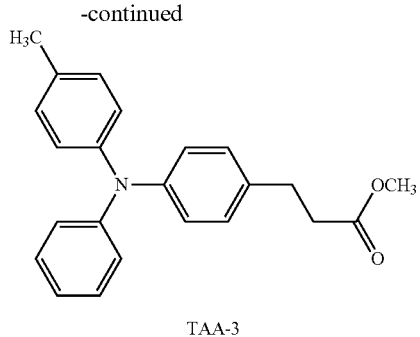

TAA-3

A mixed solution of the TAA-3 (3.0 g) and N,N-dimethylformamide (100 ml) is put into a 500 ml three neck flask, the droplets of phosphorus oxychloride (1.7 g) are dropped, the resulting substance is heated to 80° C. and stirred for 7 hours.

After cooling, pure water is added to the reaction solution, and the precipitated crystals are taken by suction filtration, whereby 2.7 g of formylated TAA-3 is obtained.

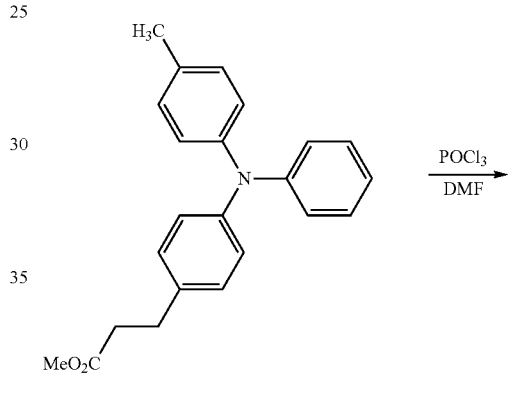

TAA-3

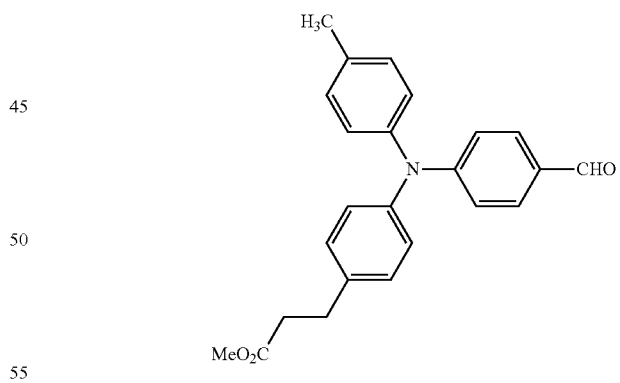

Formylated TAA-3

The formylated TAA-3 (2.0 g) and 2,5-diamino-1,4-bensodithiol (0.69 g) are dissolved in m-xylene (10 ml) and refluxed for 20 hours under a nitrogen environment. After cooling, 30 ml of tetrahydrofuran (THF) is added, and the reaction solution is filtered. The filtered reaction solution is purified by column chromatography (toluene:ethyl acetate=5:1), whereby 0.7 g of a monomer compound (A-5) is obtained.

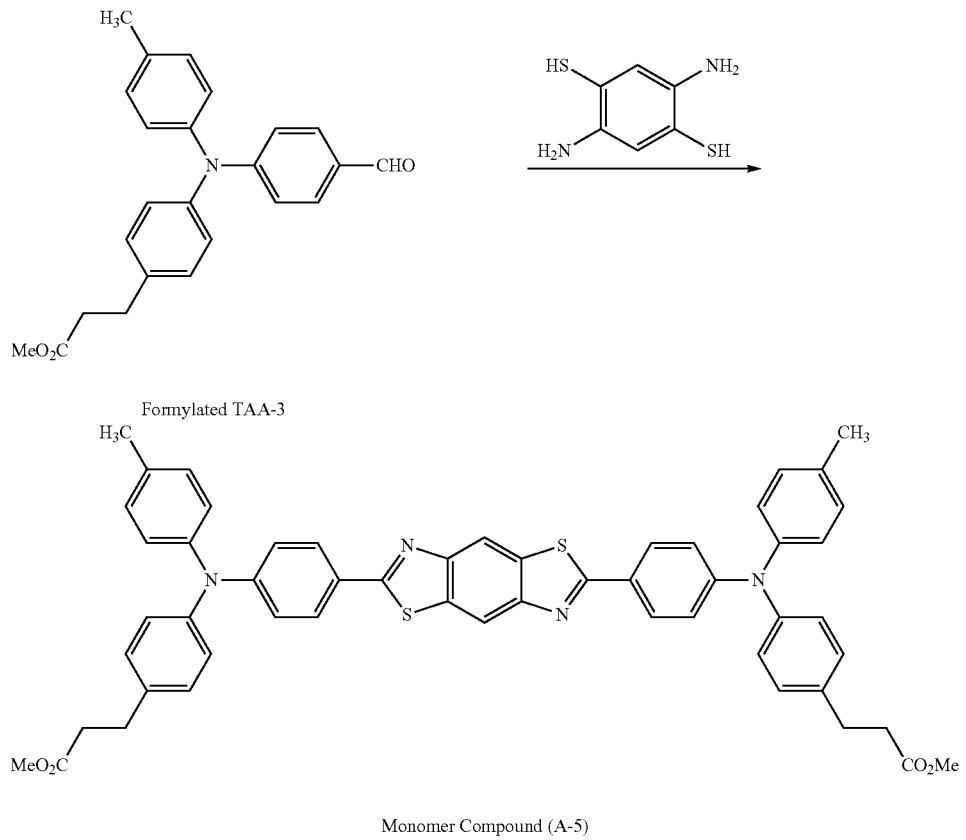

Monomer Compound (A-5)

0.5 g of the obtained monomer compound (A-5) is put into a 50 ml three neck recovery flask together with 10 ml of ethylene glycol and 0.01 g of titanium tetrabutoxide, heated and stirred under a nitrogen environment at 200° C. for 5 hours.

After confirming by TLC that the monomer compound (A-5), which is a raw material, reacts and disappears, the resulting substance is heated to 210° C. at a pressure reduced to 50 Pa while ethylene glycol is distilled away, and the reaction continues for 6 hours.

After that, the resulting substance is cooled to room temperature (25° C.), and dissolved in 50 ml of tetrahydrofuran. The insoluble substance is filtered with a 0.5 polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.4 g of a polymer [the Exemplary Compound (A-10)] is obtained.

As a result of measuring the molecular weight of the polymer using gel permeation chromatography (GPC) (manufactured by Tosoh Corporation, HLC-8120GPC), the weight-average molecular weight $Mw=7.0 \times 10^4$ (styrene conversion), $Mw/Mn=1.95$, and the degree of polymerization p obtained from the molecular weight of the low-molecular compound (the monomer compound), which is a raw material, is 80.

Synthesis Example 1-4

Synthesis of Exemplary Compound (A-18)

1-aceteamide naphthalene (25.0 g), 4-iodo phenyl propionic acid methyl (64.4 g), potassium carbonate (38.3 g), copper sulfate pentahydrate (2.3 g), and n-tridecane (50 ml) are put into a 500 ml three neck flask, heated and stirred under a stream of nitrogen at 230° C. for 20 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature. The reaction solution is poured into one liter of distilled water and neutralized by hydrochloric acid so that crystals are precipitated. The crystals are taken by suction filtration, washed sufficiently with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. After the reaction, the product is extracted with toluene, and an organic phase is washed sufficiently with pure water. Next, after the organic phase is dried with anhydrous sodium sulfate, the solvent is distilled away under a reduced pressure, whereby 36.5 g of DAA-4 is obtained by recrystallization from hexane.

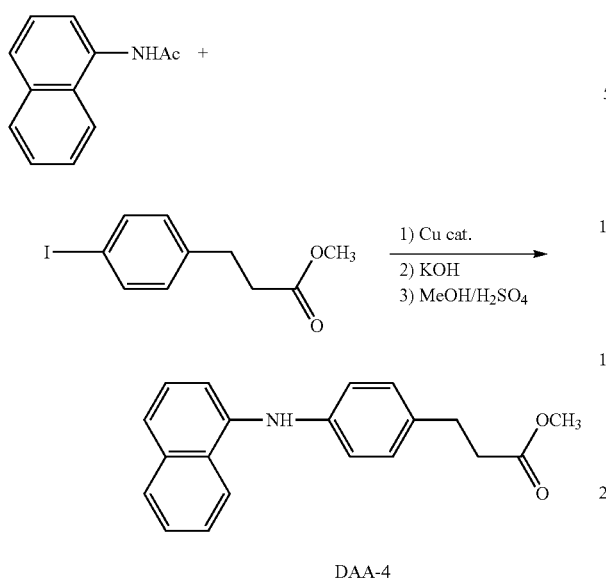

DAA-4

Next, a mixed solution of iodobenzene (4.8 g), the above DAA-4 (5.0 g), copper (II) sulfate pentahydrate (0.2 g), potassium carbonate (1.3 g) and tridecane (10 ml) is stirred at 210° C. for 7 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. The resulting substance is cooled to room temperature (25° C.), and is filtered with celite by adding toluene. An organic phase is washed with pure water and extracted, and the product obtained by distilling away the organic solvent is separated by silica gel column chromate (hexane 4:toluene 1), whereby 3.9 g of the following TAA-4 is obtained.

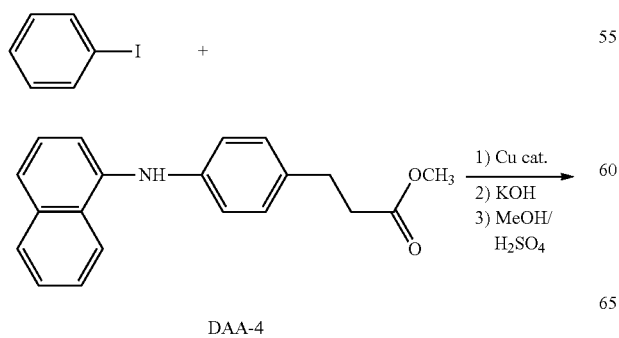

DAA-4

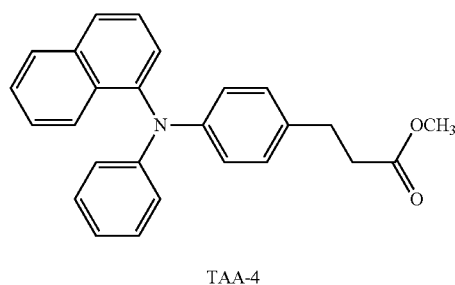

TAA-4

A mixed solution of the TAA-4 (3.0 g) and N,N-dimethylformamide (100 ml) is put into a 500 ml three neck flask, the droplets of phosphorus oxychloride (1.7 g) are dropped, the resulting substance is heated to 80° C. and stirred for 7 hours.

After cooling, the reaction solution is added to pure water, and the precipitated crystals are taken by suction filtration, whereby 2.4 g of formylated TAA-4 is obtained.

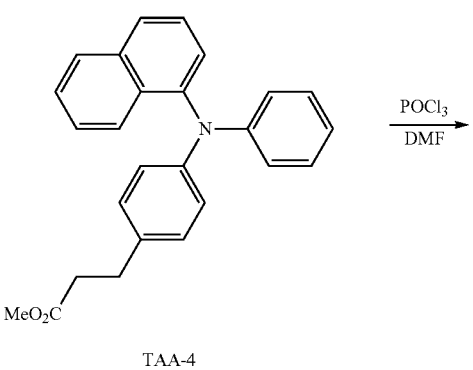

TAA-4

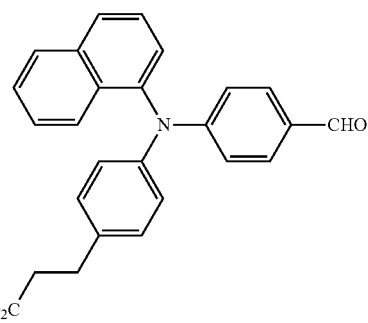

Formylated TAA-4

The formylated TAA-4 (2.2 g) and 2,5-diamino-1,4-bensodithiol (0.7 g) are dissolved in m-xylene (10 ml) and refluxed for 28 hours under a nitrogen environment. After cooling, 30 ml of tetrahydrofuran (THF) is added, and the reaction solution is filtered. The filtered reaction solution is purified by column chromatography (toluene), whereby 0.7 g of a monomer compound (A-14) is obtained.

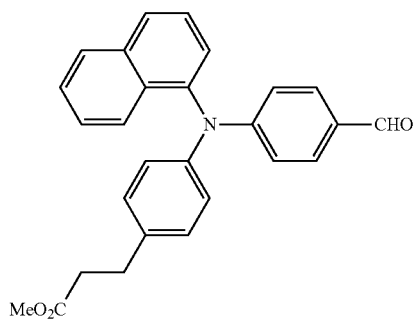

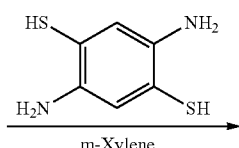

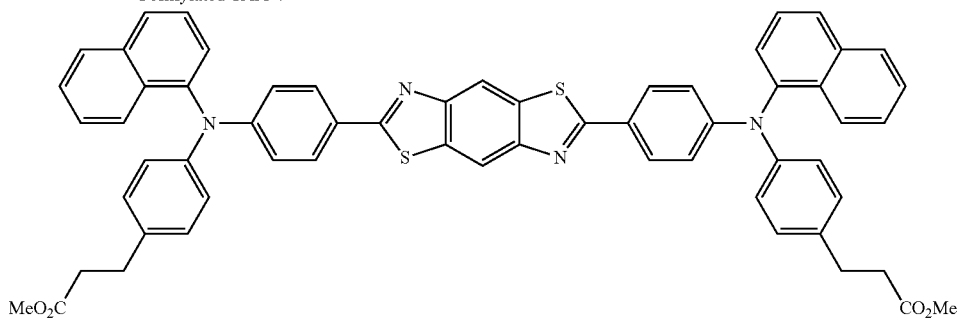

Monomer Compound (A-14)

1.0 g of the obtained monomer compound (A-14) is put into a 50 ml three neck recovery flask together with 10 ml of ethylene glycol and 0.02 g of titanium tetrabutoxide, heated and stirred under a nitrogen environment at 200° C. for 5 hours.

After confirming by TLC that the monomer compound (A-14), which is a raw material, reacts and disappears, the resulting substance is heated to 210° C. at a pressure reduced to 50 Pa while ethylene glycol is distilled away, and the reaction continues for 6 hours.

After that, the resulting substance is cooled to room temperature (25° C.), and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.5 g of a polymer [the Exemplary Compound (A-18)] is obtained.

As a result of measuring the molecular weight of the polymer using gel permeation chromatography (GPC) (manufactured by Tosoh Corporation, HLC-8120GPC), the weight-average molecular weight $Mw=5.2\times10^4$ (styrene conversion), $Mw/Mn=1.95$, and the degree of polymerization p obtained from the molecular weight of the low-molecular compound (the monomer compound), which is a raw material, is 55.

Synthesis Example 1-5

Synthesis of Exemplary Compound (A-26)

4-(2-thienyl)acetylaniline (30.0 g), 4-iodo phenyl propionic acid methyl (28.5 g), potassium carbonate (13.6 g), copper sulfate pentahydrate (2.0 g), and 1,2-dichlorobenzene (50 ml) are put into a 500 ml three neck flask, heated and stirred under a stream of nitrogen at 230° C. for 20 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. After the reaction, the product is extracted with toluene, and an organic phase is washed with pure water. Next, after the organic phase is dried with anhydrous sodium sulfate, the solvent is distilled away under a reduced pressure, whereby 17.9 g of DAA-2 is obtained by recrystallization from hexane.

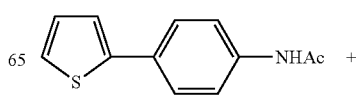

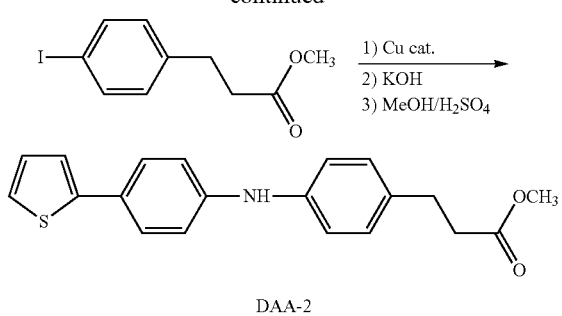

DAA-2

Next, a mixed solution of 3-methyliodobenzene (4.0 g), DAA-2 (5.0 g), copper (11) sulfate pentahydrate (0.2 g), potassium carbonate (1.3 g) and tridecane (15 ml) is stirred at 210° C. for 15 hours under a nitrogen environment.

After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours.

After cooling, the resulting substance is filtered with celite by adding toluene, and the product obtained by distilling away toluene is separated by silica gel column chromate (hexane 2:toluene 1), whereby 3.0 g of TAA-5 is obtained.

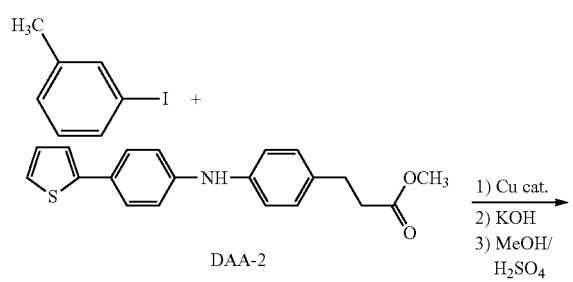

DAA-2

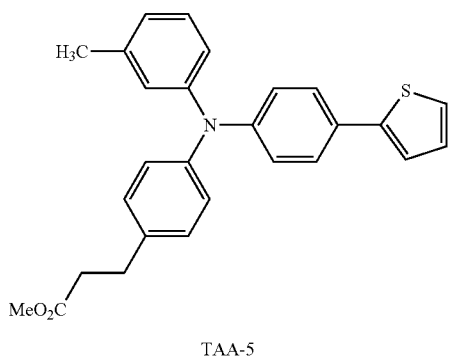

TAA-5

The TAA-5 (3.0 g) is dissolved in N,N-dimethylformamide (5 ml), and the droplets of phosphorus oxychloride are dropped. After the resulting substance is stirred at room temperature (25° C.) for 4 hours, anhydrous N,N-dimethyl formamide (3 ml) is additionally injected, and, furthermore, magnetically stirred for 13.5 hours. After the completion of the reaction, water (100 ml) and ethyl acetate (100 ml) are put and stirred, an organic phase is separated, the organic phase is washed with 50 ml of saturated saline and dried with sodium sulfate. The crude product obtained by distilling away the solvent is separated by silica gel column chromatography (ethyl acetate:hexane=1:4), whereby 2.5 g of formylated TAA-5 is obtained.

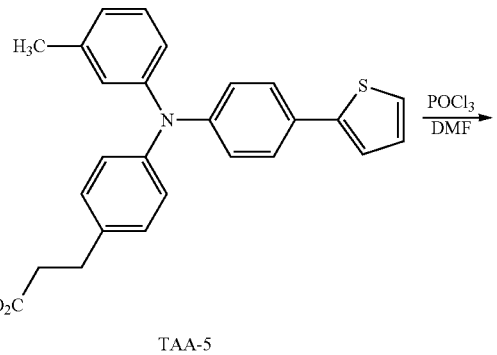

TAA-5

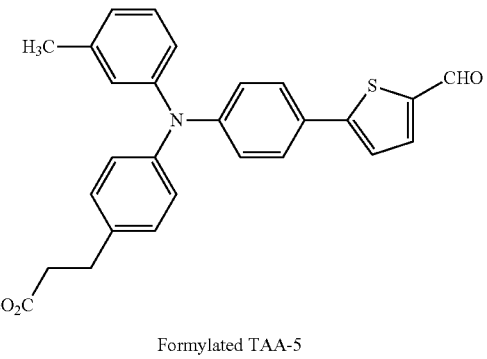

Formylated TAA-5

The formylated TAA-5 (2.5 g) and 2,5-diamino-1,4-bensodithiol (0.7 g) are dissolved in N,N-dimethyl formaldehyde (15 ml) and refluxed for 30 hours. A solid obtained by distilling N,N-dimethyl formaldehyde under a reduced pressure is soxhlet-extracted (for 5 hours) with hexane 30 as to remove impurities. The obtained crude crystals are separated by silica gel column chromatography (toluene), and recrystallized from toluene, whereby 0.6 g of a monomer compound (A-25) is obtained.

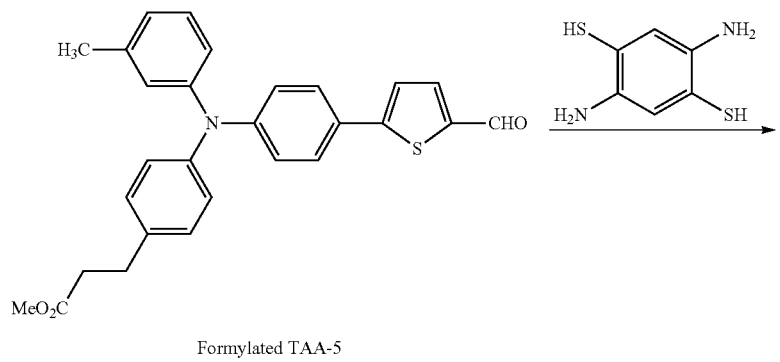

Formylated TAA-5

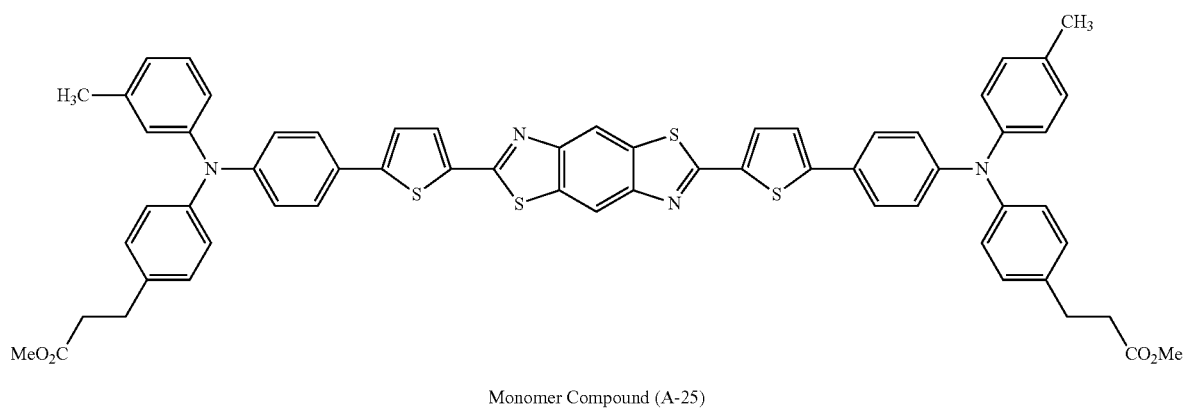

Monomer Compound (A-25)

0.5 g of the obtained monomer compound (A-25) is put into a 50 ml three neck recovery flask together with 10 ml of ethylene glycol and 0.01 g of titanium tetrabutoxide, heated and stirred under a nitrogen environment at 200° C. for 5 hours.

After confirming by TLC that the monomer compound (A-25), which is a raw material, reacts and disappears, the resulting substance is heated to 210° C. at a pressure reduced to 50 Pa while ethylene glycol is distilled away, and the reaction continues for 6 hours.

After that, the resulting substance is cooled to room temperature (25° C.), and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.5 g of a polymer [the Exemplary Compound (A-26)] is obtained.

As a result of measuring the molecular weight of the polymer using gel permeation chromatography (GPC) (manufactured by Tosoh Corporation, HLC-8120GPC), the weight-average molecular weight Mw=6.3×10$^4$ (styrene conversion), Mw/Mn=2.05, and the degree of polymerization p obtained from the molecular weight of the low-molecular compound (the monomer compound), which is a raw material, is 61.

Synthesis Example 1-6

Synthesis of Exemplary Compound (A-14)

A mixed solution of 4-iodophenyl (6.6 g), DAA-1 (5.0 g), copper (II) sulfate pentahydrate (0.2 g), potassium carbonate (1.3 g) and tridecane (10 ml) is stirred at 210° C. for 7 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. After the resulting substance is cooled to room temperature, the resulting substance is filtered with celite by adding toluene. An organic phase is washed with pure water and extracted, and the product obtained by distilling away the organic solvent is separated by silica gel column chromate (hexane 4:toluene 1), whereby 4.5 g of TAA-6 is obtained.

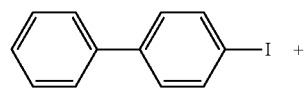
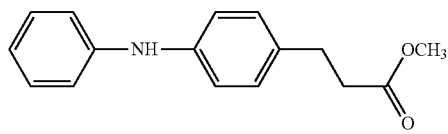

A mixed solution of the TAA-6 (4.0 g) and N,N-dimethylformamide (100 ml) is put into a 500 ml three neck flask, the droplets of phosphorus oxychloride (2.4 g) are dropped, heated to 80° C. and stirred for 8 hours.

After cooling, the reaction solution is added to pure water, and the precipitated crystals are taken by suction filtration, whereby 2.8 g of formylated TAA-6 is obtained.

The formylated TAA-6 (2.0 g) and 2,5-diamino-1,4-benzodithiol (0.7 g) are dissolved in m-xylene (10 ml) and refluxed for 15 hours under a nitrogen environment. After cooling, THF is added, and the reaction solution is filtered.

The filtered reaction solution is purified by column chromatography (toluene:ethyl acetate=5:1), whereby 0.6 g of a monomer compound (A-10) is obtained.

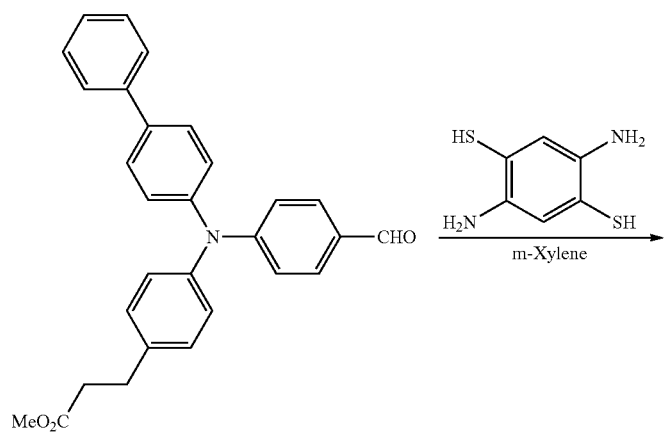

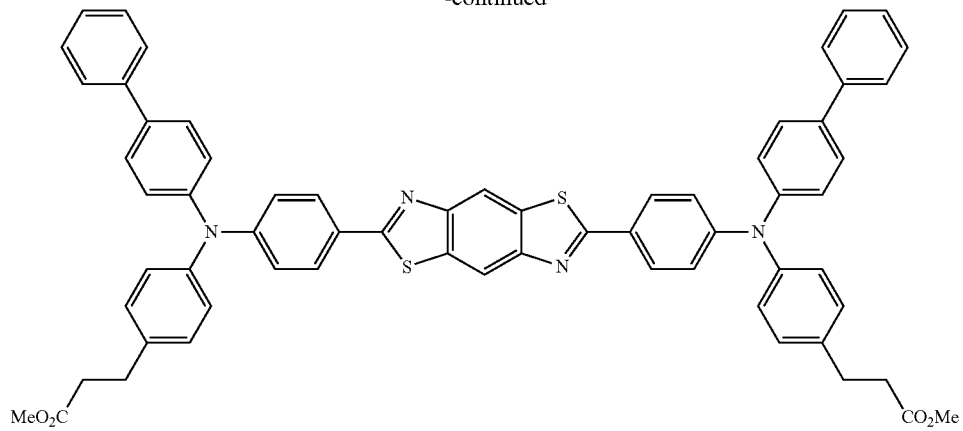

Monomer Compound (A-10)

0.6 g of the obtained monomer compound (A-10) is put into a 50 ml three neck recovery flask together with 10 ml of ethylene glycol and 0.01 g of titanium tetrabutoxide, heated and stirred under a nitrogen environment at 200° C. for 5 hours.

After confirming by TLC that the monomer compound (A-10), which is a raw material, reacts and disappears, the resulting substance is heated to 210° C. at a pressure reduced to 50 Pa while ethylene glycol is distilled away, and the reaction continues for 6 hours. After that, the resulting substance is cooled to room temperature, and dissolved in 50 ml of tetrahydrofuran. The insoluble substance is filtered with a 0.5 µl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated. After the obtained polymer is filtered and sufficiently washed with methanol, the polymer is vacuum-dried for 16 hours at 60° C., whereby 0.4 g of a polymer [the exemplary polymer (A-14)] is obtained.

As a result of measuring the molecular weight of the polymer using gel permeation chromatography (GPC) (manufactured by Tosoh Corporation, HLC-8120GPC), the weight-average molecular weight Mw=7.5×10$^4$ (styrene conversion), Mw/Mn=2.08, and the degree of polymerization p obtained from the molecular weight of the monomer is 74.

Synthesis Example 1-7

Synthesis of Exemplary Compound (A-17)

Next, a mixed solution of bromoiodobenzene (6.6 g), DAA-1 (5.0 g), copper (II) sulfate pentahydrate (0.2 g), potassium carbonate (1.3 g) and tridecane (10 ml) is stirred at 210° C. for 7 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. The resulting substance is cooled to room temperature, and is filtered with celite by adding toluene. An organic phase is washed with pure water and extracted, and the product obtained by distilling away the organic solvent is separated by silica gel column chromate (hexane 4:toluene 1), whereby 4.3 g of TAA-7 is obtained.

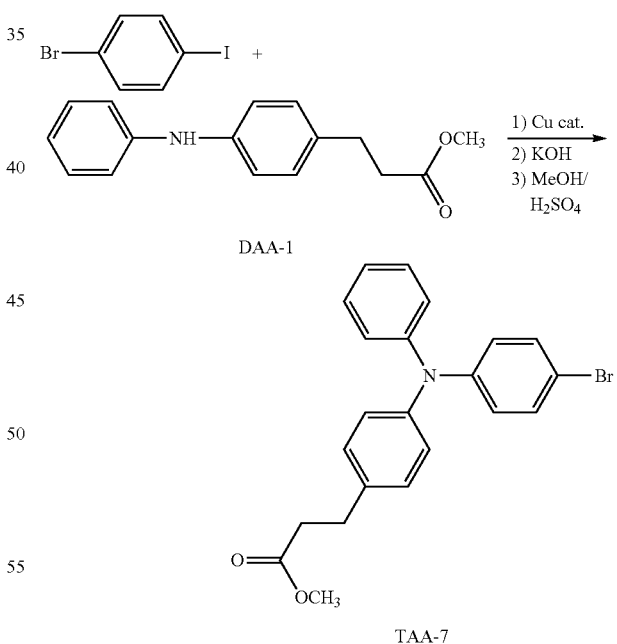

A mixed solution of the TAA-7 (3.0 g) and N,N-dimethylformamide (100 ml) is put into a 500 ml three neck flask, the droplets of phosphorus oxychloride (2.3 g) are dropped, the resulting substance is heated to 80° C. and stirred for 7 hours.

After cooling, pure water is added to the reaction solution, and the precipitated crystals are taken by suction filtration, 2.5 g of formylated TAA-7 is obtained.

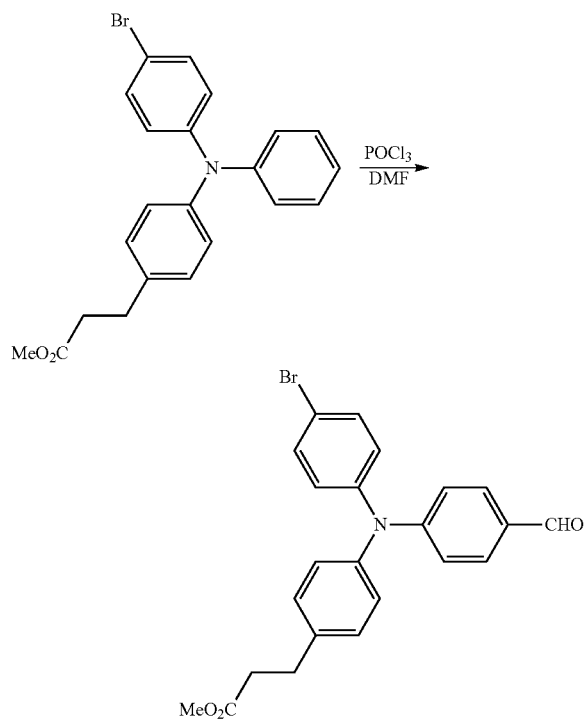

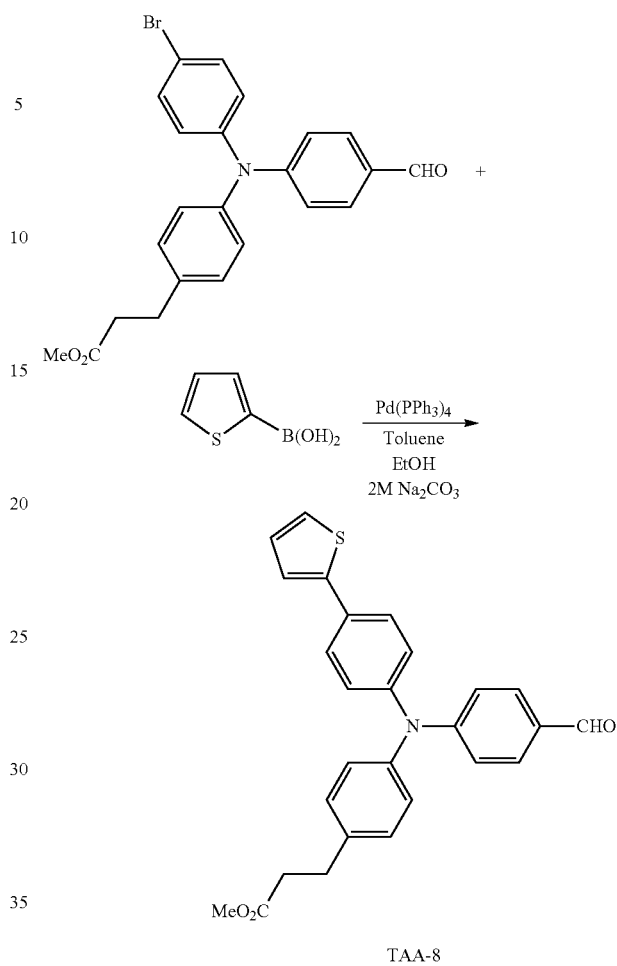

TAA-8

Tetrakis(triphenylphosphine)palladium (0.42 g) is dissolved in toluene (12 ml) in conjunction with magnetic stirring under a nitrogen environment. The formylated TAA-7 (5.0 g) an aqueous solution of 2 M sodium hydrocarbon (6 ml), and a solution of thiophen-2-boronic acid (1.9 g)/ethanol (3 ml) are sequentially added. After that, the mixture is stirred and refluxed for 4 hours. After the completion of the reaction, the mixture is cooled to room temperature and divided into a water layer and a toluene layer, and the toluene layer is washed with a saturated saline (about 25 ml, three times). Toluene is distilled under a reduced pressure, thereby obtaining a crude product. The crude product is dissolved in a small amount of toluene, silica gel coating column (only hexane, inner diameter 4 cm, height 28 cm) is carried out, and the solvent is distilled away by a rotary evaporator under a reduced pressure, whereby 1.3 g of TAA-8 is obtained.

TAA-8 (1.2 g), 2,5-diamino-1,4-bensodithiol (0.5 g), and m-xylene (10 ml) are refluxed for 15 hours under a nitrogen environment. After cooling, THF is added, and the reaction solution is filtered.

The filtered reaction solution is purified by column chromatography (toluene:ethyl acetate=5:1), whereby 0.5 g of a monomer compound (A-13) is obtained.

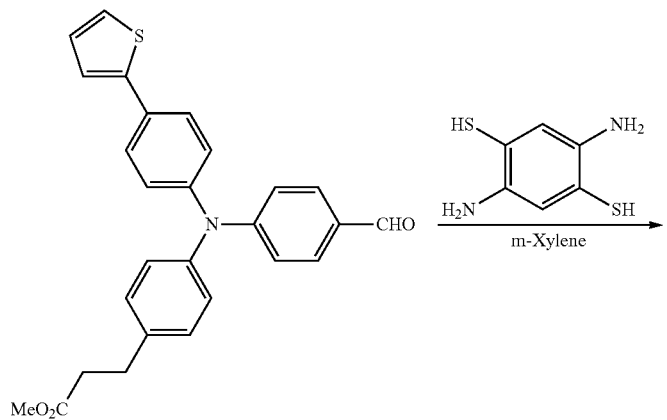

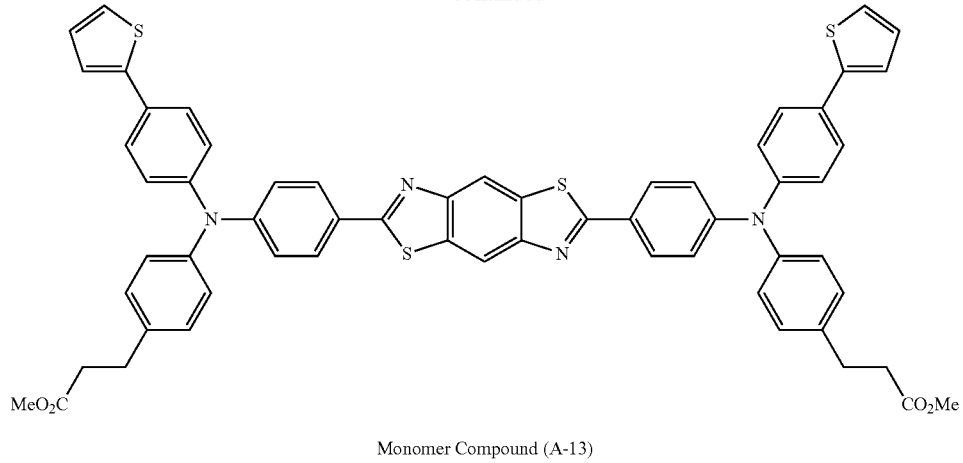

Monomer Compound (A-13)

0.5 g of the obtained monomer compound (A-13) is put into a 50 ml three neck recovery flask together with 10 ml of ethylene glycol and 0.01 g of titanium tetrabutoxide, heated and stirred under a nitrogen environment at 200° C. for 5 hours.

After confirming by TLC that the monomer compound (A-13), which is a raw material, reacts and disappears, the resulting substance is heated to 210° C. at a pressure reduced to 50 Pa while ethylene glycol is distilled away, and the reaction continues for 6 hours. After that, the resulting substance is cooled to room temperature, and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated. After the obtained polymer is filtered and washed with methanol, the polymer is vacuum-dried for 16 hours at 60° C., whereby 0.3 g of a polymer [the exemplary polymer (A-17)] is obtained.

As a result of measuring the molecular weight of the polymer using gel permeation chromatography (GPC) (manufactured by Tosoh Corporation, HLC-8120GPC), the weight-average molecular weight Mw=$6.8 \times 10^4$ (styrene conversion), Mw/Mn=2.11, and the degree of polymerization p obtained from the molecular weight of the monomer is 66.

Example 1-1

ITO (manufactured by Sanyo Vacuum Industries Co., Ltd.) formed on a transparent insulating substrate is patterned by photolithography using a strip photo mask, and, furthermore, subjected to an etching treatment, thereby forming a strip ITO electrode (width 2 mm). Next, the ITO glass substrate is washed by adding an ultrasonic wave of each of a neutral detergent, ultrapure water, acetone (for electronic engineering, manufactured by Kanto Chemical Co., Inc.) and isopropanol (for electronic engineering, manufactured by Kanto Chemical Co., Inc.) for 5 minutes, and then dried with a spin coater.

A 5% by mass monochlorobenzene solution of the charge-transporting polyester [the Exemplary Compound (A-6)] is prepared as a hole-transporting layer and filtered using a 0.1 μm PTFE filter, and a 0.050 μm-thick thin film is formed on the substrate by the dip method. The Exemplary Compound (XV-1) is deposited as a light-emitting material so as to form a 0.055 μm-thick light-emitting layer. Subsequently, a metallic mask provided with strip holes is installed, 0.0001 μm of LiF is deposited, subsequently, 0.150 μm of Al is deposited, thereby forming a 2 mm-wide and 0.15 μm-thick rear surface electrode to intersect with the ITO electrode. The effective area of the formed organic electroluminescence element is 0.04 $cm^2$.

Example 1-2

A 10% by mass dichloroethane solution of one part by mass of the charge-transporting polyester [the Exemplary Compound (A-23)], 4 parts by mass of poly(N-vinyl carbazole) and 0.02 parts by mass of the Exemplary Compound (XV-1) is prepared and filtered using a 0.1 μm PTFE filter. A 0.15 μm-thick thin film is formed on a glass substrate on which a strip ITO electrode is etched, washed and dried according to Example 1-1 by the spin coater method using the solution. After the thin film is sufficiently dried, a metallic mask provided with strip holes is installed, 0.0001 μm of LiF is deposited, subsequently, 0.150 μm of Al is deposited, thereby forming a 2 mm-wide and 0.15 μm-thick rear surface electrode to intersect with the ITO electrode. The effective area of the formed organic electroluminescence element is 0.04 $cm^2$.

Example 1-3

According to Example 1-1, a 0.050 μm-thick hole-transporting layer is formed on the ITO glass substrate which is etched, washed and dried according to Example 1-1 using the charge-transporting polyester [the Exemplary Compound (A-10)]. Next, a 0.065 μm-thick layer is formed as a light-emitting layer using a mixture (mass ratio: 99/1) of the Exemplary Compound (XV-1) and the Exemplary Compound (XVI-1), and a 0.030 μm-thick layer is formed as an electron-transporting layer using the Exemplary Compound (XV-9). After the thin layers are sufficiently dried, a metallic mask provided with strip holes is installed, 0.0001 μm of LiF is deposited, subsequently, 0.150 μm of Al is deposited, thereby forming a 2 mm-wide and 0.15 μm-thick rear surface electrode to intersect with the ITO electrode. The effective area of the formed organic electroluminescence element is 0.04 $cm^2$.

Example 1-4

According to Example 1-1, a 0.050 μm-thick layer is formed as a hole-transporting layer by the ink jet method (the piezo ink jet method) on an ITO glass substrate which is etched and washed according to Example 1-1 using the charge-transporting polyester [the Exemplary Compound (A-18)]. Next, a 0.065 μm-thick layer of the Exemplary Compound (XV-16, n=8, g=185) including 5% by mass of the Exemplary Compound (XVI-5) (that is, a layer including 5% by mass of the Exemplary Compound (XVI-5) and 95% by mass of the Exemplary Compound XV-16) is formed as a light-emitting layer by the spin coater method. After the thin layer is sufficiently dried, 0.08 μm-thick Ca and 0.15 μm-thick Al are deposited, and a 2 mm-wide and totally 0.23 μm-thick rear surface electrode is formed so as to intersect with the ITO electrode. The effective area of the formed organic electroluminescence element is 0.04 cm$^2$.

Example 1-5

An organic electroluminescence element is manufactured according to Example 1-2 except that the charge-transporting polyester [the Exemplary Compound (A-6)] is used instead of the charge-transporting polyester [the Exemplary Compound (A-23)] that is used in Example 1-2.

Example 1-6

An organic electroluminescence element is manufactured according to Example 1-2 except that the charge-transporting polyester [the Exemplary Compound (A-26)] is used instead of the charge-transporting polyester [the Exemplary Compound (A-23)] that is used in Example 1-2.

Example 1-7

A 1.5% by mass dichloroethane solution of the charge-transporting polyester [the Exemplary Compound (A-6)] is prepared and filtered using a 0.1 μm PTFE filter. A 0.05 μm-thick thin film is formed on the ITO glass substrate which is etched, washed and dried according to Example 1-1 by the ink jet method using the solution. Next, a 0.050 μm-thick light-emitting layer (a layer including 5% by mass of the Exemplary Compound (XVI-5) and 95% by mass of the Exemplary Compound XV-16) is formed by the spin coat method using the Exemplary Compound (XV-16, n=8, g=185) including 5% by mass of the Exemplary Compound (XVI-5) as a light-emitting material. After the thin layer is sufficiently dried, 0.08 μm-thick Ca and 0.15 μm-thick Al are deposited, and a 2 mm-wide and totally 0.23 μm-thick rear surface electrode is formed so as to intersect with the ITO electrode. The effective area of the formed organic electroluminescence element is 0.04 cm$^2$.

Example 1-8

A 0.050 μm-thick layer of the Exemplary Compound (XV-16, n=8, g=185) is formed on the ITO glass substrate which is etched, washed and dried according to Example 1-1 as a light-emitting layer. A 1.5% by mass dichloroethane solution of the charge-transporting polyester [the Exemplary Compound (A-6)] is prepared and filtered using a 0.1 μm PTFE filter. A 0.015 μm-thick electron-transporting layer is formed on the light-emitting layer by the spin coater method using the solution. After the layer is sufficiently dried, using a metallic mask provided with strip holes, 0.0001 μm of LiF is deposited, and, subsequently, 0.150 μm of Al is deposited, thereby forming a 2 mm-wide and 0.15 μm-thick rear surface electrode to intersect with the ITO electrode. The effective area of the formed organic electroluminescence element is 0.04 cm$^2$.

Example 1-9

An organic electroluminescence element is manufactured according to Example 1-1 except that the charge-transporting polyester [the Exemplary Compound (A-14)] is used instead of the charge-transporting polyester [the Exemplary Compound (A-6)] that is used in Example 1-1.

Example 1-10

An organic electroluminescence element is manufactured according to Example 1-1 except that the charge-transporting polyester [the Exemplary Compound (A-17)] is used instead of the charge-transporting polyester [the Exemplary Compound (A-6)] that is used in Example 1-1.

Comparative Example 1-1

An organic EL element is manufactured according to Example 1-1 except that the compound represented by the following structural formula (XVII) is used instead of the charge-transporting polyester [the Exemplary Compound (A-6)] that is used in Example 1-1.

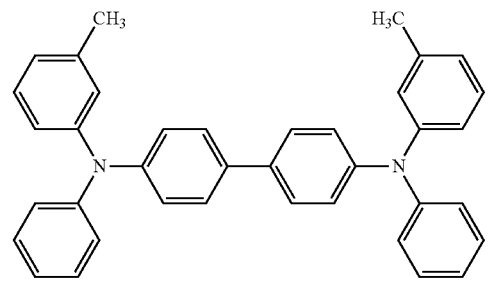

(XVII)

Comparative Example 1-2

A 10% by mass dichloroethane solution is prepared by mixing 2 parts by mass of polyvinyl carbazole (PVK) as a charge-transporting polymer, 0.1 parts by mass of the Exemplary Compound (XV-1) as a light-emitting material, and one part by mass of the compound (XV-9) as an electron-transporting material, and filtered using a 0.1 μm PTFE filter. This solution is coated by the dip method so as to form a 0.015 μm-thick hole-transporting layer on a glass substrate on which a 2 mm-wide strip ITO electrode is formed by etching. After the layer is sufficiently dried, using a metallic mask provided with strip holes, 0.0001 μm of LiF is deposited, and, subsequently, 0.150 μm of Al is deposited, thereby forming a 2 mm-wide and 0.15 μm-thick rear surface electrode to intersect with the ITO electrode. The effective area of the formed organic electroluminescence element is 0.04 cm$^2$.

Comparative Example 1-3

A 10% by mass dichloroethane solution is prepared by mixing 2 parts by mass of a compound (end group: H) having the structure represented by the following structural formula (XVIII) as a charge-transporting polymer, 0.1 parts by mass of the Exemplary Compound (XV-1) as a light-emitting material, and one part by mass of the compound (XV-9) as an electron-transporting material, and filtered using a 0.1 μm PTFE filter. This solution is coated by the dip method so as to form a 0.15 μm-thick hole-transporting layer on a glass substrate on which a 2 mm-wide strip ITO electrode is formed by etching. After the layer is sufficiently dried, using a metallic mask provided with strip holes, 0.0001 μm of LiF is deposited, subsequently, 0.150 μm of Al is deposited, thereby forming a 2 mm-wide and 0.15 μm—thick rear surface electrode to intersect with the ITO electrode. The effective area of the formed organic electroluminescence element is 0.04 cm$^2$.

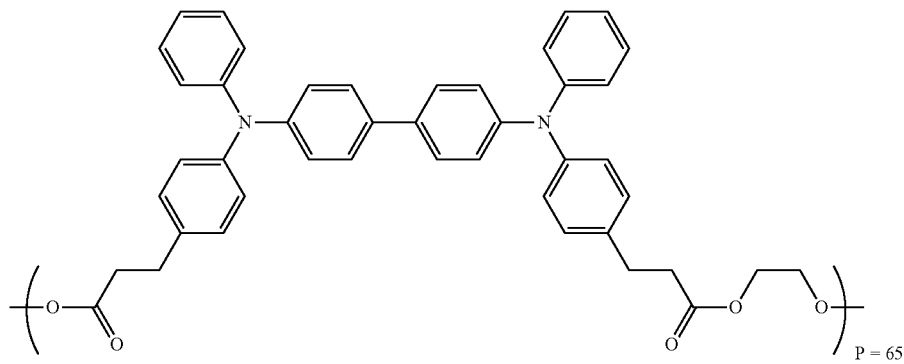

(XVIII)

Comparative Example 1-4

An organic EL element is manufactured according to Example 1-1 except that a compound having the structure represented by the following structural formula (XIX) (weight-average molecular weight: $5.1 \times 10^4$, end group: H) is used instead of the charge-transporting polyester [the Exemplary Compound (A-6)] that is used in Example 1-1.

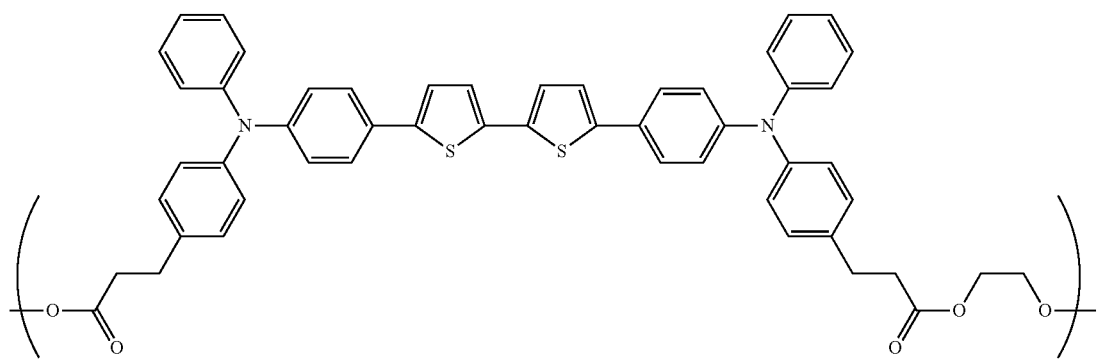

(XIX)

Comparative Example 1-5

An organic EL element is manufactured according to Example 1-1 except that a compound having the structure represented by the following structural formula (XX) (weight-average molecular weight: $3.9 \times 10^4$, end group: H) is used instead of the charge-transporting polyester [the Exemplary Compound (A-6)] that is used in Example 1-1.

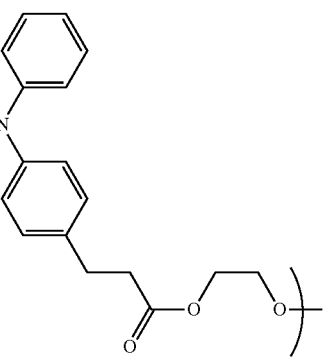

(XX)

Measurement of the organic EL elements manufactured in the above ways is carried out by applying a direct voltage in dried nitrogen with the ITO electrode side used as plus and the rear surface electrode used as minus.

The light-emitting durability is evaluated using a relative time when the driving time at which the luminescence of the element of Comparative Example 1 (initial luminance $L_0$: 1000 cd/m²) becomes 0.5 of luminance L/initial luminance $L_0$ is set to 1.0 when the initial luminance at room temperature (25° C.) in the direct driving manner (DC driving) is set to 1000 cd/m², and a voltage increase fraction (=voltage/initial driving voltage) when the luminescence of the element becomes 0.5 of luminance L/initial luminance $L_0$. The results are shown in Table 16.

TABLE 16

|  | Voltage increase (@ L/L$_0$ = 0.5) | Relative time (L/L$_0$ = 0.5) |
|---|---|---|
| Example 1-1 | 1.11 | 1.81 |
| Example 1-2 | 1.19 | 1.45 |
| Example 1-3 | 1.13 | 1.71 |
| Example 1-4 | 1.15 | 1.78 |
| Example 1-5 | 1.20 | 1.55 |
| Example 1-6 | 1.15 | 1.40 |
| Example 1-7 | 1.21 | 1.21 |
| Example 1-8 | 1.22 | 1.24 |
| Example 1-9 | 1.14 | 1.68 |
| Example 1-10 | 1.16 | 1.65 |
| Comparative Example 1-1 | 1.32 | 1.00 |
| Comparative Example 1-2 | 1.25 | 1.08 |
| Comparative Example 1-3 | 1.25 | 1.15 |
| Comparative Example 1-4 | 1.30 | 1.20 |
| Comparative Example 1-5 | 1.24 | 1.20 |

<Synthesis of Charge-Transporting Polyester>

Synthesis Example 2-1

Synthesis of Exemplary Compound (B-10)

4-(2-thienyl)acetanilide (30.0 g), 4-iodo phenyl propionic acid methyl (28.5 g), potassium carbonate (13.6 g), copper sulfate pentahydrate (2.0 g), and 1,2-dichlorobenzene (50 ml) are put into a 500 ml three neck flask, heated and stirred under a stream of nitrogen at 230° C. for 20 hours. After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours. After the reaction, the product is extracted with toluene, and an organic phase is washed with pure water. Next, after the organic phase is dried with anhydrous sodium sulfate, the solvent is distilled away under a reduced pressure, whereby 17.9 g of the following DAA-1' is obtained by recrystallization from hexane.

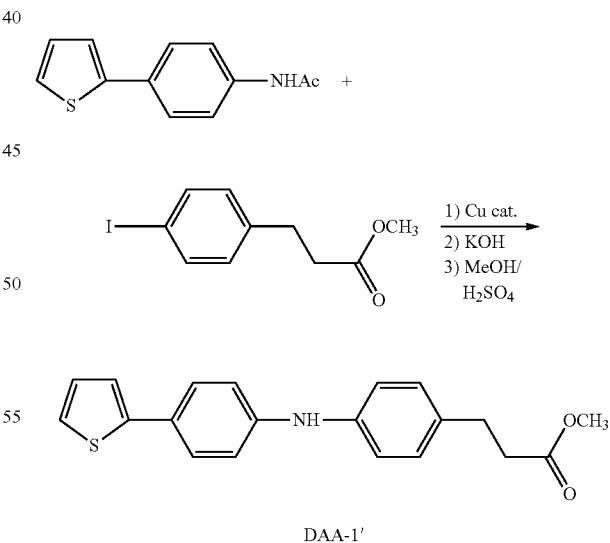

DAA-1'

A mixed solution of iodobenzene (3.6 g), DAA-1' (5.0 g), copper (II) sulfate pentahydrate (0.2 g), potassium carbonate (1.3 g) and tridecane (15 ml) is stirred under a nitrogen environment at 210° C. for 15 hours.

After the completion of the reaction, a solution of potassium hydroxide (15.6 g) dissolved in ethylene glycol (300 ml)

is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours.

After cooling, the resulting substance is filtered with celite by adding toluene, and the product obtained by distilling away toluene is separated by silica gel column chromate (hexane 2:toluene 1), whereby 3.2 g of TAA-1' is obtained.

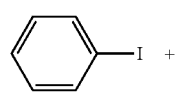

pure water. Next, after the organic phase is dried with anhydrous sodium sulfate, TAA-2' (3.1 g) is obtained by distilling away the solvent under a reduced pressure.

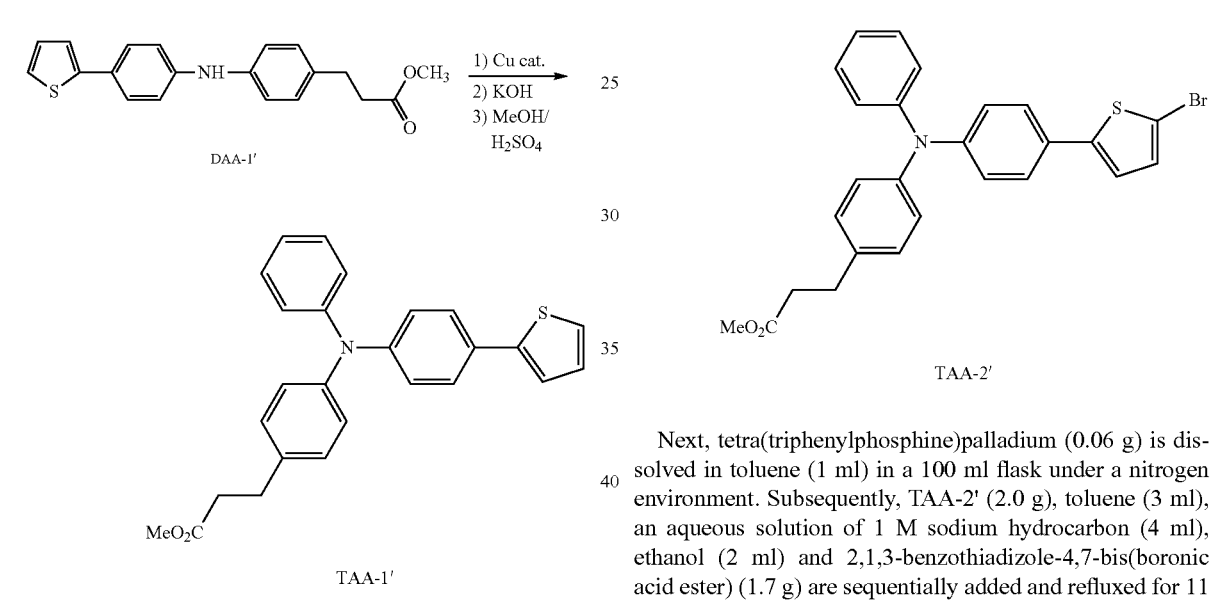

Next, TAA-1' (3.0 g) is dissolved in N,N-dimethylformamide (5 ml) N-bromosuccinimide (1.4 g) is added, and the mixture is stirred for 18 hours. After the reaction, the product is extracted with toluene, and an organic phase is washed with Next, tetra(triphenylphosphine)palladium (0.06 g) is dissolved in toluene (1 ml) in a 100 ml flask under a nitrogen environment. Subsequently, TAA-2' (2.0 g), toluene (3 ml), an aqueous solution of 1 M sodium hydrocarbon (4 ml), ethanol (2 ml) and 2,1,3-benzothiadizole-4,7-bis(boronic acid ester) (1.7 g) are sequentially added and refluxed for 11 hours. After the completion of the reaction, the reaction solution is filtered and washed with pure water, and dried with sodium sulfate. The resulting substance is purified with column chromatography (toluene: ethyl acetate=10:1), whereby 1.5 g of a monomer compound B-11 is obtained.

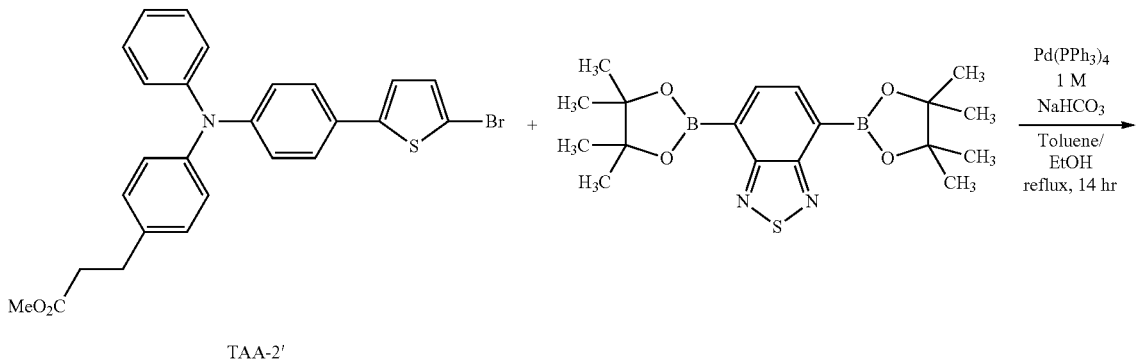

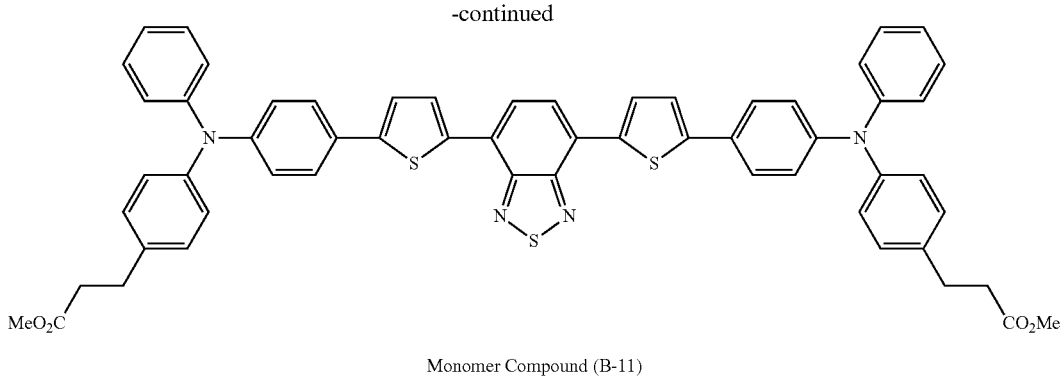

Monomer Compound (B-11)

1.0 g of the obtained monomer compound (B-11) is put into a 50 ml three neck recovery flask together with 10 ml of ethylene glycol and 0.02 g of titanium tetrabutoxide, heated and stirred under a nitrogen environment at 200° C. for 5 hours.

After confirming by TLC that the monomer compound (B-11), which is a raw material, reacts and disappears, the resulting substance is heated to 210° C. at a pressure reduced to 50 Pa while ethylene glycol is distilled away, and the reaction continues for 6 hours.

After that, the resulting substance is cooled to room temperature (25° C.), and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.6 g of a polymer [the Exemplary Compound (B-10)] is obtained.

As a result of measuring the molecular weight of the polymer using gel permeation chromatography (GPC) (manufactured by Tosoh Corporation, HLC-8120GPC), the weight-average molecular weight $Mw=5.5\times10^4$ (styrene conversion), $Mw/Mn=2.15$, and the degree of polymerization p obtained from the molecular weight of the low-molecular compound (the monomer compound), which is a raw material, is 58.

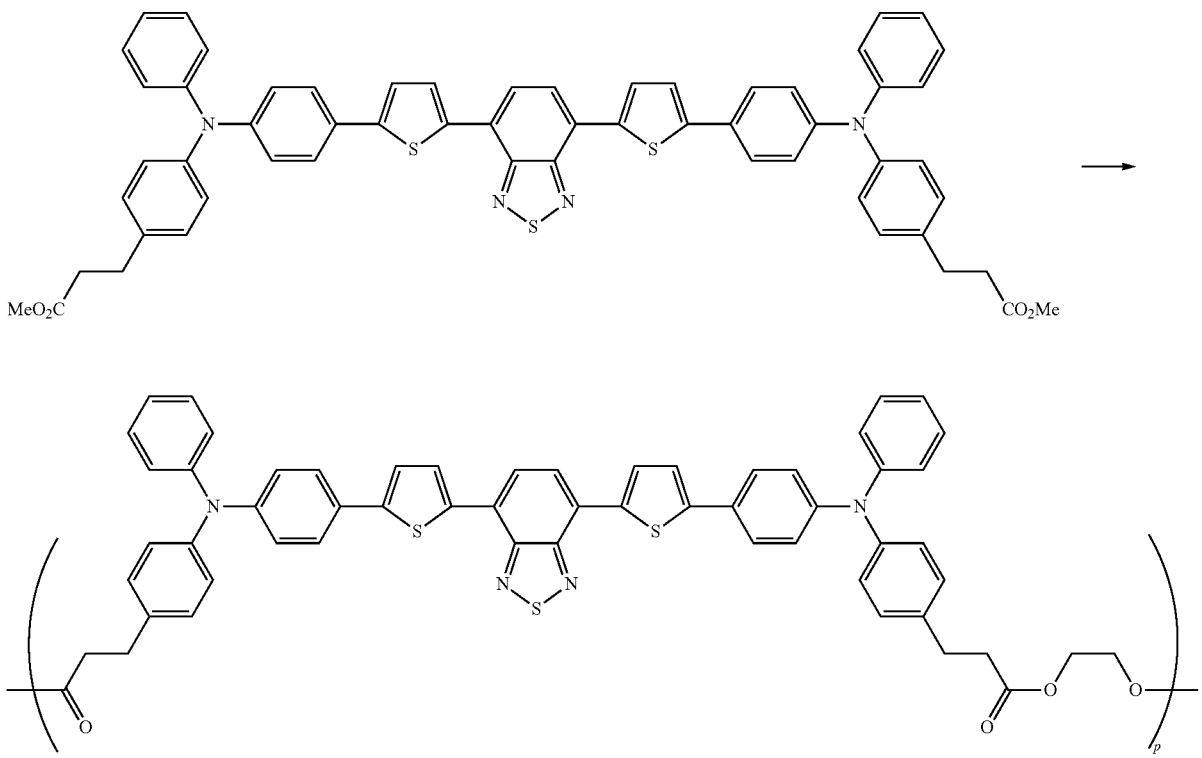

Synthesis Example 2-2

Synthesis of Exemplary Compound (B-14)

A mixed solution of 4-iodotoluene (4.0 g), DAA-1' (5.0 g), copper (II) sulfate pentahydrate (0.2 g), potassium carbonate (1.3 g) and tridecane (15 ml) is stirred under a nitrogen environment at 210° C. for 15 hours.

After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours.

After cooling, the resulting substance is filtered with celite by adding toluene, and the product obtained by distilling away toluene is separated by silica gel column chromate (hexane 2:toluene 1), whereby 3.3 g of TAA-3' is obtained.

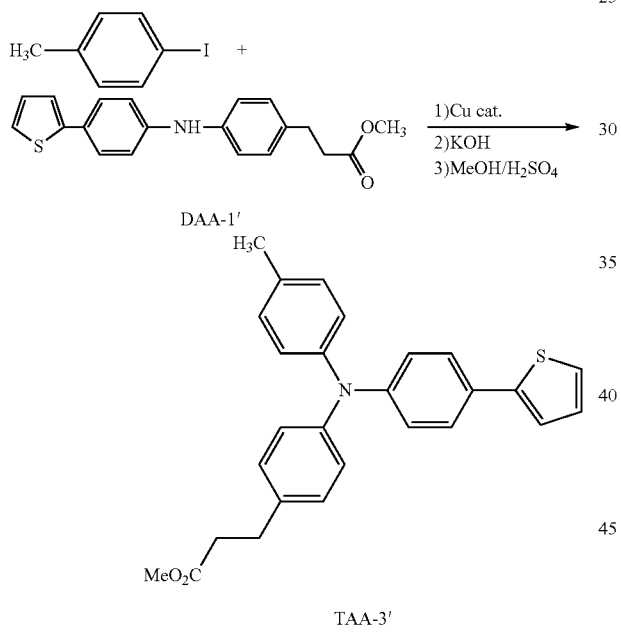

Next, TAA-3' (3.0 g) is dissolved in N,N-dimethylformamide (5 ml), N-bromosuccinimide (1.5 g) is added, and the mixture is stirred for 14 hours. After the reaction, the product is extracted with toluene, and an organic phase is washed with pure water. Next, after the organic phase is dried with anhydrous sodium sulfate, TAA-4' (3.0 g) is obtained by distilling away the solvent under a reduced pressure.

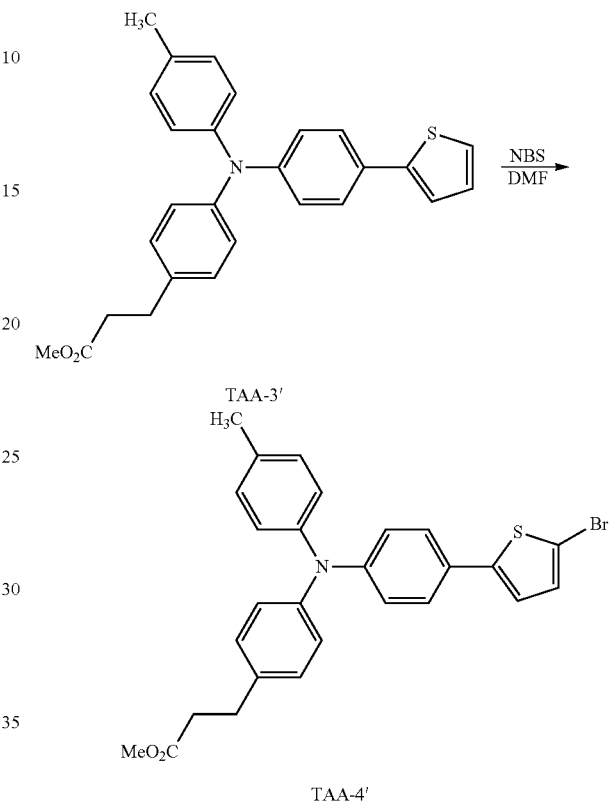

Next, tetra(triphenylphosphine)palladium (0.06 g) is dissolved in toluene (1 ml) in a 100 ml flask under a nitrogen environment. Subsequently, TAA-4' (2.0 g), toluene (3 ml), an aqueous solution of 1 M sodium hydrocarbon (4 ml), ethanol (2 ml) and 2,1,3-benzothiadizole-4,7-bis(boronic acid ester) (1.8 g) are sequentially added and refluxed for 20 hours. After the completion of the reaction, the reaction solution is filtered and washed with pure water, and dried with sodium sulfate. The resulting substance is purified with column chromatography (toluene: ethyl acetate=10:1), whereby 1.4 g of a monomer compound (B-12) is obtained.

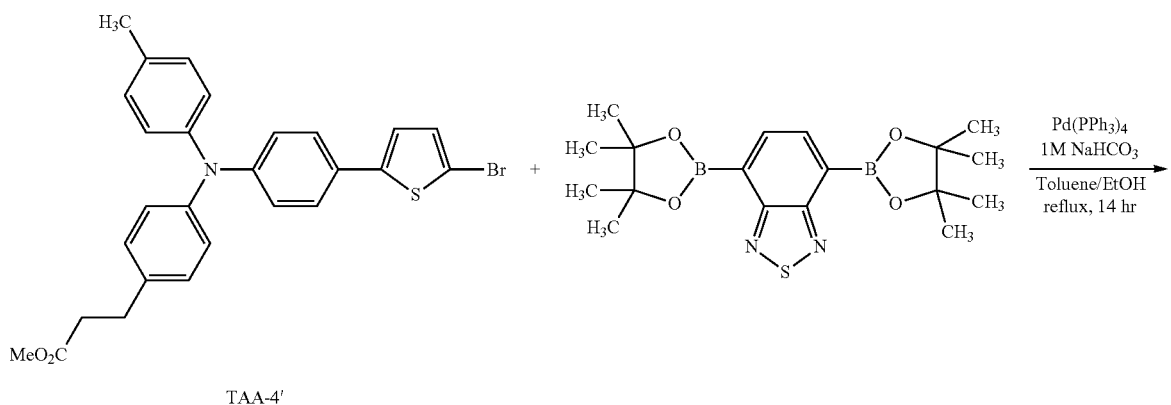

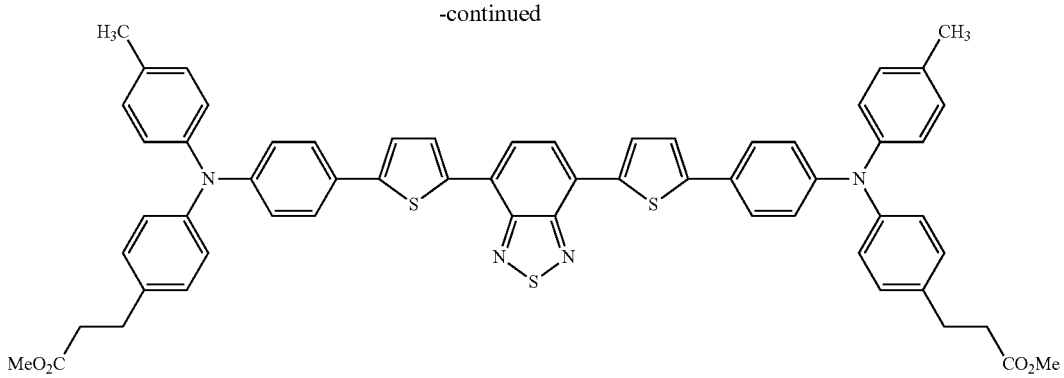

Monomer Compound (B-12)

1.0 g of the obtained monomer compound (B-12) is put into a 50 ml three neck recovery flask together with 10 ml of ethylene glycol and 0.02 g of titanium tetrabutoxide, heated and stirred under a nitrogen environment at 200° C. for 5 hours.

After confirming by TLC that the monomer compound (B-12), which is a raw material, reacts and disappears, the resulting substance is heated to 210° C. at a pressure reduced to 50 Pa while ethylene glycol is distilled away, and the reaction continues for 8 hours.

After that, the resulting substance is cooled to room temperature (25° C.), and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 10 hours at 60° C., whereby 0.7 g of a polymer [the Exemplary Compound (B-14)] is obtained.

As a result of measuring the molecular weight of the polymer using gel permeation chromatography (GPC) (manufactured by Tosoh Corporation, HLC-8120GPC), the weight-average molecular weight $Mw=7.1 \times 10^4$ (styrene conversion), $Mw/Mn=2.25$, and the degree of polymerization p obtained from the molecular weight of the low-molecular compound (the monomer compound), which is a raw material, is 72.

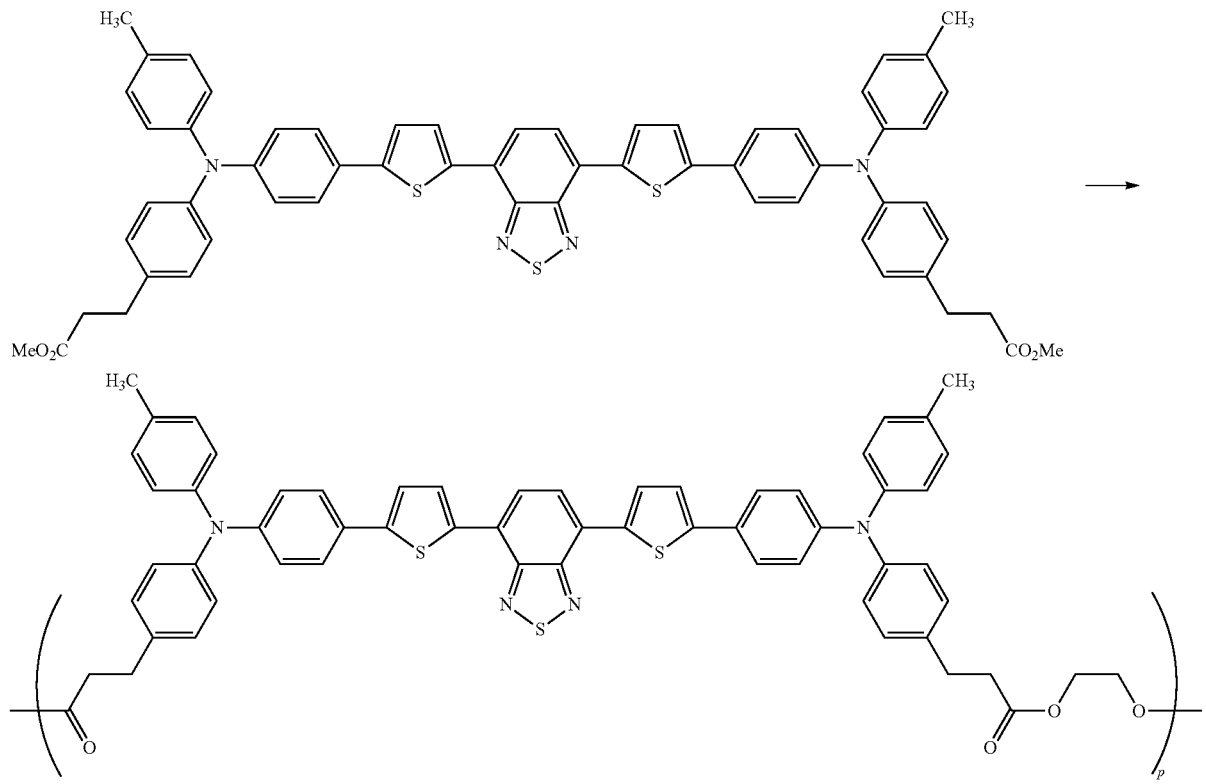

Synthesis Example 2-3

Synthesis of Exemplary Compound (B-15)

A mixed solution of 3-iodotoluene (4.0 g), DAA-1' (5.0 g), copper (II) sulfate pentahydrate (0.2 g), potassium carbonate (1.3 g) and tridecane (15 ml) is stirred under a nitrogen environment at 210° C. for 18 hours.

After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours.

After cooling, the resulting substance is filtered with celite by adding toluene, and the product obtained by distilling away toluene is separated by silica gel column chromate (hexane 2:toluene 1), whereby 3.1 g of TAA-5' is obtained.

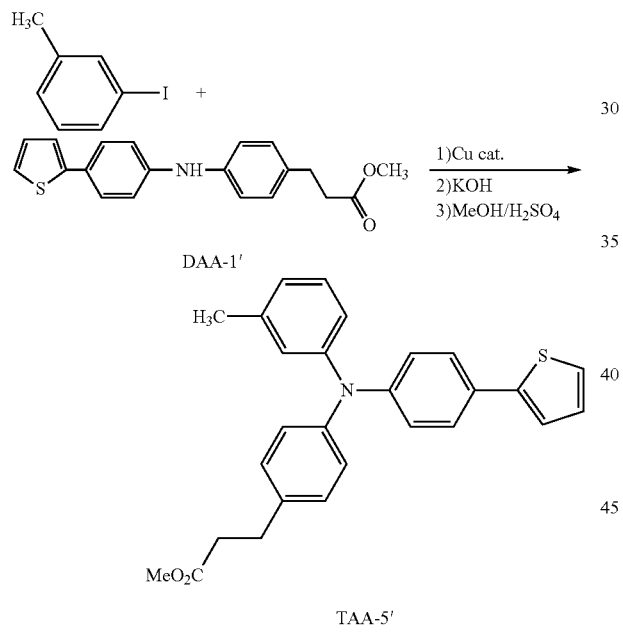

Next, TAA-5' (3.0 g) is dissolved in N,N-dimethylformamide (15 ml), N-bromosuccinimide (1.5 g) is added, and the mixture is stirred for 18 hours. After the reaction, the product is extracted with toluene, and an organic phase is washed with pure water. Next, after the organic phase is dried with anhydrous sodium sulfate, TAA-6' (3.0 g) is obtained by distilling away the solvent under a reduced pressure.

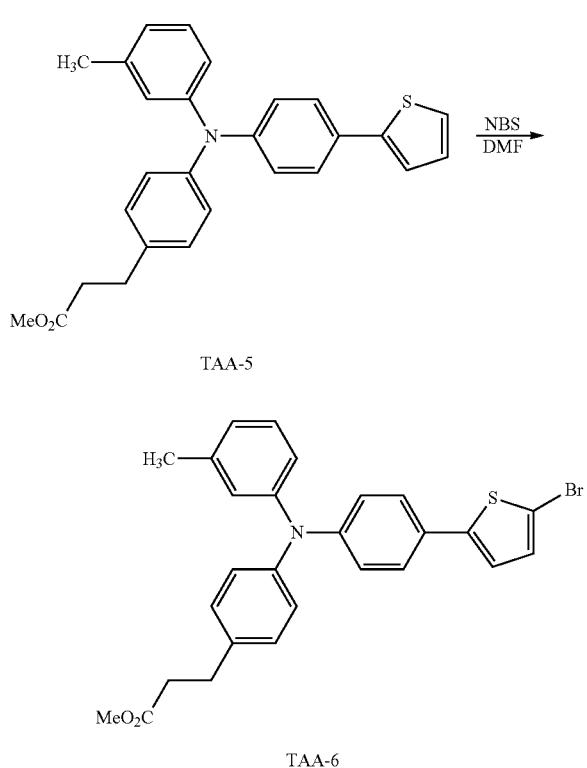

Next, tetra(triphenylphosphine)palladium (0.06 g) is dissolved in toluene (1 ml) in a 100 ml flask under a nitrogen environment. Subsequently, TAA-6' (2.0 g), toluene (3 ml), an aqueous solution of 1 M sodium hydrocarbon (4 ml), ethanol (2 ml) and 2,1,3-benzothiadizole-4,7-bis(boronic acid ester) (1.8 g) are sequentially added and refluxed for 15 hours. After the completion of the reaction, the reaction solution is filtered and washed with pure water, and dried with sodium sulfate. The resulting substance is purified with column chromatography (toluene: ethyl acetate=10:1), whereby 1.2 g of a monomer compound (B-13) is obtained.

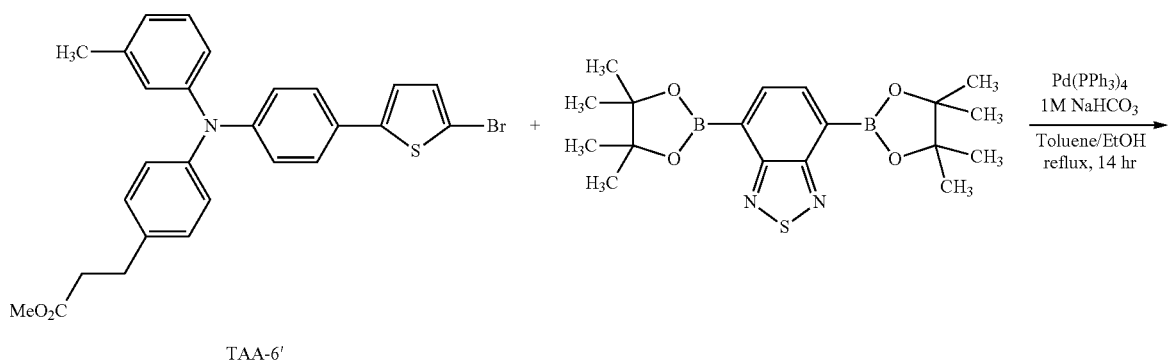

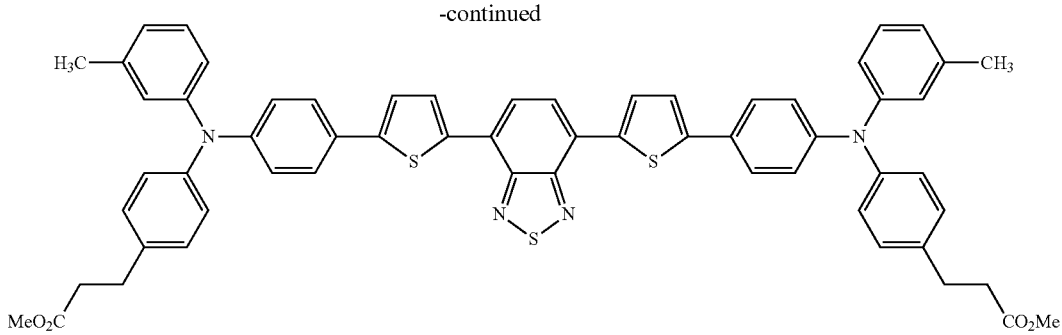

Monomer Compound (B-13)

1.0 g of the obtained monomer compound (B-13) is put into a 50 ml three neck recovery flask together with 10 ml of ethylene glycol and 0.02 g of titanium tetrabutoxide, heated and stirred under a nitrogen environment at 200° C. for 5 hours.

After confirming by TLC that the monomer compound (B-13), which is a raw material, reacts and disappears, the resulting substance is heated to 210° C. at a pressure reduced to 50 Pa while ethylene glycol is distilled away, and the reaction continues for 8 hours.

After that, the resulting substance is cooled to room temperature (25° C.), and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 10 hours at 60° C., whereby 0.5 g of a polymer [the Exemplary Compound (B-15)] is obtained.

As a result of measuring the molecular weight of the polymer using gel permeation chromatography (GPC) (manufactured by Tosoh Corporation, HLC-8120GPC), the weight-average molecular weight Mw=4.5×10$^4$ (styrene conversion), Mw/Mn=2.08, and the degree of polymerization p obtained from the molecular weight of the low-molecular compound (the monomer compound), which is a raw material, is 46.

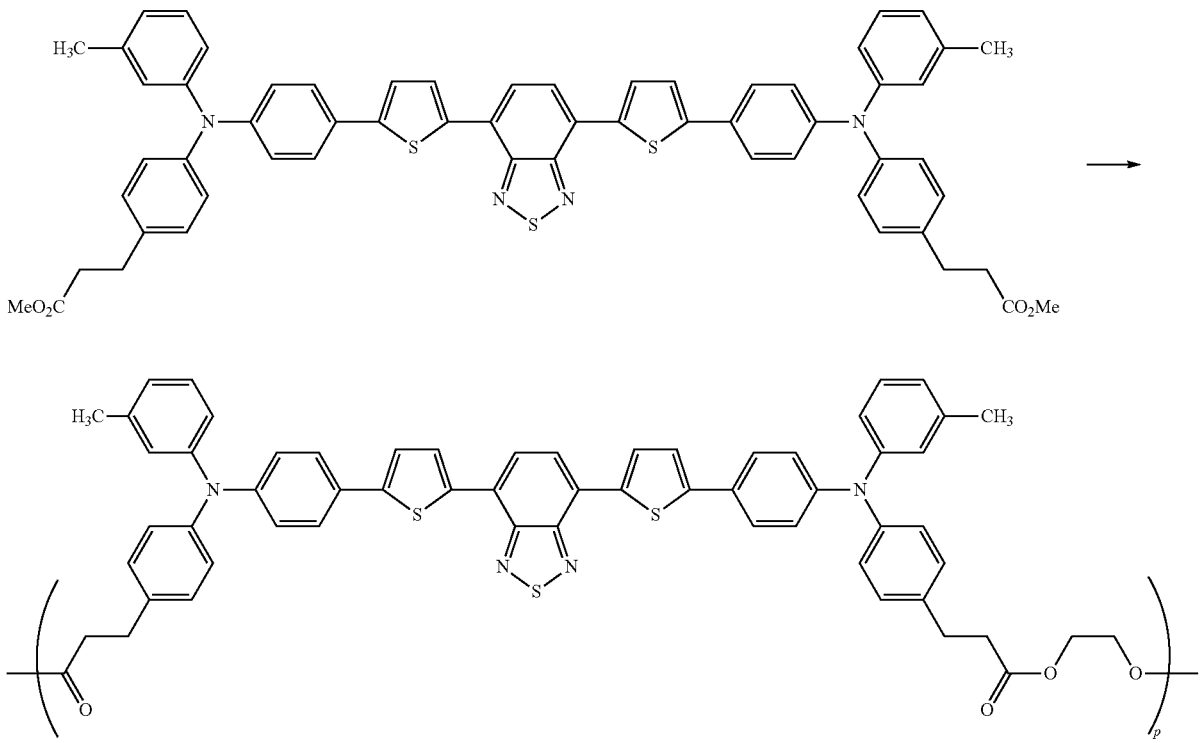

Synthesis Example 2-4

Synthesis of Exemplary Compound (B-22)

A mixed solution of 1-iodonaphthalene (4.0 g), DAA-1' (5.0 g), copper (II) sulfate pentahydrate (0.2 g), potassium carbonate (1.3 g) and tridecane (15 ml) is stirred under a nitrogen environment at 210° C. for 20 hours.

After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours.

After cooling, the resulting substance is filtered with celite by adding toluene, and the product obtained by distilling away toluene is separated by silica gel column chromate (hexane 2:toluene 1), whereby 3.4 g of TAA-7' is obtained.

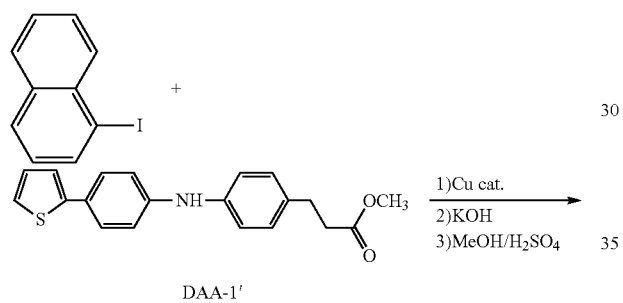

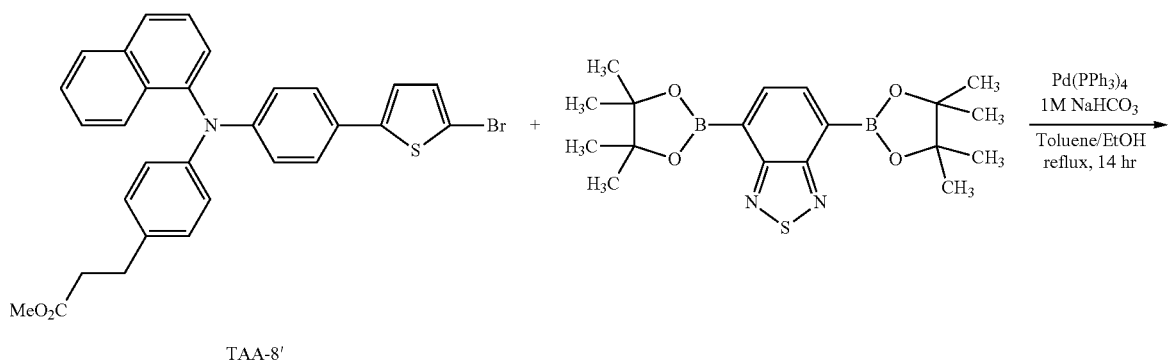

Next, TAA-7' (3.0 g) is dissolved in N,N-dimethylformamide (5 ml), N-bromosuccinimide (1.3 g) is added, and the mixture is stirred for 18 hours. After the reaction, the product is extracted with toluene, and an organic phase is washed with pure water. Next, after the organic phase is dried with anhydrous sodium sulfate, TAA-8' (3.1 g) is obtained by distilling away the solvent under a reduced pressure.

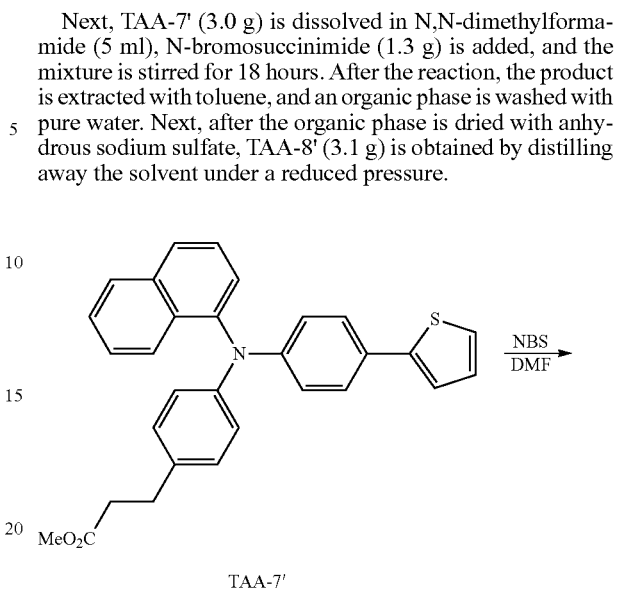

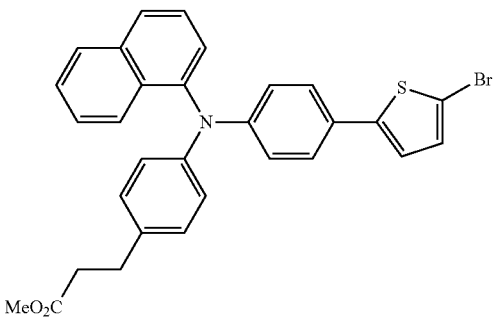

Next, tetra(triphenylphosphine)palladium (0.06 g) is dissolved in toluene (1 ml) in a 100 ml flask under a nitrogen environment. Subsequently, TAA-8' (2.0 g), toluene (3 ml), an aqueous solution of 1 N sodium hydrocarbon (4 ml), ethanol (2 ml) and 2,1,3-benzothiadizole-4,7-bis(boronic acid ester) (1.2 g) are sequentially added and refluxed for 15 hours. After the completion of the reaction, the reaction solution is filtered and washed with pure water, and dried with sodium sulfate. The resulting substance is purified with column chromatography (toluene: ethyl acetate=10:1), whereby 1.1 g of a monomer compound (B-21) is obtained.

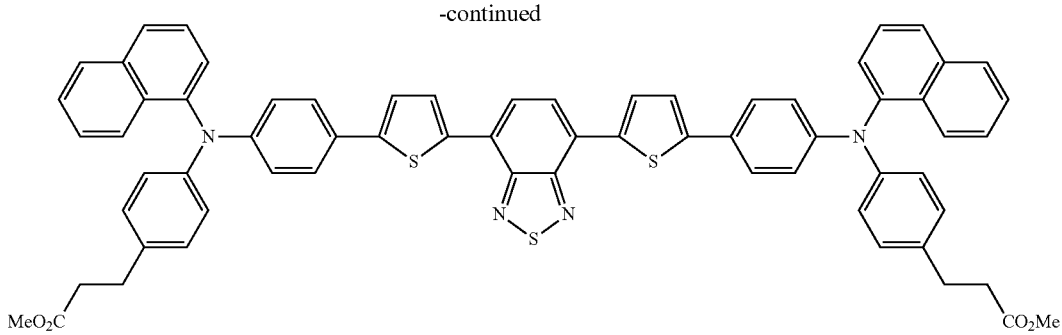

Monomer Compound (B-21)

1.0 g of the obtained monomer compound (B-21) is put into a 50 ml three neck recovery flask together with 10 ml of ethylene glycol and 0.02 g of titanium tetrabutoxide, heated and stirred under a nitrogen environment at 200° C. for 5 hours.

After confirming by TLC that the monomer compound (B-21), which is a raw material, reacts and disappears, the resulting substance is heated to 210° C. at a pressure reduced to 50 Pa while ethylene glycol is distilled away, and the reaction continues for 8 hours.

After that, the resulting substance is cooled to room temperature (25° C.), and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.7 g of a polymer [the Exemplary Compound (B-22)] is obtained.

As a result of measuring the molecular weight of the polymer using gel permeation chromatography (GPC) (manufactured by Tosoh Corporation, HLC-8120GPC), the weight-average molecular weight $Mw=6.7\times10^4$ (styrene conversion), $Mw/Mn=2.3$, and the degree of polymerization p obtained from the molecular weight of the low-molecular compound (the monomer compound), which is a raw material, is 63.

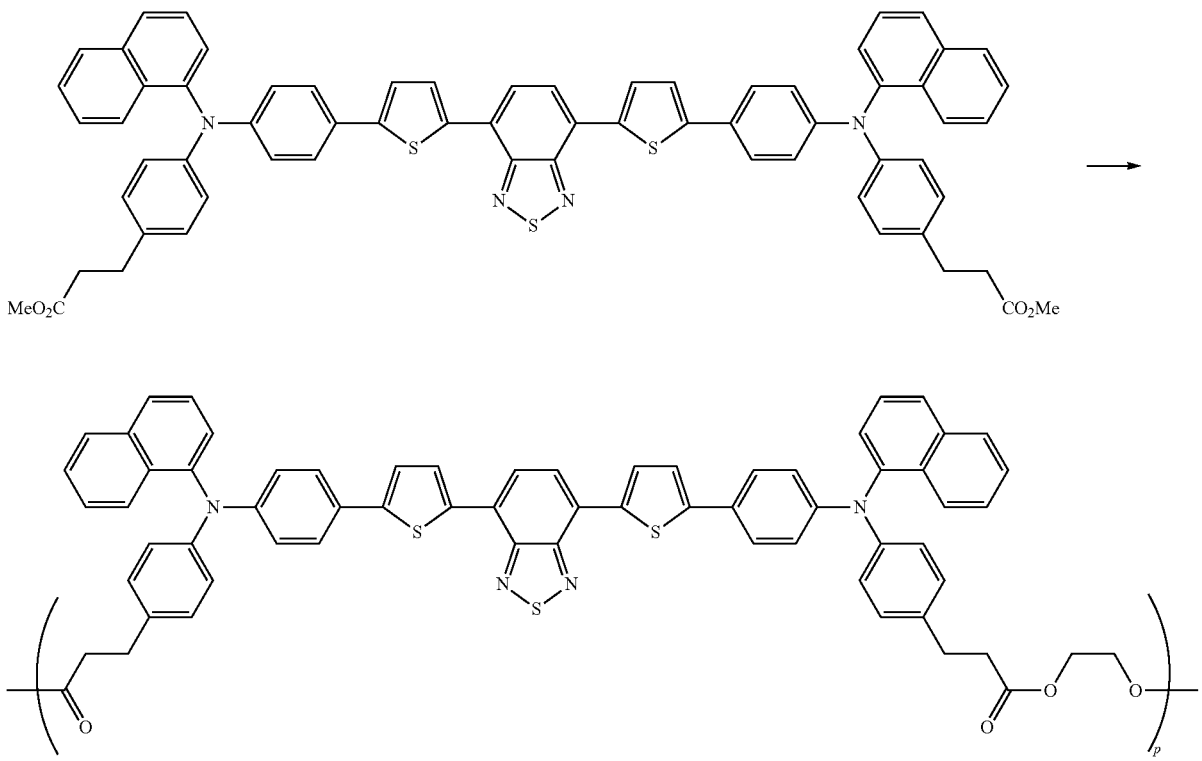

Synthesis Example 2-5

Synthesis of Exemplary Compound (B-19)

A mixed solution of 3-bromobiphenyl (4.1 g), DAA-1' (5.0 g), copper (II) sulfate pentahydrate (0.2 g), potassium carbonate (1.3 g) and tridecane (15 ml) is stirred under a nitrogen environment at 210° C. for 35 hours.

After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours.

After cooling, the resulting substance is filtered with celite by adding toluene, and the product obtained by distilling away toluene is separated by silica gel column chromate (hexane 2:toluene 1), whereby 4.1 g of TAA-9 is obtained.

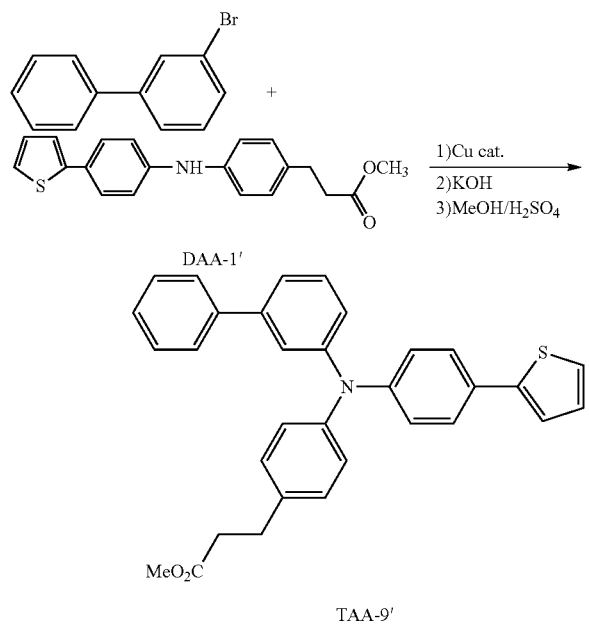

Next, TAA-9' (3.0 g) is dissolved in N,N-dimethylformamide (5 ml), N-bromosuccinimide (1.4 g) is added, and the mixture is stirred for 18 hours. After the reaction, the product is extracted with toluene, and an organic phase is washed with pure water. Next, after the organic phase is dried with anhydrous sodium sulfate, TAA-10' (3.1 g) is obtained by distilling away the solvent under a reduced pressure.

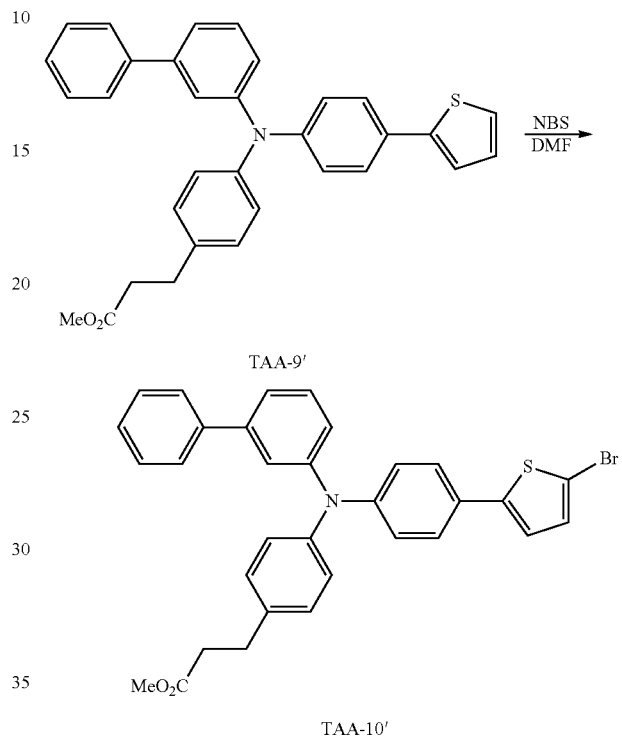

Next, tetra(triphenylphosphine)palladium (0.06 g) is dissolved in toluene (1 ml) in a 100 ml flask under a nitrogen environment. Subsequently, TAA-10' (1.5 g), toluene (3 ml), an aqueous solution of 1 M sodium hydrocarbon (4 ml), ethanol (2 ml) and 2,1,3-benzothiadizole-4,7-bis(boronic acid ester) (1.7 g) are sequentially added and refluxed for 18 hours. After the completion of the reaction, the reaction solution is filtered and washed with pure water, and dried with sodium sulfate. The resulting substance is purified with column chromatography (toluene:ethyl acetate=10:1), whereby 1.6 g of a monomer compound (B-19) is obtained.

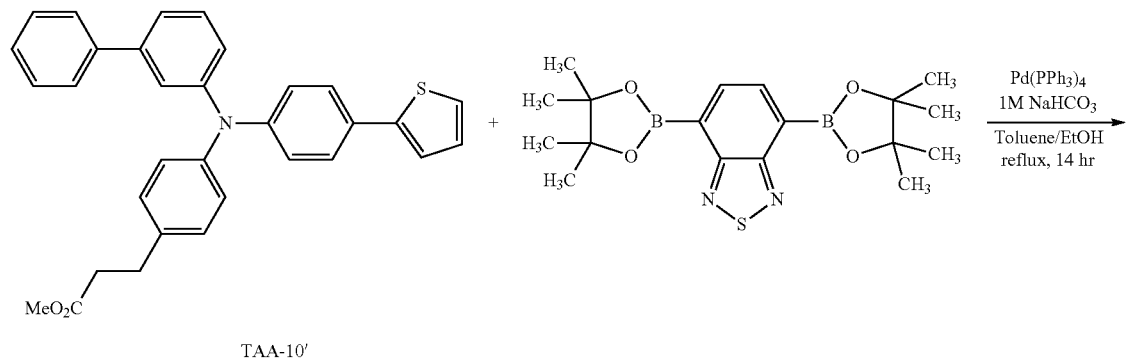

-continued

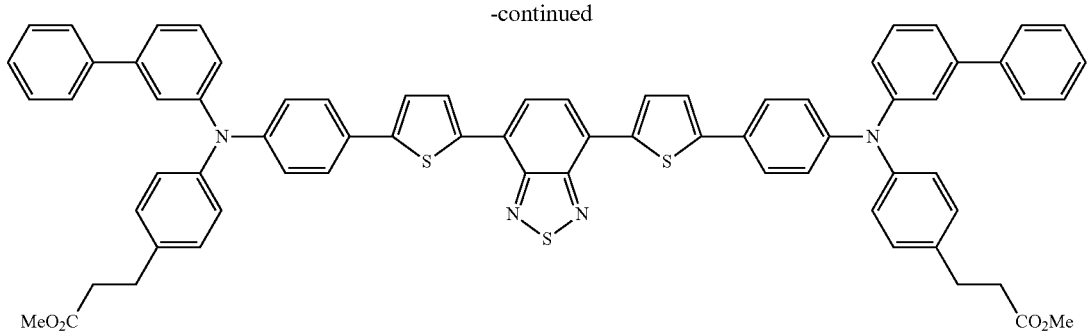

Monomer Compound (B-19)

1.0 g of the obtained monomer compound (B-19) is put into a 50 ml three neck recovery flask together with 10 ml of ethylene glycol and 0.02 g of titanium tetrabutoxide, heated and stirred under a nitrogen environment at 200° C. for 5 hours.

After confirming by TLC that the monomer compound (B-19), which is a raw material, reacts and disappears, the resulting substance is heated to 210° C. at a pressure reduced to 50 Pa while ethylene glycol is distilled away, and the reaction continues for 6 hours.

After that, the resulting substance is cooled to room temperature (25° C.), and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.4 g of a polymer [the Exemplary Compound (B-19] is obtained.

As a result of measuring the molecular weight of the polymer using gel permeation chromatography (GPC) (manufactured by Tosoh Corporation, HLC-8120GPC), the weight-average molecular weight Mw=5.3×10$^4$ (styrene conversion), Mw/Mn=2.18, and the degree of polymerization p obtained from the molecular weight of the low-molecular compound (the monomer compound), which is a raw material, is 48.

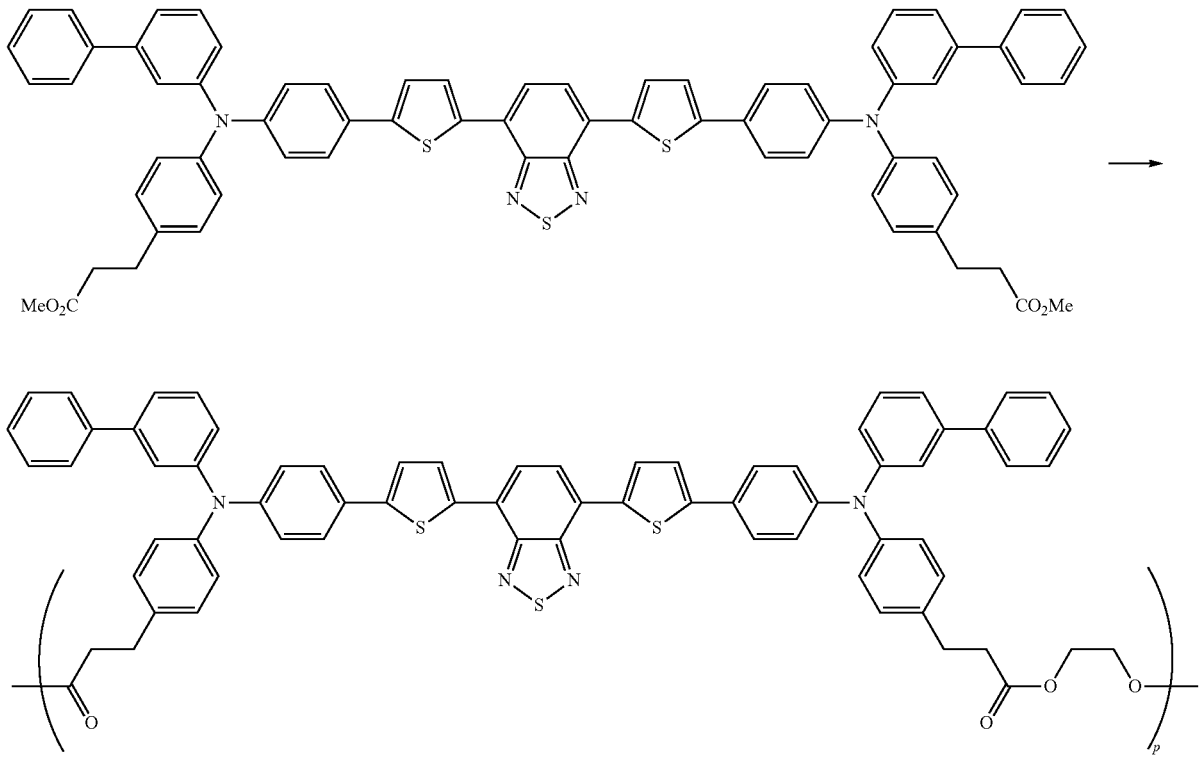

Synthesis Example 2-6

Synthesis of Exemplary Compound (B-25)

A mixed solution of 2-iodo-9,9-dimethylfluorene (5.6 g) DAA-1' (5.0 g), copper (II) sulfate pentahydrate (0.2 g), potassium carbonate (1.3 g) and tridecane (15 ml) is stirred under a nitrogen environment at 210° C. for 35 hours.

After the completion of the reaction, a solution of potassium hydroxide (15.6 g) dissolved in ethylene glycol (300 ml) is added, the resulting substance is heated and refluxed under a stream of nitrogen for 3.5 hours, and then cooled to room temperature (25° C.). The reaction solution is poured into one liter of distilled water and neutralized by hydrochloric acid so that crystals are precipitated. The crystals are taken by suction filtration, washed with water, and then moved to a 1 L flask. Toluene (500 ml) is added to the crystals, the resulting substance is heated and refluxed, water is removed by azeotropic removal, a methanol (300 ml) solution of concentrated sulfuric acid (1.5 ml) is added, and the resulting substance is heated and refluxed under a stream of nitrogen for 5 hours.

After cooling, the resulting substance is filtered with celite by adding toluene, and the product obtained by distilling away toluene is separated by silica gel column chromate (hexane 2:toluene 1), whereby 3.0 g of TAA-11' is obtained.

Next, TAA-11' (3.0 g) is dissolved in N,N-dimethylformamide (5 ml), N-bromosuccinimide (1.7 g) is added, and the mixture is stirred for 25 hours. After the reaction, the product is extracted with toluene, and an organic phase is washed with pure water. Next, after the organic phase is dried with anhydrous sodium sulfate, TAA-12' (3.0 g) is obtained by distilling away the solvent under a reduced pressure.

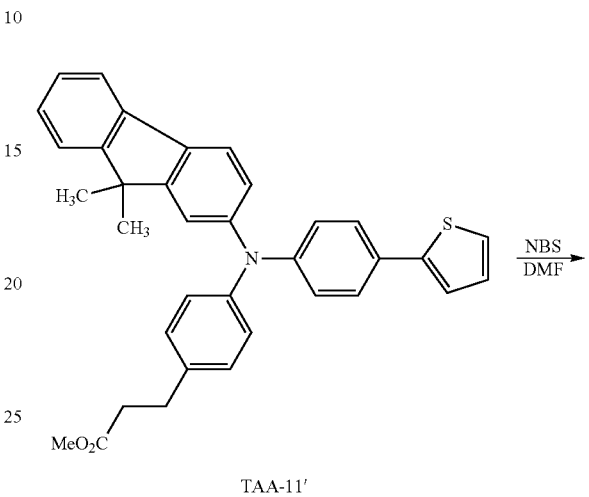

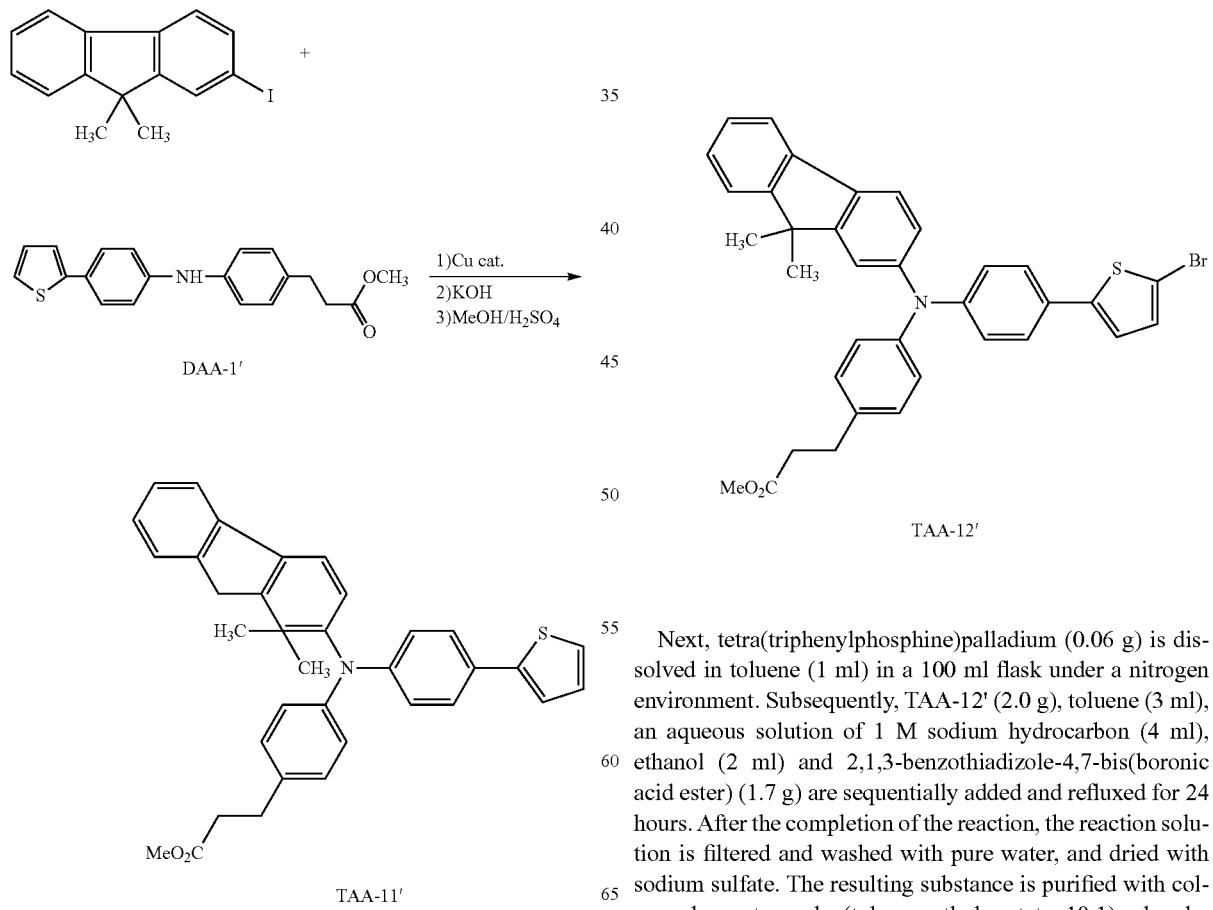

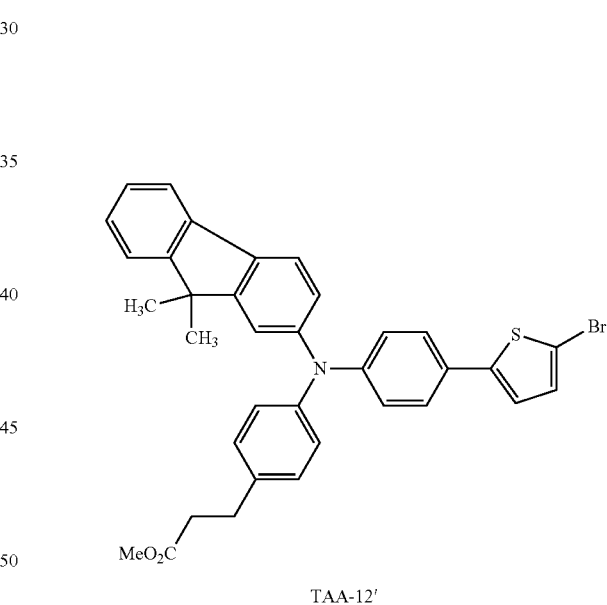

Next, tetra(triphenylphosphine)palladium (0.06 g) is dissolved in toluene (1 ml) in a 100 ml flask under a nitrogen environment. Subsequently, TAA-12' (2.0 g), toluene (3 ml), an aqueous solution of 1 M sodium hydrocarbon (4 ml), ethanol (2 ml) and 2,1,3-benzothiadizole-4,7-bis(boronic acid ester) (1.7 g) are sequentially added and refluxed for 24 hours. After the completion of the reaction, the reaction solution is filtered and washed with pure water, and dried with sodium sulfate. The resulting substance is purified with column chromatography (toluene: ethyl acetate=10:1), whereby 1.9 g of a monomer compound (B-22) is obtained.

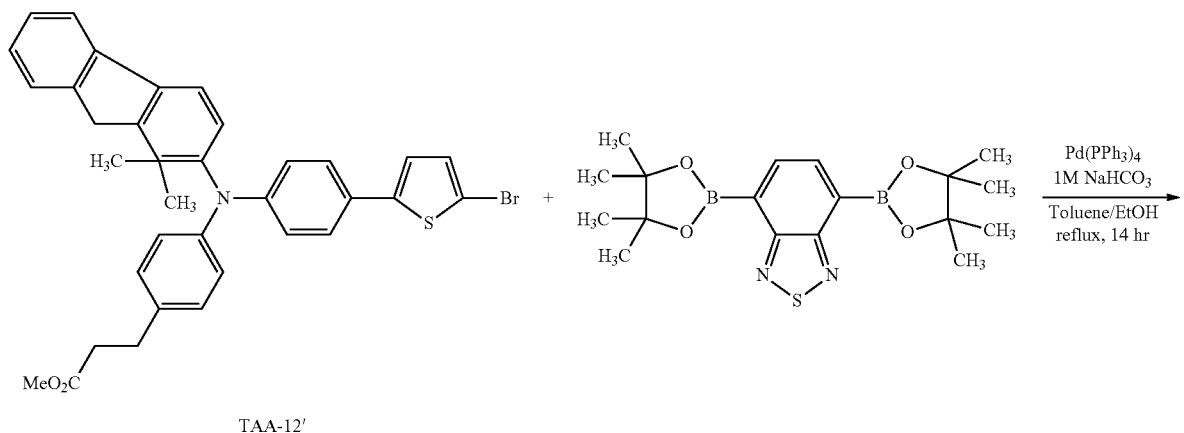

TAA-12'

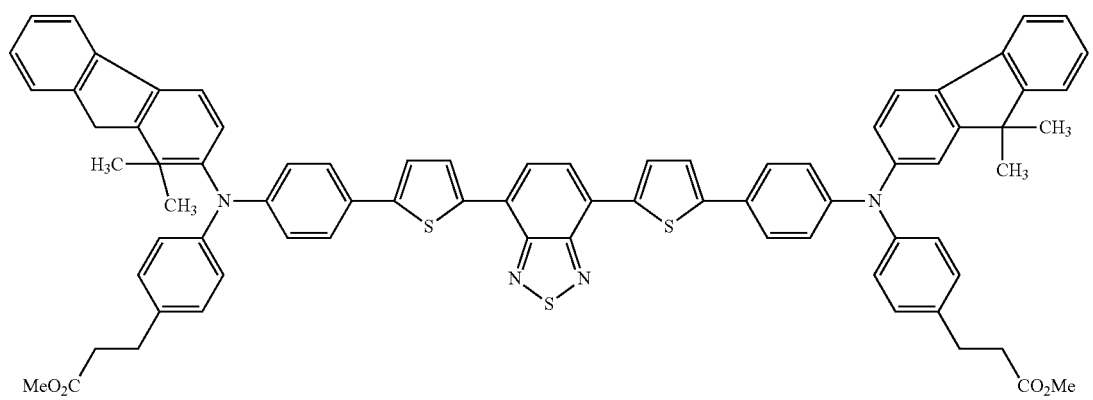

Monomer Compound (B-22)

1.0 g of the obtained monomer compound (B-22) is put into a 50 ml three neck recovery flask together with 10 ml of ethylene glycol and 0.02 g of titanium tetrabutoxide, heated and stirred under a nitrogen environment at 200° C. for 5 hours.

After confirming by TLC that the monomer compound (B-22), which is a raw material, reacts and disappears, the resulting substance is heated to 210° C. at a pressure reduced to 50 Pa while ethylene glycol is distilled away, and the reaction continues for 6 hours.

After that, the resulting substance is cooled to room temperature (25° C.), and dissolved in 50 ml of tetrahydrofuran. The insoluble substance is filtered with a 0.5 μl polytetrafluoroethylene (PTFE) filter, the filtrate is distilled away under a reduced pressure, the resulting substance is dissolved in 300 ml of monochlorobenzene, and washed with in the order of 300 ml of 1 N—HCl and 500 ml of water three times. Up to 30 ml of the monochlorobenzene solution is distilled away under a reduced pressure, the droplets are dropped in 800 ml of ethyl acetate/methanol=1/3, whereby the polymer is reprecipitated.

After the obtained polymer is filtered and washed with methanol, the polymer is vacuum-dried for 16 hours at 60° C., whereby 0.7 g of a polymer [the Exemplary Compound (B-25)] is obtained.

As a result of measuring the molecular weight of the polymer using gel permeation chromatography (GPC) (manufactured by Tosoh Corporation, HLC-8120GPC), the weight-average molecular weight $Mw=7.0\times10^4$ (styrene conversion), $Mw/Mn=2.31$, and the degree of polymerization p obtained from the molecular weight of the low-molecular compound (the monomer compound), which is a raw material, is 59.

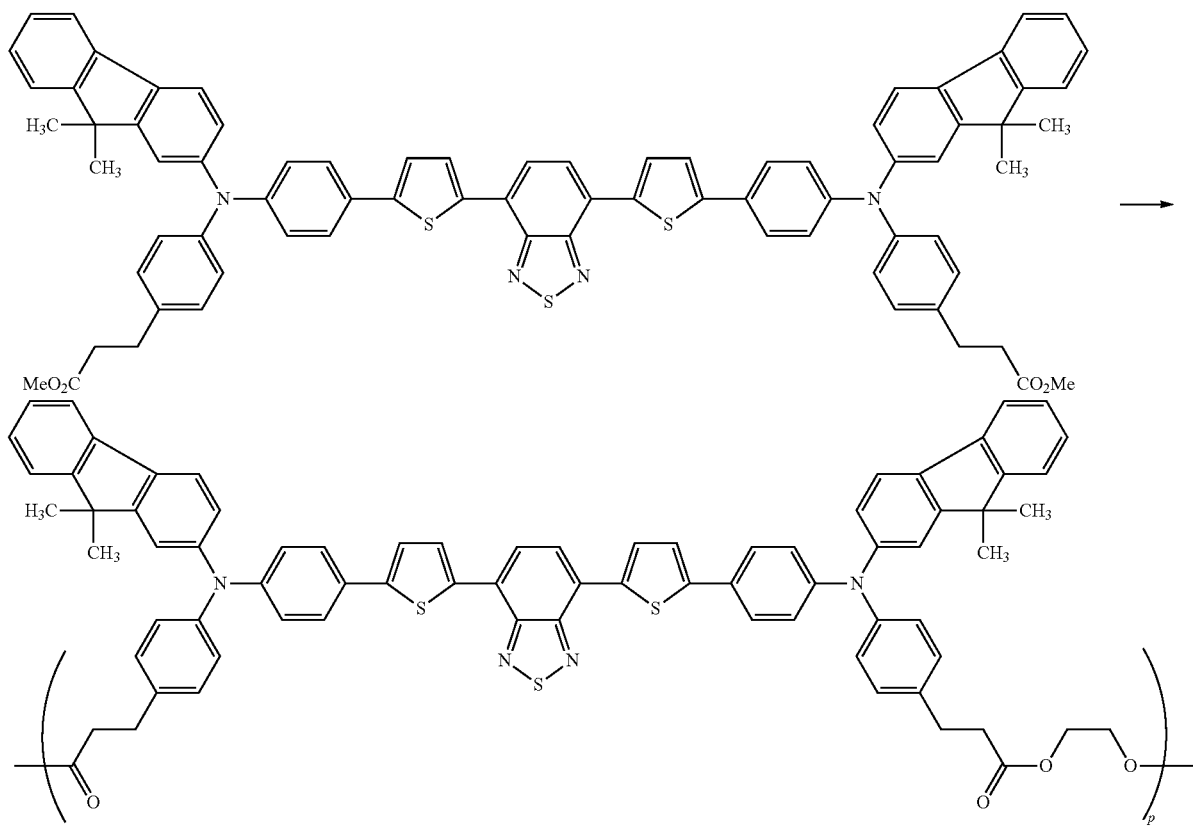

Example 2-1

ITO (manufactured by Sanyo Vacuum Industries Co., Ltd.) formed on a transparent insulating substrate is patterned by photolithography using a strip photo mask, and, furthermore, subjected to an etching treatment, thereby forming a strip ITO electrode (width 2 mm). Next, the ITO glass substrate is washed by adding an ultrasonic wave of each of a neutral detergent, ultrapure water, acetone (for electronic engineering, manufactured by Kanto Chemical Co. Inc.) and isopropanol (for electronic engineering, manufactured by Kanto Chemical Co., Inc.) for 5 minutes, and then dried with a spin coater.

A 5% by mass monochlorobenzene solution of the charge-transporting polyester [the Exemplary Compound (B-10)] is prepared as a hole-transporting layer and filtered using a 0.2 μm PTFE filter, and a 0.050 μm-thick thin film is formed on the substrate by the spin coater method. The Exemplary Compound (XV-1) is deposited as a light-emitting material so as to form a 0.055 μm-thick light-emitting layer. Subsequently, a metallic mask provided with strip holes is installed, 0.0001 μm of LiF is deposited, subsequently, 0.150 μm of Al is deposited, thereby forming a 2 mm-wide and 0.15 μm-thick rear surface electrode so as to intersect with the ITO electrode. The effective area of the formed organic electroluminescence element is 0.04 cm$^2$.

Example 2-2

A 10% by mass dichloroethane solution of one part by mass of the charge-transporting polyester [the Exemplary Compound (B-14)], 4 parts by mass of poly(N-vinyl carbazole) and 0.02 parts by mass of the Exemplary Compound (XV-1) is prepared and filtered using a 0.2 μm PTFE filter. A 0.15 μm-thick thin film is formed on a glass substrate on which a strip ITO electrode is etched, washed and dried according to Example 2-1 by the spin coater method using the solution. After the thin film is sufficiently dried, a metallic mask provided with strip holes is installed, 0.0001 μm of LiF is deposited, and, subsequently, 0.150 μm of Al is deposited, thereby forming a 2 mm-wide and 0.15 μm-thick rear surface electrode so as to intersect with the ITO electrode. The effective area of the formed organic electroluminescence element is 0.04 cm$^2$.

Example 2-3

According to Example 2-1, a 0.050 μm-thick hole-transporting layer is formed on the ITO glass substrate which is etched, washed, and dried according to Example 2-1 using the charge-transporting polyester [the Exemplary Compound (B-15)]. Next, a 0.065 μm-thick layer is formed as a light-emitting layer using a mixture (mass ratio: 99/1) of the Exemplary Compound (XV-1) and the Exemplary Compound (XVI-1), and a 0.030 μm-thick layer is formed as an electron-transporting layer using the Exemplary Compound (XV-9). After the thin layers are sufficiently dried, a metallic mask provided with strip holes is installed, 0.0001 μm of LiF is deposited, and, subsequently, 0.150 μm of Al is deposited, thereby forming a 2 mm-wide and 0.15 μm-thick rear surface electrode so as to intersect with the ITO electrode. The effective area of the formed organic electroluminescence element is 0.04 cm$^2$.

Example 2-4

According to Example 2-1, a 0.050 μm-thick layer is formed as a hole-transporting layer by the ink jet method (the piezo ink jet method) on an ITO glass substrate which is etched and washed according to Example 2-1 using the charge-transporting polyester [the Exemplary Compound (B-19)]. Next, a 0.065 μm-thick layer of the Exemplary Compound (XV-16, n=8, g=185) including 5% by mass of the Exemplary Compound (XVI-5) (that is, a layer including 5% by mass of the Exemplary Compound (XVI-5) and 95% by mass of the Exemplary Compound XV-16) is formed as a light-emitting layer by the spin coater method. After the thin layers are sufficiently dried, 0.08 μm-thick Ca and 0.15 μm-thick Al are deposited, and a 2 mm-wide and totally 0.23 μm-thick rear surface electrode is formed so as to intersect with the ITO electrode. The effective area of the formed organic electroluminescence element is 0.04 cm².

Example 2-5

An organic electroluminescence element is manufactured according to Example 2-2 except that the charge-transporting polyester [the Exemplary Compound (B-19)] is used instead of the charge-transporting polyester [the Exemplary Compound (B-14)] that is used in Example 2-2.

Example 2-6

An organic electroluminescence element is manufactured according to Example 2-2 except that the charge-transporting polyester [the Exemplary Compound (B-22)] is used instead of the charge-transporting polyester [the Exemplary Compound (B-14)] that is used in Example 2-2.

Example 2-7

A 1.5% by mass dichloroethane solution of the charge-transporting polyester [the Exemplary Compound (B-25)] is prepared and filtered using a 0.2 μm PTFE filter. A 0.05 μm-thick thin film is formed on the ITO glass substrate which is etched, washed and dried according to Example 2-1 by the ink jet method using the solution. Next, a 0.050 μm-thick light-emitting layer (a layer including 5% by mass of the Exemplary Compound (XVI-5) and 95% by mass of the Exemplary Compound XV-16) is formed by the spin coat method using the Exemplary Compound (XV-16, n=8, g=185) including 5% by mass of the Exemplary Compound (XVI-5) as a light-emitting material. After the thin layer is sufficiently dried, 0.08 μm-thick Ca and 0.15 μm-thick Al are deposited, and a 2 mm-wide and totally 0.23 μm-thick rear surface electrode is formed so as to intersect with the ITO electrode. The effective area of the formed organic electroluminescence element is 0.04 cm².

Example 2-8

A 0.050 μm-thick layer of the Exemplary Compound (XV-16, n=8, g=185) is formed on the ITO glass substrate which is etched, washed and dried according to Example 2-1 as a light-emitting layer. A 1.5% by mass dichloroethane solution of the charge-transporting polyester [the Exemplary Compound (B-10)] is prepared and filtered using a 0.2 μM PTFE filter. A 0.015 μm-thick electron-transporting layer is formed on the light-emitting layer by the spin coater method using the solution. After the layer is sufficiently dried, 0.0001 μm of LIF is deposited using a metallic mask provided with strip holes, and, subsequently, 0.150 μm of Al is deposited, thereby forming a 2 mm-wide and 0.15 μm-thick rear surface electrode so as to intersect with the ITO electrode. The effective area of the formed organic electroluminescence element is 0.04 cm².

Comparative Example 2-1

An organic EL element is manufactured according to Example 2-2 except that a compound having the structure represented by the following structural formula (XVII') (end group: H) is used instead of the charge-transporting polyester [the Exemplary Compound (B-14)] that is used in Example 2-2.

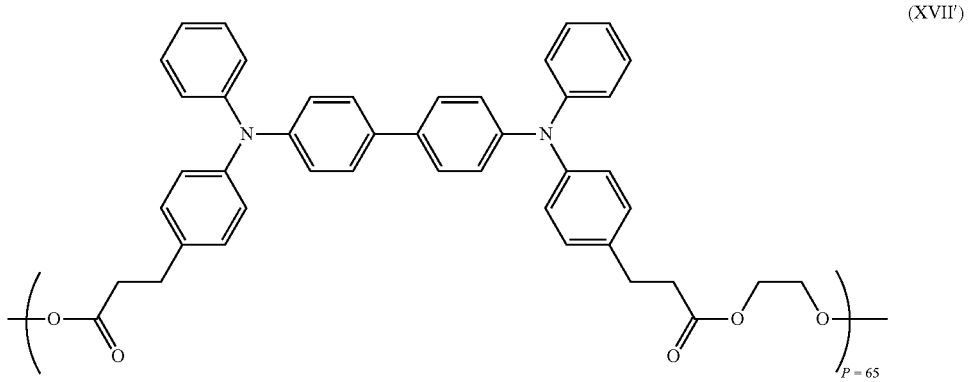

(XVII')

Comparative Example 2-2

A 10% by mass dichloroethane solution is prepared by mixing 2 parts by mass of polyvinyl carbazole (PVK) as a charge-transporting polymer, 0.1 parts by mass of the Exemplary Compound (XV-1) as a light-emitting material, and one part by mass of the compound (XV-9) as an electron-transporting material, and filtered using a 0.2 μm PTFE filter. This solution is coated by the dip method so as to form a 0.15 μm-thick hole-transporting layer on a glass substrate formed by etching a 2 mm-wide strip ITO electrode. After the layer is sufficiently dried, 0.0001 μm of LiF is deposited using a metallic mask provided with strip holes, and, subsequently, 0.150 μm of Al is deposited, thereby forming a 2 mm-wide and 0.15 μm-thick rear surface electrode so as to intersect

Comparative Example 2-3

A 10% by mass dichloroethane solution is prepared by mixing 2 parts by mass of a compound (weight-average molecular weight: $5.1 \times 10^4$, end group: H) having the structure represented by the following structural formula (XVIII') as a charge-transporting polymer, 0.1 parts by mass of the Exemplary Compound (XV-1) as a light-emitting material, and one part by mass of the compound (XV-9) as an electron-transporting material, and filtered using a 0.1 μm PTFE filter. This solution is coated by the dip method so as to form a 0.15 μm-thick hole-transporting layer on a glass substrate on which a 2 mm-wide strip ITO electrode is formed by etching. After the layer is sufficiently dried, 0.0001 μm of LiF is deposited using a metallic mask provided with strip holes, and, subsequently, 0.150 μm of Al is deposited, thereby forming a 2 mm-wide and 0.15 μm-thick rear surface electrode so as to intersect with the ITO electrode. The effective area of the formed organic electroluminescence element is 0.04 cm².

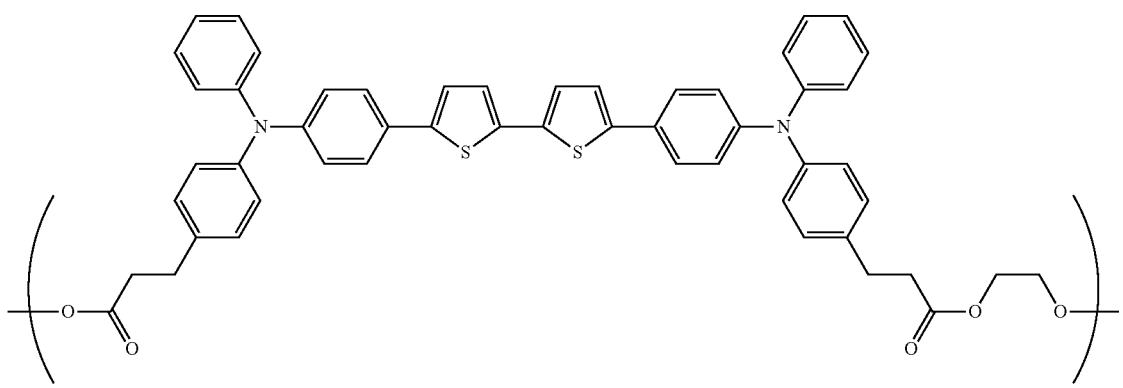

(XVIII')

Comparative Example 2-4

An organic EL element is manufactured according to Example 2-1 except that a compound having the structure represented by the following structural formula (XIX') (weight-average molecular weight: $1.1 \times 10^5$, end group: H) is used instead of the charge-transporting polyester [the Exemplary Compound (5-10)] that is used in Example 2-1.

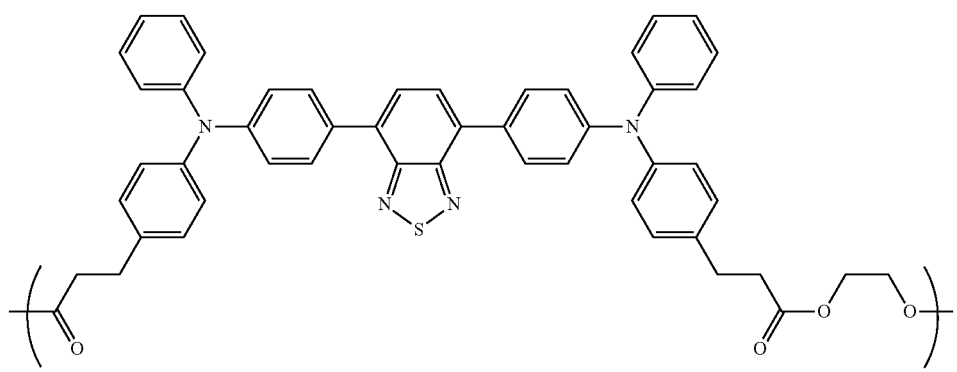

(XIX')

Measurement of the organic EL elements manufactured in the above ways is carried out by applying a direct voltage in dried nitrogen with the ITO electrode side used as plus and the rear surface electrode used as minus.

The light-emitting durability is evaluated using a relative time when the driving time at which the luminescence of the element of Comparative Example 1 (initial luminance $L_0$: 1000 cd/m$^2$) becomes 0.5 of luminance L/initial luminance $L_0$ is set to 1.0 when the initial luminance at room temperature (25° C.) in the direct driving manner (DC driving) is set to 1000 cd/m$^2$, and a voltage increase fraction (=voltage/initial driving voltage) when the luminescence of the element becomes 0.5 of luminance L/initial luminance $L_0$. The results are shown in Table 17.

TABLE 17

| | Voltage increase (@ L/L$_0$ = 0.5) | Relative time (L/L$_0$ = 0.5) |
|---|---|---|
| Example 2-1 | 1.12 | 1.85 |
| Example 2-2 | 1.15 | 1.55 |
| Example 2-3 | 1.18 | 1.63 |
| Example 2-4 | 1.20 | 1.72 |
| Example 2-5 | 1.21 | 1.58 |
| Example 2-6 | 1.18 | 1.51 |
| Example 2-7 | 1.14 | 1.45 |
| Example 2-8 | 1.20 | 1.46 |
| Comparative Example 2-1 | 1.32 | 1.00 |
| Comparative Example 2-2 | 1.25 | 1.15 |
| Comparative Example 2-3 | 1.30 | 1.20 |
| Comparative Example 2-4 | 1.25 | 1.35 |

It is found from the above results that the light-emitting durability of the organic electroluminescence elements in which the charge-transporting polyesters of the examples are used is better than that of the organic electroluminescence elements in which the charge-transporting polyesters of the comparative examples are used.

Meanwhile, while all of the examples show examples in which the end group (that is, $R^1$ in formula (I)) is a hydrogen atom, it is found that the same or better characteristics (light-emitting durability) are obtained as long as the structure is the same except the end group even when the end group is a substituent group other than a hydrogen atom as shown, for example, in the examples of JP2005-158561A.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An organic electroluminescence element comprising:
a pair of electrodes composed of a positive electrode and a negative electrode, one of which is transparent or semi-transparent; and
one or more organic compound layers that are sandwiched between the pair of electrodes, in which at least one layer of the organic compound layers contains one or more of charge-transporting polyesters represented by the following formula (I):

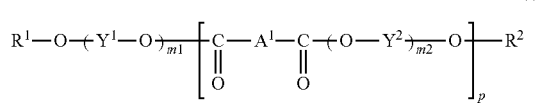

in formula (I), $A^1$ represents a group selected from a structure shown by the following formula (II), $Y^1$ and $Y^2$ each independently represents a substituted or unsubstituted divalent hydrocarbon group, m1 and m2 each independently represents an integer of 1 to 5, and p represents an integer of 5 to 5000; $R^1$ and $R^2$ each independently represents a hydrogen atom, an alkyl group, a substituted or unsubstituted aryl group, or a substituted or unsubstituted aralkyl group,

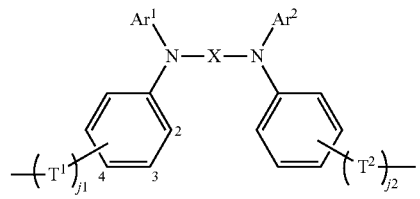

in formula (II), $Ar^1$ and $Ar^2$ each independently represents a substituted or unsubstituted phenyl group, a substituted or unsubstituted monovalent polynuclear aromatic hydrocarbon group having an aromatic ring number of 2, a substituted or unsubstituted monovalent condensed aromatic hydrocarbon group having an aromatic ring number of 2 or 3, or a substituted or unsubstituted monovalent aromatic heterocycle group, j1 and j2 each independently represents 0 or 1, $T^1$ and $T^2$ each independently represents a divalent straight-chain hydrocarbon group having a carbon number of 1 to 6 or a divalent branched-chain hydrocarbon group having a carbon number of 2 to 10, and X represents a group selected from the following formula (III-1) and the following formula (III-2),

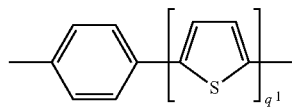

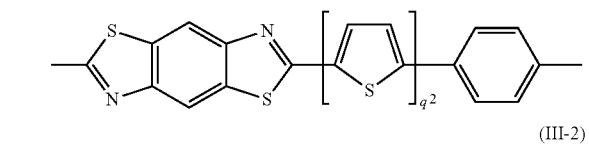

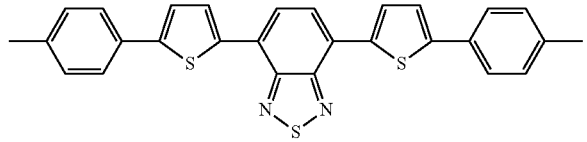

in formula (III-1), q1 and q2 each independently represents 0 or 1.

2. The organic electroluminescence element according to claim 1,
wherein the organic compound layers include a light-emitting layer, and at least one layer of an electron-transporting layer and an electron-injecting layer; and at least one layer selected from the light-emitting layer, the electron-transporting layer, and the electron-injecting layer contains one or more of charge-transporting polyesters represented by formula (I).

3. The organic electroluminescence element according to claim 1,
wherein the organic compound layers include a light-emitting layer, and at least one layer of a hole-transporting layer and a hole-injecting layer; and at least one layer selected from the light-emitting layer, the hole-transporting layer, and the hole-injecting layer contains one or more of charge-transporting polyesters represented by formula (I).

4. The organic electroluminescence element according to claim 1,
wherein the organic compound layers include a light-emitting layer, at least one layer of a hole-transporting layer and a hole-injecting layer, and at least one layer of an electron-transporting layer and an electron-injecting layer; and at least one layer selected from the light-emitting layer, the hole-transporting layer, the hole-injecting layer, the electron-transporting layer, and the electron-injecting layer contains one or more of charge-transporting polyesters represented by formula (I).

5. The organic electroluminescence element according to claim 1,
wherein the organic compound layer is composed of only a light-emitting layer having a charge-transporting function; and the light-emitting layer having a charge-transporting function contains one or more of charge-transporting polyesters represented by formula (I).

6. The organic electroluminescence element according to claim 1,
wherein p in formula (I) is in a range of about 10 to about 1000.

7. The organic electroluminescence element according to claim 1,
wherein the weight-average molecular weight of the charge-transporting polyester is in a range of about 10,000 to about 100,000.

8. The organic electroluminescence element according to claim 1,
wherein the glass transition temperature of the charge-transporting polyester is in a range of about 60° C. to about 300° C.

9. A display medium, comprising the organic electroluminescence elements according to claim 1 arranged in a matrix shape or in a segment shape.

10. A display medium, comprising the organic electroluminescence elements according to claim 2 arranged in a matrix shape or in a segment shape.

11. A display medium, comprising the organic electroluminescence elements according to claim 3 arranged in a matrix shape or in a segment shape.

12. A display medium, comprising the organic electroluminescence elements according to claim 4 arranged in a matrix shape or in a segment shape.

* * * * *